(12) United States Patent
Baraniuk et al.

(10) Patent No.: US 7,271,747 B2
(45) Date of Patent: Sep. 18, 2007

(54) METHOD AND APPARATUS FOR DISTRIBUTED COMPRESSED SENSING

(75) Inventors: Richard G. Baraniuk, Houston, TX (US); Dror Z. Baron, Houston, TX (US); Marco F. Duarte, Houston, TX (US); Shriram Sarvotham, Houston, TX (US); Michael B. Wakin, Houston, TX (US); Mark Davenport, Houston, TX (US)

(73) Assignee: Rice University, Houston, TX (US)

( * ) Notice: Subject to any disclaimer, the term of this patent is extended or adjusted under 35 U.S.C. 154(b) by 0 days.

(21) Appl. No.: 11/382,687

(22) Filed: May 10, 2006

(65) Prior Publication Data

US 2007/0027656 A1 Feb. 1, 2007

Related U.S. Application Data

(60) Provisional application No. 60/679,237, filed on May 10, 2005.

(51) Int. Cl.
*H03M 7/30* (2006.01)

(52) U.S. Cl. .......................................... 341/87; 341/50

(58) Field of Classification Search ................. 341/87, 341/50; 706/20; 375/148; 342/357.12
See application file for complete search history.

(56) References Cited

U.S. PATENT DOCUMENTS

| 4,894,662 | A | * | 1/1990 | Counselman | 342/357.12 |
| 5,465,321 | A | * | 11/1995 | Smyth | 706/20 |
| 6,714,585 | B1 | * | 3/2004 | Wang et al. | 375/148 |

* cited by examiner

*Primary Examiner*—Jean Bruner Jeanglaude
(74) *Attorney, Agent, or Firm*—24IP Law Group USA; Timothy R. DeWitt

(57) ABSTRACT

A method for approximating a plurality of digital signals or images using compressed sensing. In a scheme where a common component $x_c$ of said plurality of digital signals or images an innovative component $x_i$ of each of said plurality of digital signals each are represented as a vector with m entries, the method comprises the steps of making a measurement $y_c$, where $y_c$ comprises a vector with only $n_i$ entries, where $n_i$ is less than m, making a measurement $y_i$ for each of said correlated digital signals, where $y_i$ comprises a vector with only $n_i$ entries, where $n_i$ is less than m, and from each said innovation components $y_i$, producing an approximate reconstruction of each m-vector $x_i$ using said common component $y_c$ and said innovative component $y_i$.

12 Claims, 13 Drawing Sheets

(a)            (b)

METHOD AND APPARATUS FOR DISTRIBUTED COMPRESSED SENSING

CROSS-REFERENCE TO RELATED APPLICATIONS

The present application claims the benefit of the filing date of U.S. Provisional Application Ser. No. 60/679,237 entitled "Method and Apparatus for Reconstructing Data from Multiple Sources" and filed on May 10, 2005.

The above cross-referenced related application is hereby incorporated by reference herein in their entirety.

STATEMENT REGARDING FEDERALLY SPONSORED RESEARCH OR DEVELOPMENT

This work was supported by Contracts NSF CCF,-0431150, NSF CNS-0435425, NSF-CNS-0520280, ONR N00014-02-1-0353, and AFOSR FA9550-04-0148.

BACKGROUND OF THE INVENTION

1. Field of the Invention

The present invention relates to distributed source coding and compressed sensing methods and systems, and more particularly, to a new method and system referred to as distributed compressed sensing.

2. Brief Description of the Related Art

Distributed Source Coding

While the theory and practice of compression have been well developed for individual signals, many applications involve multiple signals, for which there has been less progress. As a motivating example, consider a sensor network, in which a potentially large number of distributed sensor nodes can be programmed to perform a variety of data acquisition tasks as well as to network themselves to communicate their results to a central collection point (see D. Estrin, D. Culler, K. Pister, and G. Sukhatme, "Connecting the physical world with pervasive networks," IEEE Pervasive Computing, vol. 1, no. 1, pp. 59-69, 2002 and G. J. Pottie and W. J. Kaiser, "Wireless integrated network sensors," Comm. ACM, vol. 43, no. 5, pp. 51-58, 2000). In many sensor networks, and in particular battery-powered ones, communication energy and bandwidth are scarce resources; both factors make the reduction of communication critical.

Fortunately, since the sensors presumably observe related phenomena, the ensemble of signals they acquire can be expected to possess some joint structure, or inter-signal correlation, in addition to the intra-signal correlation in each individual sensor's measurements. For example, imagine a microphone network recording a sound field at several points in space. The time-series acquired at a given sensor might have considerable intra-signal (temporal) correlation and might be sparsely represented in a local Fourier basis. In addition, the ensemble of time-series acquired at all sensors might have considerable inter-signal (spatial) correlation, since all microphones listen to the same sources. In such settings, distributed source coding that exploits both intra- and inter-signal correlations might allow the network to save on the communication costs involved in exporting the ensemble of signals to the collection point (see T. M. Cover and J. A. Thomas, "Elements of Information Theory", Wiley, New York, 1991; D. Slepian and J. K. Wolf, "Noiseless coding of correlated information sources," IEEE Trans. Inf. Theory, vol. 19, pp. 471-480, July 1973; S. Pradhan and K. Ramchandran, "Distributed source coding using syndromes (DISCUS): Design and construction," IEEE Trans. Inf. Theory, vol. 49, pp. 626-643, March 2003; Z. Xiong, A. Liveris, and S. Cheng, "Distributed source coding for sensor networks," IEEE Signal Processing Mag., vol. 21, pp. 80-94, September 2004 and J. Wolfowitz, Coding Theorems of Information Theory, Springer-Verlag, Berlin, 1978).

A number of distributed coding algorithms have been developed that involve collaboration amongst the sensors, including several based on predictive coding (see H. Luo and G. Pottie, "Routing explicit side information for data compression in wireless sensor networks," in Int. Conf. on Distirbuted Computing in Sensor Systems (DCOSS), Marina Del Rey, Calif., June 2005; B. Krishnamachari, D. Estrin, and S. Wicker, "Modelling data-centric routing in wireless sensor networks," USC Computer Engineering Technical Report CENG 02-14, 2002 and R. Cristescu, B. Beferull-Lozano, and M. Vetterli, "On network correlated data gathering," in Proc. INFOCOM 2004., Hong Kong, March 2004), a distributed KLT (see M. Gastpar, P. L. Dragotti, and M. Vetterli, "The distributed Karhunen-Loeve transform," IEEE Trans. Info Theory, November 2004, Submitted), and distributed wavelet transforms (see R. Wagner, V. Delouille, H. Choi, and R. G. Baraniuk, "Distributed wavelet transform for irregular sensor network grids," in IEEE Statistical Signal Processing (SSP) Workshop, Bordeaux, France, July 2005 and A. Ciancio and A. Ortega, "A distributed wavelet compression algorithm for wireless multihop sensor networks using lifting," in IEEE 2005 Int. Conf. Acoustics, Speech, Signal Processing (ICASSP), Philadelphia, March 2005). Three-dimensional wavelets have been proposed to exploit both inter- and intra-signal correlations (see D. Ganesan, B. Greenstein, D. Perelyubskiy, D. Estrin, and J. Heidemann, "An evaluation of multi-resolution storage for sensor networks," in Proc. ACM SenSys Conference, Los Angeles, November 2003, pp. 89-102). Note, however, that any collaboration involves some amount of inter-sensor communication overhead.

In the Slepian-Wolf framework for lossless distributed coding (see T. M. Cover and J. A. Thomas, "Elements of Information Theory", Wiley, New York, 1991; D. Slepian and J. K. Wolf, "Noiseless coding of correlated information sources," IEEE Trans. Inf. Theory, vol. 19, pp. 471-480, July 1973; S. Pradhan and K. Ramchandran, "Distributed source coding using syndromes (DISCUS): Design and construction," IEEE Trans. Inf. Theory, vol. 49, pp. 626-643, March 2003; Z. Xiong, A. Liveris, and S. Cheng, "Distributed source coding for sensor networks," IEEE Signal Processing Mag., vol. 21, pp. 80-94, September 2004 and J. Wolfowitz, Coding Theorems of Information Theory, Springer-Verlag, Berlin, 1978), the availability of correlated side information at the collection point/decoder enables each sensor node to communicate losslessly at its conditional entropy rate rather than at its individual entropy rate. Slepian-Wolf coding has the distinct advantage that the sensors need not collaborate while encoding their measurements, which saves valuable communication overhead. Unfortunately, however, most existing coding algorithms (see S. Pradhan and K. Ramchandran, "Distributed source coding using syndromes (DISCUS): Design and construction," IEEE Trans. Inf. Theory, vol. 49, pp. 626-643, March 2003 and Z. Xiong, A. Liveris, and S. Cheng, "Distributed source coding for sensor networks," IEEE Signal Processing Mag., vol. 21, pp. 80-94, September 2004) exploit only inter-signal correlations and not intra-signal correlations. To date there has been only limited progress on distributed coding of so-called "sources with memory." (We briefly mention some limitations here and elaborate in the section on challenges for distributed coding of sources with memory.) The direct implementation for such sources would require huge lookup tables (see T. M. Cover and J. A. Thomas, "Elements of Information Theory", Wiley, New York, 1991 and T. M. Cover, "A proof of the data compression theorem of Slepian and Wolf for ergodic sources," IEEE Trans. Inf. Theory, vol. 21, pp. 226-228, March 1975). Furthermore, approaches combining pre- or post-processing of the data to remove intra-signal correlations combined with Slepian-Wolf coding for the inter-signal correlations appear to have limited applicability. Finally, a recent paper by Uyematsu (see T. Uyematsu, "Universal coding for correlated sources with memory," in Canadian Workshop Inf. Theory, Vancouver, June 2001) provides compression of spatially correlated sources with memory. However, the solution is specific to lossless distributed compression and cannot be readily extended to lossy compression setups. We conclude that the design of constructive techniques for distributed coding of sources with both intra- and inter-signal correlation is still an open and challenging problem with many potential applications.

Challenges for Distributed Coding of Sources with Memory

One approach to distributed compression of data with both inter- and intra-signal correlations ("sources with memory") is to perform Slepian-Wolf coding using source models with temporal memory. Cover (see T. M. Cover, "A proof of the data compression theorem of Slepian and Wolf for ergodic sources," IEEE Trans. Inf. Theory, vol. 21, pp. 226-228, March 1975) showed how random binning can be applied to compress ergodic sources in a distributed manner. Unfortunately, implementing this approach would be challenging, since it requires maintaining lookup tables of size $2^{NR_1}$ and $2^{NR_2}$ at the two encoders. Practical Slepian-Wolf encoders are based on dualities to channel coding (see S. Pradhan and K. Ramchandran, "Distributed source coding using syndromes (DISCUS): Design and construction," IEEE Trans. Inf. Theory, vol. 49, pp. 626-643, March 2003 and Z. Xiong, A. Liveris, and S. Cheng, "Distributed source coding for sensor networks," IEEE Signal Processing Mag., vol. 21, pp. 80-94, September 2004) and An alternative approach would use a transform to remove intra-signal correlations. For example, the Burrows-Wheeler Transform (BWT) permutes the symbols of a block in a manner that removes correlation between temporal symbols and thus can be viewed as the analogue of the Karhunen-Lòeve transform for sequences over finite alphabets. The BWT handles temporal correlation efficiently in single-source lossless coding (see D. Baron and Y. Bresler, "An O(N) semi-predictive universal encoder via the BWT," IEEE Trans. Inf. Theory, vol. 50, no. 5, pp. 928-937, 2004 and M. Effros, K. Visweswariah, S. R. Kulkarni, and S. Verdu, "Universal lossless source coding with the Burrows Wheeler transform," IEEE Trans. Inf. Theory, vol. 48, no. 5, pp. 1061-1081, 2002). For distributed coding, the BWT could be proposed to remove temporal correlations by pre-processing the sequences prior to Slepian-Wolf coding. Unfortunately, the BWT is input-dependent, and hence temporal correlations would be removed only if all sequences were available at the encoders. Using a transform as a post-processor following Slepian-Wolf coding does not seem promising either, since the distributed encoders' outputs will each be independent and identically distributed.

In short, approaches based on separating source coding into two components—distributed coding to handle inter-signal correlations and a transform to handle intra-signal correlations—appear to have limited applicability. In contrast, a recent paper by Uyematsu (see T. Uyematsu, "Universal coding for correlated sources with memory," in Canadian Workshop Inf. Theory, Vancouver, June 2001) proposed a universal Slepian-Wolf scheme for correlated Markov sources. Uyematsu's approach constructs a sequence of universal codes such that the probability of decoding error vanishes when the coding rates lie within the Slepian-Wolf region. Such codes can be constructed algebraically, and the encoding/decoding complexity is $O(N^3)$. While some of the decoding schemes developed below have similar (or lower) complexity, they have broader applicability. First, we deal with continuous sources, whereas Uyematsu's work considers only finite alphabet sources. Second, quantization of the measurements will enable us to extend our schemes to lossy distributed compression, whereas Uyematsu's work is confined to lossless settings. Third, Uyematsu's work only considers Markov sources. In contrast, the use of different bases enables our approaches to process broader classes of jointly sparse signals.

Compressed Sensing (CS)

A new framework for single-signal sensing and compression has developed recently under the rubric of Compressed Sensing (CS). CS builds on the ground-breaking work of Candès, Romberg, and Tao (see E. Candès, J. Romberg, and T. Tao, "Robust uncertainty principles: Exact signal reconstruction from highly incomplete frequency information," IEEE Trans. Inf. Theory, vol. 52, no. 2, pp. 489-509, 2006) and Donoho (see D. Donoho, "Compressed sensing," IEEE Trans. Inf. Theory, vol. 52, no. 4, pp. 1289-1306, 2006), who showed that if a signal has a sparse representation in one basis then it can be recovered from a small number of projections onto a second basis that is incoherent with the first. Roughly speaking, incoherence means that no element of one basis has a sparse representation in terms of the other basis. This notion has a variety of formalizations in the CS literature (see E. Candès, J. Romberg, and T. Tao, "Robust uncertainty principles: Exact signal reconstruction from highly incomplete frequency information," IEEE Trans. Inf. Theory, vol. 52, no. 2, pp. 489-509, 2006; D. Donoho, "Compressed sensing," IEEE Trans. Inf. Theory, vol. 52, no. 4, pp. 1289-1306, 2006; E. Candès and T. Tao, "Near optimal signal recovery from random projections and universal encoding strategies," August 2004, Preprint and J. Tropp and A. C. Gilbert, "Signal recovery from partial information via orthogonal matching pursuit," April 2005, Preprint).

In fact, for an N-sample signal that is K-sparse, only K+1 projections of the signal onto the incoherent basis are required to reconstruct the signal with high probability (Theorem 1). By K-sparse, we mean that the signal can be written as a sum of K basis functions from some known basis. Unfortunately, this requires a combinatorial search, which is prohibitively complex. Candès et al. (see E. Candès, J. Romberg, and T. Tao, "Robust uncertainty principles: Exact signal reconstruction from highly incomplete frequency information," IEEE Trans. Inf. Theory, vol. 52, no. 2, pp. 489-509, 2006) and Donoho (see D. Donoho, "Compressed sensing," IEEE Trans. Inf. Theory, vol. 52, no. 4, pp. 1289-1306, 2006) have recently proposed tractable recovery procedures based on linear programming, demonstrating the remarkable property that such procedures provide the same result as the combinatorial search as long as cK projections are used to reconstruct the signal (typically c≈3 or 4) (see E. Candès and T. Tao, "Error correction via linear programming," Found. of Comp. Math., 2005, Submitted; D. Donoho and J. Tanner, "Neighborliness of randomly projected simplices in high dimensions," March 2005, Preprint and D. Donoho, "High-dimensional centrally symmetric polytopes with neighborliness proportional to dimension," January 2005, Preprint). Iterative greedy algorithms have also been proposed (see J. Tropp, A. C. Gilbert, and M. J. Strauss, "Simulataneous sparse approximation via greedy pursuit," in IEEE 2005 Int. Conf. Acoustics, Speech, Signal Processing (ICASSP), Philadelphia, March 2005; M. F. Duarte, M. B. Wakin, and R. G. Baraniuk, "Fast reconstruction of piecewise smooth signals from random projections," in Online Proc. Workshop on Signal Processing with Adaptative Sparse Structured Representations (SPARS), Rennes, France, November 2005 and C. La and M. N. Do, "Signal reconstruction using sparse tree representation," in Proc. Wavelets XI at SPIE Optics and Photonics, San Diego, August 2005), allowing even faster reconstruction at the expense of slightly more measurements.

Yet despite these significant revelations, there has been little work on distributed source coding in the CS community. We now survey such related work.

Related Work on Distributed Source Coding with CS

Recently, Bajwa, Rabbat, Haupt, Sayeed and Nowak (see W. Bajwa, J. Haupt, A. Sayeed and R. Nowak, "Compressive Wireless Sensing", in Proc. Inf. Processing in Sensor Networks (IPSN), Nashville, Tenn., April 2006 and M. Rabbat, J. Haupt and R. Nowak, "Decentralized Compression and Predistribution via Randomized Gossiping", in Proc. Inf. Processing in Sensor Networks (IPSN), Nashville, Tenn., April 2006) formulated settings for CS in sensor networks that exploit inter-signal correlations. In their approaches, each sensor $n \in \{1, 2, \ldots, N\}$ simultaneously records a single reading $x(n)$ of some spatial field (temperature at a certain time, for example). Note that in this section only, N refers to the number of sensors and not the length of the signals. Each of the sensors generates a pseudorandom sequence $r_n(m)$, $m=1, 2, \ldots, M$, and modulates the reading as $x(n)r_n(m)$. In the first scheme, each sensor n then transmits its M numbers in sequence in an analog and synchronized fashion to the collection point such that it automatically aggregates them, obtaining M measurements $y(m) = \Sigma_{n=1}^{N} x(n) r_n(m)$. In the second scheme, sensors select other sensors at random to communicate their own modulated values, to be averaged, so that as more communications occur each sensor will asymptotically obtain the value of the measurement $y(m)$; thus, every sensor becomes a collection point. Thus, defining $x=[x(1), x(2), \ldots, x(N)]^T$ and $\phi_m = [r_1(m), r_2(m), \ldots, r_N(m)]$, the collection points automatically receive the measurement vector $y=[y(1), y(2), \ldots, y(M)]^T$ after O(M) transmission steps. The samples $x(n)$ of the spatial field can then be recovered using CS provided that x has a sparse representation in a known basis. The coherent analog transmission in the first scheme also provides a power amplification property, thus reducing the power cost for the data transmission by a factor of N. There are significant shortcomings to these approaches, however. Sparse representations for x are straightforward when the spatial samples are arranged in a grid, but establishing such a representation becomes much more difficult when the spatial sampling is irregular (see R. Wagner, V. Delouille, H. Choi, and R. G. Baraniuk, "Distributed wavelet transform for irregular sensor network grids," in IEEE Statistical Signal Processing (SSP) Workshop, Bordeaux, France, July 2005). Additionally, since this method operates at a single time instant, it exploits only inter-signal and not intra-signal correlations; that is, it essentially assumes that the sensor field is i.i.d. from time instant to time instant. In contrast, we will develop signal models and algorithms that are agnostic to the spatial sampling structure and that exploit both inter- and intra-signal correlations.

SUMMARY OF THE INVENTION

Signal processing is the business of measuring, communicating, and processing information. In some cases, this information is contained in a single signal, which we may denote by x. If x contains some structure, such as a sparse representation or approximation in some basis, then x can be compressed while preserving its essential information content. The recent theory of Compressive Sensing (CS) states that, if x is sparse in some basis, then x can be recovered from a small number of nonadaptive linear projections onto a second basis (such as a random one) that is incoherent with the first. (This is defined precisely below.) CS has many promising implications in data compression storage, imaging, communication, and beyond. Our additional work has also shown that such incoherent measurements are also "information scalable"—that is, various levels of information about x (less specific than recovering x itself) can be extracted from the incoherent measurements, often using far fewer measurements than would be required for reconstruction.

Many interesting cases in signal processing involve not merely a single signal, but multiple signals that collectively describe some information. We denote a set of J of signals by $x_1, x_2, \ldots, x_J$. By "multiple signals" we may also consider, for example, single signals that have natural partitions in time (such as a video sequence is a collection of image frames), space (such as a ocean temperatures as function of both time and spatial location), modality (such as the 3 channels of an RGB color image), and so on.

We let X denote the information or phenomenon collectively described by the signals $x_1, x_2, \ldots, x_J$. This phenomenon may simply equal the signals themselves, or it may be some more general phenomenon on which the signals depend (such as the expression on a person's face, photographed from multiple angles).

In general, the effect of X on the signals $x_1, x_2, \ldots, x_J$ will impose some coherence or dependency among the signals. In addition, these signals may each possess their own structure such as sparsity. A generic method for compressing the signals $x_1, x_2, \ldots, x_J$ would consider all signals jointly to exploit their common structure.

The present invention encompasses three main areas:
1. The use of Compressive Sensing incoherent projection independently on each of the signals $x_1, x_2, \ldots, x_J$ for the purpose of preserving information about X that can be later extracted from the joint ensemble of measurements. These projections can be used to measure signals through specially designed sensors or to compress and encode signals that are available in a distributed setting. (Our work on Distributed Compressed Sensing offers evidence that such independent measurement schemes can efficiently capture the joint structure among the signals.)
2. The use of models for the structure contained within and/or among the signals $x_1, x_2, \ldots, x_J$. (For example, we introduce Joint Sparsity Models (JSMs), in which each signal is itself sparse, but the sparsities among the signals are also related.)
3. The use of algorithms to recover exact or approximate information about X from partial information about the signals (such as the ensemble of Compressed Sensing measurements). Such algorithms can depend, for example, on the joint structure models mentioned above. These algorithms can be designed to specifically recover the signals $x_1, x_2, \ldots, x_J$ (as in our Distributed Compressed Sensing work described below), or can may be used to directly answer questions about X (such as making a detection decision).

The following is a non-exhaustive list of the types of signals for which the present invention applies: Multiple signals that are correlated through their sparse decompositions in predetermined bases or frames; and multiple correlated signals captured from physically distinct devices, or at distinct times. The signals may be correlated, for example, because:

the signals are obtained from devices at the same or similar time instants (such as multiple temperature sensors in a given room);

the signals are obtained from devices that are observing an event on the same or overlapping space region (such as multiple cameras observing the same setting from different viewpoints);

the signals observe the same physical events using different modalities captured by one or more sensors (such as a 3-channel color image by a single camera, or audio, image and seismic signals of a single event); and the signals are obtained from devices that are observing a single event at different resolutions, spatial regions, or different time periods (such as video compression from snapshot measurements).

In a preferred embodiment, the present invention is a method for approximating a plurality of digital signals or images using compressed sensing. In a scheme where a common component $x_c$ of said plurality of digital signals or images an innovative component $x_i$ of each of said plurality of digital signals each are represented as a vector with m entries, the method comprises the steps of making a measurement $y_c$, where $y_c$ comprises a vector with only $n_i$ entries, where $n_i$ is less than m, making a measurement $y_i$ for each of said correlated digital signals, where $y_i$ comprises a vector with only $n_i$ entries, where $n_i$ is less than m, and from each said innovation components $y_i$, producing an approximate reconstruction of each m-vector $x_i$ using said common component $y_c$ and said innovative component $y_i$.

In another preferred embodiment, the present invention is a method for approximating a plurality of digital signals or images using compressed sensing. The method comprises the steps of estimating a common component of said plurality of digital signals, estimating measurements generated by innovations of each of said plurality of digital signals, constructing approximations of said innovations of each of said plurality of digital signals, and obtaining an estimate of at least one signal from said plurality of digital signals as the sum of said estimate of said common component and estimates of at least one innovation component of said at least one signal.

In still another embodiment, the present invention is an apparatus for joint measurement of a plurality of signals. The system comprises means for measuring a plurality of correlated signals, the measuring means encoding each signal independently by projecting each signal onto another incoherent basis, means for transmitting each said encoded signal from said means for measuring to a signal processor, and means for recovering said plurality of correlated signals based upon a correlation of sparse representations of said signals. The means for measuring may comprises a single sensor or a plurality of sensors. Further, the sensor or sensors may comprise a camera, a temperature sensor, or any other sensor. The means for measuring may measure the plurality of signals using an incoherent measurement matrix.

In still another embodiment, the present invention is a method for encoding a plurality of signals. The method comprises the steps of measuring a plurality of signals, generating for each of the signals a common component and an innovation component; and reconstructing approximations of the signals using a correlation of sparse representations of the plurality of signals.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

For a more complete understanding of the present invention and the advantages thereof, reference is now made to the following description and the accompanying drawings, in which:

FIG. 7(a) illustrates reconstruction using OMP independently on each signal in Step 3 of the ACIE algorithm (innovations have arbitrary supports).

DETAILED DESCRIPTION OF THE PREFERRED EMBODIMENTS

Figure 1:
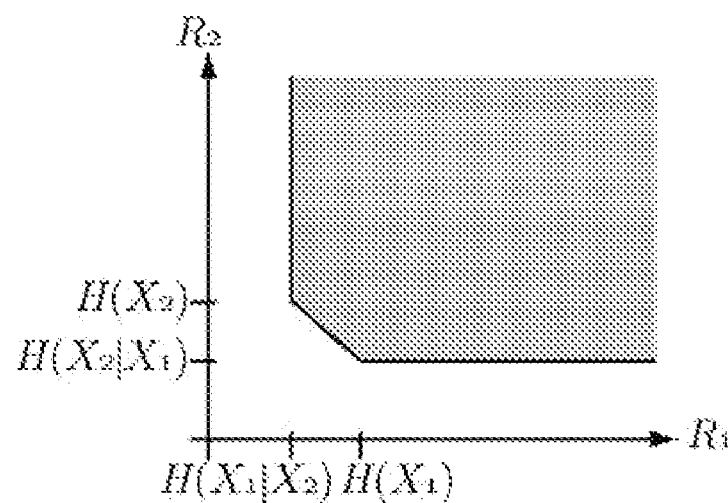
FIG. 1 is a chart having a shaded area indicating the Slepian-Wolf achievable rate region for distributed source coding in accordance with the present invention.

A core tenet of signal processing and information theory is that signals, images, and other data often contain some type of structure that enables intelligent representation and processing. The notion of structure has been characterized and exploited in a variety of ways for a variety of purposes. We focus on exploiting signal correlations for the purpose of compression.

Current state-of-the-art compression algorithms employ a decorrelating transform such as an exact or approximate Karhunen-Lèeve transform (KLT) to compact a correlated signal's energy into just a few essential coefficients (see R. A. DeVore, B. Jawerth, and B. J. Lucier, "Image compression through wavelet transform coding," IEEE Trans. Inf. Theory, vol. 38, no. 2, pp. 719-746, March 1992; J. Shapiro, "Embedded image coding using zerotrees of wavelet coefficients," IEEE Trans. Signal Processing, vol. 41, no. 12, pp. 3445-3462, December 1993 and Z. Xiong, K. Ramchandran, and M. T. Orchard, "Space-frequency quantization for wavelet image coding," IEEE Trans. Image Processing, vol. 6, no. 5, pp. 677-693, 1997). Such transform coders exploit the fact that many signals have a sparse representation in terms of some basis, meaning that a small number K of adaptively chosen transform coefficients can be transmitted or stored rather than N>>K signal samples. For example, smooth signals are sparse in the Fourier basis, and piecewise smooth signals are sparse in a wavelet basis (see S. Mallat, A Wavelet Tour of Signal Processing, Academic Press, San Diego, 1999); the commercial coding standards MP3 (see K. Brandenburg, "MP3 and AAC explained," in AES 17th International Conference on High-Quality Audio Coding, September 1999), JPEG (see W. Pennebaker and J. Mitchell, "JPEG: Still image data compression standard," Van Nostrand Reinhold, 1993), and JPEG2000 (see D. S. Taubman and M. W. Marcellin, JPEG 2000: Image Compression Fundamentals, Standards and Practice, Kluwer, 2001) directly exploit this sparsity.

Information Theory

Lossless Source Coding

In a typical lossless coding scenario, we have a sequence $x=x(1), x(2), \ldots, x(N)$ of N symbols, $n \in \{1, 2, \ldots, N\}$, where each symbol $x(n)$ belongs to a finite alphabet X. Our goal is to encode x using bits in such a way that we can reconstruct x perfectly at the decoder. For purposes of the present application, the terms "perfect" and "exact" are used interchangeably. In order to represent the sequence x, a straightforward approach is to represent each symbol $x(n)$ using $\lceil \log_2(|X|) \rceil$ bits, where $|\cdot|$ denotes the cardinality of a set, $\log_2(\bullet)$ is the base-two logarithm, and $\lceil \bullet \rceil$ rounds up to the nearest integer.

The sequence x is often modeled in a way that enables a more compact representation of the sequence. This is called compression. To elaborate further, we now describe a standard setting for lossless source coding. Consider a source X that generates such sequences, where the symbols of x are i.i.d., and the probability mass function assigns each symbol $x(n) \in X$ a probability $p(x(n))$. The key idea in lossless compression is to represent each symbol $x(n)$ that has probability p using $-\log_2(p)$ bits. Using this insight, the entropy H(X) is defined as $$H(X) \triangleq -\Sigma_{x(n) \in X} p(x(n)) \log_2(p(x(n))). \quad (1)$$

Not only can sequences be compressed close to their entropy using this insight (see T. M. Cover and J. A. Thomas, Elements of Information Theory, Wiley, New York, 1991), but it also turns out that the entropy provides the lowest per-symbol rate that enables lossless compression. Various techniques such as arithmetic coding (see T. M. Cover and J. A. Thomas, Elements of Information Theory, Wiley, New York, 1991) can be used to compress near the entropy rate.

Distributed Source Coding

Information theory (see T. M. Cover and J. A. Thomas, Elements of Information Theory, Wiley, New York, 1991 and J. Wolfowitz, Coding Theorems of Information Theory, Springer-Verlag, Berlin, 1978) has also provided tools that characterize the performance of distributed source coding. For correlated length-N sequences $x_1$ and $x_2$ generated by sources $X_1$ and $X_2$ over discrete alphabets $X_1$ and $X_2$, we have entropies $H(X_1)$ and $H(X_2)$ as before in (1). The joint entropy of $X_1$ and $X_2$, which is the lowest rate that enables compression of $x_1$ and $x_2$ together, is defined as $$(X_1, X_2) \triangleq -\Sigma_{x_1(n) \in X_1, x_2(n) \in X_2} p(x_1(n), x_2(n)) \log_2(p(x_1(n), x_2(n))).$$

The extension to more than two signals is straightforward (see T. M. Cover and J. A. Thomas, Elements of Information Theory, Wiley, New York, 1991).

The conditional entropy is the lowest per-symbol rate that enables lossless compression, conditioned on the side information that is available at both encoder and decoder. More formally, $$H(X_1|X_2) \triangleq -\Sigma_{x_1(n) \in X_1, x_2(n) \in X_2} p(x_1(n), x_2(n)) \log_2(p(x_1(n)|x_2(n))),$$

and it can be shown that $$H(X_1) + H(X_2|X_1) = H(X_1, X_2) = H(X_2) + H(X_1|X_2).$$

If the sources $X_1$ and $X_2$ are independent, then $H(X_2|X_1) = H(X_2)$ and $H(X_1|X_2) = H(X_1)$, and so the joint entropy is the sum of the individual entropies $H(X_1)$ and $H(X_2)$. In this case, separate (independent) compression of each of the sequences $x_1$ and $x_2$ can achieve the optimal compression rate $H(X_1, X_2)$. However, if $X_1$ and $X_2$ are correlated sources, then the joint entropy satisfies $H(X_1, X_2) < H(X_1) + H(X_2)$, meaning that the separate encoding of each sequence is wasteful. The potential savings in the coding rate in this setup motivated Slepian and Wolf to study the distributed coding of correlated sources (see D. Slepian and J. K. Wolf, "Noiseless coding of correlated information sources," IEEE Trans. Inf. Theory, vol. 19, pp. 471-480, July 1973).

In the Slepian-Wolf framework (see T. M. Cover and J. A. Thomas, Elements of Information Theory, Wiley, New York, 1991; D. Slepian and J. K. Wolf, "Noiseless coding of correlated information sources," IEEE Trans. Inf. Theory, vol. 19, pp. 471-480, July 1973; S. Pradhan and K. Ramchandran, "Distributed source coding using syndromes (DISCUS): Design and construction," IEEE Trans. Inf. Theory, vol. 49, pp. 626-643, March 2003; Z. Xiong, A. Liveris, and S. Cheng, "Distributed source coding for sensor networks," IEEE Signal Processing Mag., vol. 21, pp. 80-94, September 2004; J. Wolfowitz, Coding Theorems of Information Theory, Springer-Verlag, Berlin, 1978 and T. M. Cover, "A proof of the data compression theorem of Slepian and Wolf for ergodic sources," IEEE Trans. Inf. Theory, vol. 21, pp. 226-228, March 1975), the sequences $x_1$ and $x_2$ are encoded separately and decoded jointly. The rates $R_1$ and $R_2$ at which we encode $x_1$ and $x_2$ are the normalized number of bits used per source symbol. For Slepian-Wolf coding, there is an entire rate region of rate pairs $(R_1, R_2)$ that enable us to correctly reconstruct $x_1$ and $x_2$. This rate region is characterized by constrains for the individual rates given by the conditional entropies of each of the sources and by a constrain on the sum of the rates given by the joint entropy of the sources. In contrast, separate encoding must encode each source at its entropy, and the sum rate is often greater than the joint entropy.

Compressed Sensing

Transform Coding

Consider a length-N, real-valued signal x of any dimension (without loss of generality, we will focus on one dimension for notational simplicity) indexed as $x(n)$, $n \in \{1, 2, \ldots, N\}$. Suppose that the basis $\Psi = [\psi_1, \ldots, \psi_N]$ (see S. Mallat, A Wavelet Tour of Signal Processing, Academic Press, San Diego, 1999) provides a K-sparse representation of x; that is $$x = \sum_{n=1}^{N} \theta(n) \psi_n = \sum_{l=1}^{K} \theta(n_l) \psi_{n_l},$$

where x is a linear combination of K vectors chosen from $\Psi$, $\{n_l\}$ are the indices of those vectors, and $\{\theta(n)\}$ are the coefficients; the concept is extendable to tight frames (see S.

Mallat, A Wavelet Tour of Signal Processing, Academic Press, San Diego, 1999). Alternatively, we can write in matrix notation $$x = \Psi\theta,$$

where x is an N×1 column vector, the sparse basis matrix $\Psi$ is N×N with the basis vectors $\psi_n$ as columns, and $\theta$ is an N×1 column vector with K nonzero elements. Using $\|\cdot\|_p$ to denote the $l_p$ norm, we can write that $\|\theta\|_0 = K$. The $l_0$ "norm" $\|\theta\|_0$ merely counts the number of nonzero entries in the vector $\theta$. Various expansions, including wavelets, Gabor bases (see S. Mallat, A Wavelet Tour of Signal Processing, Academic Press, San Diego, 1999), curvelets (see E. Candès and D. Donoho, "Curvelets—A surprisingly effective nonadaptive representation for objects with edges," Curves and Surfaces, 1999), etc., are widely used for representation and compression of natural signals, images, and other data. (See also, U.S. Patent Publication No. US 2006/0029279 entitled "Method and Apparatus for Compressed Sensing published on Feb. 9, 2006.)

We will focus on exactly K-sparse signals and defer discussion of the more general situation where the coefficients decay rapidly but not to zero for ease of explanation (see section on application to sensor networks for additional discussion; see also M. F. Duarte, M. B. Wakin, D. Baron, and R. G. Baraniuk, "Universal distributed sensing via random projections," in Proc. 5th International Workshop on Inf Processing in Sensor Networks (IPSN '06), 2006 for DCS examples on real-world compressible signals). The standard procedure for compressing sparse signals, known as transform coding, is to (i) acquire the full N-sample signal x; (ii) compute the complete set of transform coefficients $\{\theta(n)\}$; (iii) locate the K largest, significant coefficients and discard the (many) small coefficients; (iv) encode the values and locations of the largest coefficients.

This procedure has three inherent inefficiencies: First, for a high-dimensional signal, we must start with a large number of samples N. Second, the encoder must compute all of the N transform coefficients $\{\theta(n)\}$, even though it will discard all but K of them. Third, the encoder must encode the locations of the large coefficients, which requires increasing the coding rate since the locations change with each signal.

Incoherent Projections

This raises a simple question: For a given signal, is it possible to directly estimate the set of large $\theta(n)$'s that will not be discarded? While this seems improbable, Candès, Romberg, and Tao (see E. Candès, J. Romberg, and T. Tao, "Robust uncertainty principles: Exact signal reconstruction from highly incomplete frequency information," IEEE Trans. Inf. Theory, vol. 52, no. 2, pp. 489-509, 2006 and E. Candès and T. Tao, "Near optimal signal recovery from random projections and universal encoding strategies," August 2004, Preprint) and Donoho (see D. Donoho, "Compressed sensing," IEEE Trans. Inf. Theory, vol. 52, no. 4, pp. 1289-1306, 2006) have shown that a reduced set of projections can contain enough information to reconstruct sparse signals. An offshoot of this work, often referred to as Compressed Sensing (CS) (see D. Donoho, "Compressed sensing," IEEE Trans. Inf. Theory, vol. 52, no. 4, pp. 1289-1306, 2006; E. Candès and T. Tao, "Near optimal signal recovery from random projections and universal encoding strategies," August 2004, Preprint; E. Candès and J. Romberg, "Quantitative robust uncertainty principles and optimally sparse decompositions," Found. of Comp. Math., 2004, Submitted; E. Candès, J. Romberg, and T. Tao, "Stable signal recovery from incomplete and inaccurate measurements," Comm. on Pure and Applied Math., 2005, Submitted; E. Candès and T. Tao, "Decoding by linear programming," IEEE Trans. Inf. Theory, vol. 51, pp. 4203-4215, December 2005; E. Candès and J. Romberg, "Practical signal recovery from random projections," IEEE Trans. Signal Processing, 2005, Submitted and D. Donoho and Y. Tsaig, "Extensions of compressed sensing," 2004, Preprint), has emerged that builds on this principle.

In CS, we do not measure or encode the K significant $\theta(n)$ directly. Rather, we measure and encode M<N projections $y(m) = \langle x, \phi_m^T \rangle$ of the signal onto a second set of basis functions $\{\phi_m\}$, $m = 1, 2, \ldots, M$, where $\phi_m^T$ denotes the transpose of $\phi_m$ and $\langle \cdot, \cdot \rangle$ denotes the inner product. In matrix notation, we measure $$y = \Phi x,$$

where y is an M×1 column vector and the measurement basis matrix $\Phi$ is M×N with each row a basis vector $\phi_m$. Since M<N, recovery of the signal x from the measurements y is ill-posed in general; however the additional assumption of signal sparsity makes recovery possible and practical.

The CS theory tells us that when certain conditions hold, namely that the basis $\{\phi_m\}$ cannot sparsely represent the elements of the basis $\{\psi_n\}$ (a condition known as incoherence of the two bases, see E. Candès, J. Romberg, and T. Tao, "Robust uncertainty principles: Exact signal reconstruction from highly incomplete frequency information," IEEE Trans. Inf. Theory, vol. 52, no. 2, pp. 489-509, 2006; D. Donoho, "Compressed sensing," IEEE Trans. Inf. Theory, vol. 52, no. 4, pp. 1289-1306, 2006; E. Candès and T. Tao, "Near optimal signal recovery from random projections and universal encoding strategies," August 2004, Preprint and J. Tropp and A. C. Gilbert, "Signal recovery from partial information via orthogonal matching pursuit," April 2005, Preprint) and the number of measurements M is large enough, then it is indeed possible to recover the set of large $\{\theta(n)\}$ (and thus the signal x) from a similarly sized set of measurements $\{y(m)\}$. This incoherence property holds for many pairs of bases, including for example, delta spikes and the sine waves of a Fourier basis, or the Fourier basis and wavelets. Significantly, this incoherence also holds with high probability between an arbitrary fixed basis and a randomly generated one. Signals that are sparsely represented in frames or unions of bases can be recovered from incoherent measurements in the same fashion. These matrix pairs are shown only as examples; in general, many incoherent matrices exist for a given sparsifying basis or frame.

Signal Recovery Via $l_0$ Optimization

The recovery of the sparse set of significant coefficients $\{\theta(n)\}$ can be achieved using optimization by searching for the signal with $l_0$-sparsest coefficients $\{\theta(n)\}$ that agrees with the M observed measurements in y (recall that M<N). Reconstruction relies on the key observation that, given some technical conditions on $\Phi$ and $\psi$, the coefficient vector $\theta$ is the solution to the $l_0$ minimization $$\theta = \arg\min\|\theta\|_0 \text{ s.t. } y = \Phi\Psi\theta \tag{3}$$

with overwhelming probability. (Thanks to the incoherence between the two bases, if the original signal is sparse in the $\theta$ coefficients, then no other set of sparse signal coefficients $\theta'$ can yield the same projections y.) We will call the columns of $\Phi\Psi$ the holographic basis.

Figure 19:
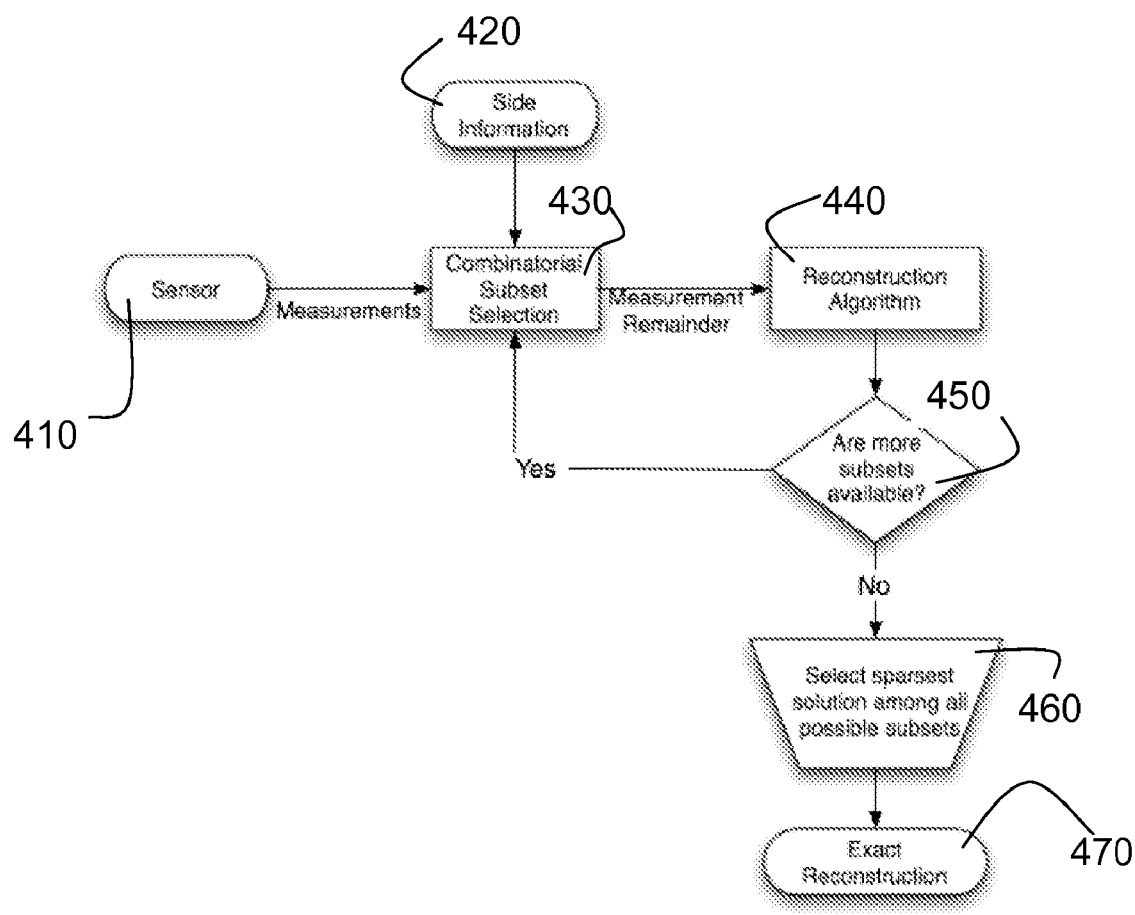
FIG. 19 is a flow chart illustrating reconstruction with side measurements in accordance with a preferred embodiment of the present invention.

This process for solving this minimization is illustrated in FIG. 19, where a sensor 410 records the measurements, which in addition to possible side information 420 detailing the anticipated sparsity K, is used in the reconstruction. The reconstruction algorithm 430 enumerates all K-sparse subsets of length-N, attempting reconstruction 440 on each subset using standard tools from linear algebra. This process is repeated 450 for each possible sparse support, and the sparsest possible support is chosen 460 for the reconstructed signal 470.

In principle, remarkably few incoherent measurements are required to recover a K-sparse signal via $l_0$ minimization. Clearly, more than K measurements must be taken to avoid ambiguity; the following theorem establishes that K+1 random measurements will suffice. Similar results were established by Venkataramani and Bresler (see R. Venkataramani and Y. Bresler, "Further results on spectrum blind sampling of 2D signals," in Proc. IEEE Int. Conf. Image Proc. (ICIP), Chicago, October 1998, vol. 2).

Theorem 1 (see D. Baron, M. B. Wakin, M. F. Duarte, S. Sarvotham, and R. G. Baraniuk, "Distributed Compressed Sensing", 2005, preprint.) Let $\Psi$ be an orthonormal basis for $R^N$, and let $1 \leq K < N$. Then the following statements hold:

1. Let $\Phi$ be an M×N measurement matrix with i.i.d. Gaussian entries with $M \geq 2K$. Then with probability one the following statement holds: all signals $x = \Psi\theta$ having expansion coefficients $\Theta \in R^N$ that satisfy $\|\theta\|_0 = K$ can be recovered uniquely from the M-dimensional measurement vector $y = \Phi x$ via the $l_0$ optimization (3).
2. Let $x = 105$ $\theta$ such that $\|\theta\|_0 = K$. Let $\Phi$ be an M×N measurement matrix with i.i.d. Gaussian entries (notably, independent of x) with $M \geq K+1$. Then with probability one the following statement holds: x can be recovered uniquely from the M-dimensional measurement vector $y = \Phi x$ via the $l_0$ optimization (3).
3. Let $\Phi$ be an M×N measurement matrix, where $M \leq K$. Then, aside from pathological cases (specified in the proof), no signal $x = \Psi\theta$ with $\|\theta\|_0 = K$ can be uniquely recovered from the M-dimensional measurement vector $y = \Phi x$.

Remark 1 The second statement of the theorem differs from the first in the following respect: when K<M<2K, there will necessarily exist K-sparse signals x that cannot be uniquely recovered from the M-dimensional measurement vector $y = \Phi x$. However, these signals form a set of measure zero within the set of all K-sparse signals and can safely be avoided if $\Phi$ is randomly generated independently of x.

The intriguing conclusion from the second and third statements of Theorem 1 is that one measurement separates the achievable region, where perfect reconstruction is possible with probability one, from the converse region, where with overwhelming probability reconstruction is impossible. Moreover, Theorem 1 provides a strong converse measurement region in a manner analogous to the strong channel coding converse theorems of Wolfowitz (see J. Wolfowitz, Coding Theorems of Information Theory, Springer-Verlag, Berlin, 1978).

Solving this $l_0$ optimization problem is prohibitively complex, requiring a combinatorial enumeration of the NK possible sparse subspaces. In fact, the $l_0$-recovery problem is known to be NP-complete (see E. Candès and T. Tao, "Error correction via linear programming," Found. of Comp. Math., 2005, Submitted). Yet another challenge is robustness; in the setting of Theorem 1, the recovery may be very poorly conditioned. In fact, both of these considerations (computational complexity and robustness) can be addressed, but at the expense of slightly more measurements.

Signal Recovery Via $l_1$ Optimization

The practical revelation that supports the new CS theory is that it is not necessary to solve the $l_0$-minimization problem to recover the set of significant $\{\theta(n)\}$. In fact, a much easier problem yields an equivalent solution (thanks again to the incoherency of the bases); we need only solve for the $l_1$-sparsest coefficients $\theta$ that agree with the measurements y (see E. Candès, J. Romberg, and T. Tao, "Robust uncertainty principles: Exact signal reconstruction from highly incomplete frequency information," IEEE Trans. Inf Theory, vol. 52, no. 2, pp. 489-509, 2006; D. Donoho, "Compressed sensing," IEEE Trans. Inf. Theory, vol. 52, no. 4, pp. 1289-1306, 2006; E. Candès and T. Tao, "Near optimal signal recovery from random projections and universal encoding strategies," August 2004, Preprint; E. Candès and J. Romberg, "Quantitative robust uncertainty principles and optimally sparse decompositions," Found. of Comp. Math., 2004, Submitted; E. Candès, J. Romberg, and T. Tao, "Stable signal recovery from incomplete and inaccurate measurements," Comm. on Pure and Applied Math., 2005, Submitted; E. Candès and T. Tao, "Decoding by linear programming," IEEE Trans. Inf. Theory, vol. 51, pp. 4203-4215, December 2005; E. Candès and J. Romberg, "Practical signal recovery from random projections," IEEE Trans. Signal Processing, 2005, Submitted and D. Donoho and Y. Tsaig, "Extensions of compressed sensing," 2004, Preprint):

$$\theta = \arg\min \|\theta\|_1 \text{ s.t. } y = \Phi\Psi\theta. \quad (4)$$

This optimization problem, also known as Basis Pursuit (see S. Chen, D. Donoho, and M. Saunders, "Atomic decomposition by basis pursuit," SIAM J. on Sci. Comp., vol. 20, no. 1, pp. 33-61, 1998), is significantly more approachable and can be solved with traditional linear programming techniques whose computational complexities are polynomial in N.

There is no free lunch, however; according to the theory, more than K+1 measurements are required in order to recover sparse signals via Basis Pursuit. Instead, one typically requires $M \geq cK$ measurements, where $c > 1$ is an oversampling factor. As an example, we quote a result asymptotic in N. For simplicity, we assume that the sparsity scales linearly with N; that is, K=SN, where we call S the sparsity rate.

Theorem 2 (see E. Candès and T. Tao, "Error correction via linear programming," Found. of Comp. Math., 2005, Submitted; D. Donoho and J. Tanner, "Neighborliness of randomly projected simplices in high dimensions," March 2005, Preprint and D. Donoho, "High-dimensional centrally symmetric polytopes with neighborliness proportional to dimension," January 2005, Preprint) Set K=SN with $0 < S << 1$. Then there exists an oversampling factor $c(S) = O(\log(1/S))$, $c(S) > 1$, such that, for a K-sparse signal x in basis $\Psi$, the following statements hold:

1. The probability of recovering x via Basis Pursuit from $(c(S)+\epsilon)K$ random projections, $\epsilon > 0$, converges to one as $N \to \infty$.
2. The probability of recovering x via Basis Pursuit from $(c(S)-\epsilon)K$ random projections, $\epsilon > 0$, converges to zero as $N \to \infty$.

In an illuminating series of recent papers, Donoho and Tanner (see D. Donoho and J. Tanner, "Neighborliness of randomly projected simplices in high dimensions," March 2005, Preprint and D. Donoho, "High-dimensional centrally symmetric polytopes with neighborliness proportional to dimension," January 2005, Preprint) have characterized the oversampling factor c(S) precisely. With appropriate oversampling, reconstruction via Basis Pursuit is also provably robust to measurement noise and quantization error (see E. Candès, J. Romberg, and T. Tao, "Sparse Signal Recovery from Incomplete and Inaccurate Measurements," April 2005 and Jarvis Haupt and Rob Nowak, "Signal Reconstruction from Noisy Random Projections". To appear in IEEE Transactions in Inf. Theory, 2006).

In the remainder of the document, we often use the abbreviated notation c to describe the oversampling factor required in various settings even though c(S) depends on the sparsity K and signal length N.

Signal Recovery Via Greedy Pursuit

At the expense of slightly more measurements, iterative greedy algorithms have also been developed to recover the signal x from the measurements y. Examples include the iterative Orthogonal Matching Pursuit (OMP, see J. Tropp and A. C. Gilbert, "Signal recovery from partial information via orthogonal matching pursuit," April 2005, Preprint), matching pursuit (MP), and tree matching pursuit (TMP) algorithms (see M. F. Duarte, M. B. Wakin, and R. G. Baraniuk, "Fast reconstruction of piecewise smooth signals from random projections," in Online Proc. Workshop on Signal Processing with Adaptative Sparse Structured Representations (SPARS), Rennes, France, November 2005 and C. La and M. N. Do, "Signal reconstruction using sparse tree representation," in Proc. Wavelets XI at SPIE Optics and Photonics, San Diego, August 2005). OMP, for example, iteratively selects the vectors from the holographic basis $\Phi\Psi$ that contain most of the energy of the measurement vector y. The selection at each iteration is made based on inner products between the columns of $\Phi\Psi$ and a residual; the residual reflects the component of y that is orthogonal to the previously selected columns.

OMP is guaranteed to converge within a finite number of iterations. In CS applications, OMP requires $c \approx 2\ln(N)$ to succeed with high probability. In the following, we will exploit both Basis Pursuit and greedy algorithms for recovering jointly sparse signals from incoherent measurements.

Distributed Compressed Sensing (DCS)

We introduce a new theory for distributed compressed sensing (DCS) that enables new distributed coding algorithms that exploit both intra- and inter-signal correlation structures. In a typical DCS scenario, illustrated in FIG. 18, a number of sensors 210 measure signals (of any dimension) that are each individually sparse in some basis and also correlated from sensor to sensor. Each sensor independently encodes its signal by projecting it onto another, incoherent basis (such as a random one) and then transmits just a few of the resulting coefficients 220 to a single collection point or receiver 232. A reconstruction process 230 estimates the signals measured the sensors from the received data. Under the right conditions, a decoder using a reconstruction algorithm 234 at the collection point can reconstruct each of the signals 236 precisely.

Joint Sparsity

The DCS theory rests on a concept that we term the joint sparsity of a signal ensemble. We describe in detail three simple models for jointly sparse signals, propose tractable algorithms for joint recovery of signal ensembles from incoherent projections, and characterize theoretically and empirically the number of measurements per sensor required for accurate reconstruction. While the sensors operate entirely without collaboration, we will see in many cases that the measurement rates relate directly to the signals' conditional sparsities, in parallel with the Slepian-Wolf theory. The joint sparsity models (JSMs) we study are as follows.

JSM-1: Sparse common component+innovations: In this model each signal consists of a sum of two components: a common component that is present in all of the signals and an innovations component that is unique to each signal. Both the common and innovations components are sparsely representable in some basis. Such signals may arise in settings where large-scale phenomena affect all sensors and local phenomena affect individual sensors; one example would be a network of temperature sensors in a forest, where the sun has a global effect, and shade, water, and animals have more local effects.

For JSM-1, there exists a measurement rate region analogous to the Slepian-Wolf rate region for distributed coding (see D. Slepian and J. K. Wolf, "Noiseless coding of correlated information sources," IEEE Trans. Inf. Theory, vol. 19, pp. 471-480, July 1973) (see FIG. 2). The notion of joint sparsity suggests a joint reconstruction technique based on linear programming. We provide a converse bound (Theorem 5) and an achievable bound (Theorem 6) on the measurement rate region using linear programming techniques.

Our examples reveal that in practice the savings in the total number of required measurements can be substantial over separate CS encoding/decoding, especially when the common component dominates. In one of our scenarios with just two sensors, the savings in the number of measurements can be as large as 30% (Theorem 6). Detailed numerical results appear in the section on examples for JSM-1. We emphasize that these results are based on specific embodiments of signal ensemble reconstruction; one skilled in the art can develop additional reconstruction techniques.

JSM-2: Common sparse supports: In this model, all signals are constructed from the same sparse set of basis vectors, but with different coefficient values. Examples of JSM-2 scenarios include MIMO communication (see J. Tropp, A. C. Gilbert, and M. J. Strauss, "Simulataneous sparse approximation via greedy pursuit," in IEEE 2005 Int. Conf. Acoustics, Speech, Signal Processing (ICASSP), Philadelphia, March 2005) and audio signal arrays; the signals may be sparse in the Fourier domain, for example, yet multipath resulting from differing propagation paths causes different attenuations among the frequency components. (Note that while all sensors may be "listening" to the same underlying signal, in applications such as localization and beamforming it can be important to recover all of the individual signals and not just a single composite signal.)

We develop two techniques based on iterative greedy pursuit for signal ensemble reconstruction from independent, incoherent measurements. Our analysis (Theorem 8) and examples (in the section on examples for JSM-2 and in FIG. 6) indicate that as the number of sensors grows, the oversampling factor c required for exact reconstruction of all signals shrinks to c=1. Since an "oracle" system that knows in advance the positions of the sparse basis vectors also requires c=1 (Theorem 8), our DCS encoder/decoder provides the best-possible performance. From an information theoretic perspective, for JSM-2 we have tight converse and achievable measurement rate bounds. Our examples indicate that the asymptotics take effect with even a moderate number of signals. We emphasize that these results are based on specific embodiments of signal ensemble reconstruction; one skilled in the art can develop additional reconstruction techniques.

JSM-3: Nonsparse common component+sparse innovations: This model extends JSM-1 so that the common component need no longer be sparse in any basis. Since the common component is not sparse, no individual signal contains enough structure to permit efficient compression or CS; in general N measurements would be required for each individual N-sample signal. We demonstrate, however, that the common structure shared by the signals permits a dramatic reduction in the required measurement rates. In fact, asymptotically, the required measurement rates relate simply to the sparsity K of the innovation components; as the number of sensors grows, each sensor may again reduce its oversampling factor to c=1 (Theorem 9). Again, this is best-possible performance that could not be bettered by an oracle that knew the common nonsparse component in advance. We emphasize that these results are based on specific embodiments of signal ensemble reconstruction; one skilled in the art can develop additional reconstruction techniques.

Advantages of DCS

In addition to offering substantially reduced measurement rates in multi-signal applications, the DCS-based distributed source coding schemes we develop here share many of the attractive and intriguing properties of CS, particularly when we employ random projections at the sensors. As in single-signal CS, random measurement bases are universal in the sense that they can be paired with any sparse basis. This allows exactly the same encoding strategy to be applied in a variety of different sensing environments; knowledge of the nuances of the environment are needed only at the decoder. Moreover, random measurements are also future-proof: if a better sparsity-inducing basis is found for the signals, then the same random measurements can be used to reconstruct an even more accurate view of the environment. A pseudorandom basis can be generated using a simple algorithm according to a random seed. Such encoding effectively implements a form of encryption: the randomized measurements will themselves resemble noise and be meaningless to an observer who does not know the associated seed. Random coding is also robust: the randomized measurements coming from each sensor have equal priority, unlike the Fourier or wavelet coefficients in current coders. Thus they allow a progressively better reconstruction of the data as more measurements are obtained; one or more measurements can also be lost without corrupting the entire reconstruction.

Two additional properties of DCS make it well-matched to distributed applications such as sensor networks and arrays (see D. Estrin, D. Culler, K. Pister, and G. Sukhatme, "Connecting the physical world with pervasive networks," IEEE Pervasive Computing, vol. 1, no. 1, pp. 59-69, 2002 and G. J. Pottie and W. J. Kaiser, "Wireless integrated network sensors," Comm. ACM, vol. 43, no. 5, pp. 51-58, 2000). First, each sensor encodes its measurements independently, which reduces inter-sensor communication overhead to zero. Second, DCS distributes its computational complexity asymmetrically, placing most of it in the joint decoder, which will often have more substantial computational resources than any individual sensor node. The encoders are very simple; they merely compute incoherent projections with their signals and make no decisions. The setup is developed in the section on application to sensor networks.

We focus primarily on the basic task of reducing the measurement rate of a signal ensemble in order to reduce the communication cost of source coding that ensemble. In practical settings (such as sensor networks), additional criteria may be relevant for measuring performance. For example, the measurements will typically be real numbers that must be quantized and encoded, which will gradually degrade the reconstruction quality as the quantization becomes coarser (see E. Candès and T. Tao, "The Dantzig selector: Statistical estimation when p is much larger than n," Annals of Statistics, 2005, Submitted). Characterizing DCS in light of practical considerations such as rate-distortion tradeoffs, power consumption in sensor networks, etc., are topics of ongoing research (see M. F. Duarte, M. B. Wakin, D. Baron, and R. G. Baraniuk, "Universal distributed sensing via random projections," in Proc. 5th International Workshop on Inf. Processing in Sensor Networks (IPSN '06), 2006).

The implications of CS are promising for many applications, especially sensing signals that have a sparse representation in some basis. Instead of sampling a K-sparse signal N times, only cK incoherent measurements suffice, where K can be orders of magnitude less than N. (For example, Takhar et al. (D. Takhar, J. N. Laska, M. B. Wakin, M. F. Duarte, D. Baron, K. F. Kelly, and R. G. Baraniuk, "A compressed sensing camera: New theory and an implementation using digital micromirrors," in Proc. Computational Imaging IV at SPIE Electronic Imaging, San Jose, January 2006) develop a camera that dispenses with the usual N-pixel CCD or CMOS imaging array by computing cK incoherent image projections optically using a digital micromirror device.) Therefore, a sensor can transmit far fewer measurements to a receiver, which can reconstruct the signal and then process it in any manner. Moreover, the cK measurements need not be manipulated in any way before being transmitted, except possibly for some quantization. Finally, independent and identically distributed (i.i.d.) Gaussian or Bernoulli/Rademacher (random ±1) vectors provide a useful universal basis that is incoherent with all others. Since the "incoherent" measurement vectors must be known for signal recovery, in practice one may use a pseudorandom basis with a known random seed. Hence, when using a random basis, CS is universal in the sense that the sensor can apply the same measurement mechanism no matter what basis the signal is sparse in (and thus the coding algorithm is independent of the sparsity-inducing basis; see D. Donoho, "Compressed sensing," IEEE Trans. Inf. Theory, vol. 52, no. 4, pp. 1289-1306, 2006 and E. Candès and T. Tao, "Near optimal signal recovery from random projections and universal encoding strategies," August 2004, Preprint).

We emphasize that the framework we operate under can be used both to implement sensor networks composed of measurement devices that calculate incoherent projections (see D. Takhar, J. N. Laska, M. B. Wakin, M. F. Duarte, D. Baron, K. F. Kelly, and R. G. Baraniuk, "A compressed sensing camera: New theory and an implementation using digital micromirrors," in Proc. Computational Imaging IV at SPIE Electronic Imaging, San Jose, January 2006; J. A. Tropp, M. B. Wakin, M. F. Duarte, D. Baron, and R. G. Baraniuk, "Random filters for compressive sampling and reconstruction," in Proc. Int. Conf. Acoustics, Speech, Signal Processing (ICASSP), May 2006 and J. A. Tropp, M. B. Wakin, M. F. Duarte, D. Baron, and R. G. Baraniuk, "Random Filters for Compressive Sampling and Reconstruction", U.S. Provisional Application Ser. No. 60/729,983 and R. G. Baraniuk, M. B. Wakin, D. Baron, M. F. Duarte, M. A. Davenport, Y. Massoud, M. Elnozahi, S. Kirolos, T. S. Mohamed, T. Ragheb and J. A. Tropp, "Method and Apparatus for Compressive Sensing for Analog-to-Information Conversion", U.S. Provisional Application Ser. No. 60/732, 374), or for distributed compression and encoding of recorded signals (see M. F. Duarte, M. B. Wakin, D. Baron, and R. G. Baraniuk, "Universal distributed sensing via random projections," in Proc. 5th International Workshop on Inf. Processing in Sensor Networks (IPSN '06), 2006, and D. Slepian and J. K. Wolf, "Noiseless coding of correlated information sources," IEEE Trans. Inf. Theory, vol. 19, pp. 471-480, July 1973).

Joint Sparsity Models

In this section, we generalize the notion of a signal being sparse in some basis to the notion of an ensemble of signals being jointly sparse. In total, we consider three different joint sparsity models (JSMs) that apply in different situations. In the first two models, each signal is itself sparse, and so we could use the CS framework from the section on compressed sensing to encode and decode each one separately (independently). However, there also exists a framework wherein a joint representation for the ensemble uses fewer total vectors. In the third model, no signal is itself sparse, yet there still exists a joint sparsity among the signals that allows recovery from significantly fewer measurements per sensor. This is meant to be non-exhaustive list of example models; these models are example preferred embodiments and a person skilled in the art can easily extend these results.

We will use the following notation for signal ensembles and our measurement model. Denote the signals in the ensemble by $x_j$, $j \in \{1, 2, \ldots, J\}$, and assume that each signal $x_j \in \square^N$. We use $x_j(n)$ to denote sample n in signal j, and we assume that there exists a known sparse basis $\Psi$ for $R^N$ in which the $x_j$ can be sparsely represented. The coefficients of this sparse representation can take arbitrary real values (both positive and negative). Denote by $\Phi_j$ the measurement matrix for signal j; $\Phi_j$ is $M_j \times N$ and, in general, the entries of $\Phi_j$ are different for each j. Thus, $y_j = \Phi_j x_j$ consists of $M_j < N$ incoherent measurements of $x_j$. The measurements at sensor j can be obtained either indirectly by sampling the signal $x_j$ and then computing the matrix-vector product $y_j = \Phi_j x_j$ or directly by special-purpose hardware that computes $y_j$ without first sampling (see D. Takhar, J. N. Laska, M. B. Wakin, M. F. Duarte, D. Baron, K. F. Kelly, and R. G. Baraniuk, "A compressed sensing camera: New theory and an implementation using digital micromirrors," in Proc. Computational Imaging IV at SPIE Electronic Imaging, San Jose, January 2006, for example).

We will emphasize random i.i.d. Gaussian matrices $\Phi_j$ in the following, but other schemes are possible, including random ±1 Bernoulli/Rademacher matrices, and so on.

In previous sections, we discussed signals with intra-signal correlation (within each $x_j$) or signals with inter-signal correlation (between $x_{j_1}$ and $X_{j_2}$). We now present three example models that sport both kinds of correlation simultaneously. Again, these models are example preferred embodiments and a person skilled in the art can easily extend these results.

JSM-1: Sparse Common Component+Innovations

In this model, all signals share a common sparse component while each individual signal contains a sparse innovation component; that is, $$x_j = z_C + z_j, j \in \{1, 2, \ldots, J\}$$

with $$z_C = \Psi \theta_C, \|\theta_C\|_0 = K_C \text{ and } z_j = \Psi \theta_j, \|\theta_j\|_0 = K_j.$$

Thus, the signal $z_C$ is common to all of the $x_j$ and has sparsity $K_C$ in basis $\Psi$. The signals $z_j$ are the unique portions of the $x_j$ and have sparsity $K_j$ in the same basis. Denote by $\Omega_C$ the support set of the nonzero $\theta_C$ values and by $\Omega_j$ the support set of $\theta_j$.

A practical situation well-modeled by JSM-1 is a group of sensors measuring temperatures at a number of outdoor locations throughout the day. The temperature readings $x_j$ have both temporal (intra-signal) and spatial (inter-signal) correlations. Global factors, such as the sun and prevailing winds, could have an effect $z_C$ that is both common to all sensors and structured enough to permit sparse representation. More local factors, such as shade, water, or animals, could contribute localized innovations $z_j$ that are also structured (and hence sparse). A similar scenario could be imagined for a network of sensors recording light intensities, air pressure, or other phenomena. All of these scenarios correspond to measuring properties of physical processes that change smoothly in time and in space and thus are highly correlated. These scenarios are merely examples and a person skilled in the art can easily extend these to additional physical scenarios.

JSM-2: Common Sparse Supports

In this model, all signals are constructed from the same sparse set of basis vectors, but with different coefficients; that is, $$x_j = \Psi \theta_j, j \in \{1, 2, \ldots, J\}, \quad (5)$$

where each $\theta_j$ is nonzero only on the common coefficient set $\Omega \subset \{1, 2, \ldots, N\}$ with $|\Omega|=K$. Hence, all signals have $l_0$ sparsity of K, and all are constructed from the same K basis elements but with arbitrarily different coefficients.

A practical situation well-modeled by JSM-2 is where multiple sensors acquire replicas of the same Fourier-sparse signal but with phase shifts and attenuations caused by signal propagation. In many cases it is critical to recover each one of the sensed signals, such as in many acoustic localization and array processing algorithms. Another useful application for JSM-2 is MIMO communication (see J. Tropp, A. C. Gilbert, and M. J. Strauss, "Simultaneous sparse approximation via greedy pursuit," in IEEE 2005 Int. Conf. Acoustics, Speech, Signal Processing (ICASSP), Philadelphia, March 2005). These applications are merely examples and a person skilled in the art can easily suggest additional applications.

Similar signal models have been considered by different authors in the area of simultaneous sparse approximation (see J. Tropp and A. C. Gilbert, "Signal recovery from partial information via orthogonal matching pursuit," April 2005, Preprint; V. N. Temlyakov, "A remark on simultaneous sparse approximation," East J. Approx., vol. 100, pp. 17-25, 2004 and S. F. Cotter, B. D. Rao, K. Engan, and K. Kreutz-Delgado, "Sparse solutions to linear inverse problems with multiple measurement vectors," IEEE Trans. Signal Processing, vol. 51, pp. 2477-2488, July 2005). In this setting, a collection of sparse signals share the same expansion vectors from a redundant dictionary. The sparse approximation can be recovered via greedy algorithms such as Simultaneous Orthogonal Matching Pursuit (SOMP) or MMV Order Recursive Matching Pursuit (M-ORMP) (see S. F. Cotter, B. D. Rao, K. Engan, and K. Kreutz-Delgado, "Sparse solutions to linear inverse problems with multiple measurement vectors," IEEE Trans. Signal Processing, vol. 51, pp. 2477-2488, July 2005). We use the SOMP algorithm in our setting (see the section on recovery strategies for JSM-2) to recover from incoherent measurements an ensemble of signals sharing a common sparse structure, although other reconstruction algorithms in the same spirit may be possible.

JSM-3: Nonsparse Common Component+Sparse Innovations

This model extends JSM-1 so that the common component need no longer be sparse in any basis; that is, $$x_j = z_C + z_j, \, j \in \{1, 2, \ldots, J\}$$

with $$z_C = \Psi \theta_C \text{ and } z_j = \Omega \theta_j, \, \|\theta_j\|_0 = K_j,$$

but $z_C$ is not necessarily sparse in the basis $\Psi$. We also consider the case where the supports of the innovations are shared for all signals, which extends JSM-2. Note that separate CS reconstruction cannot be applied under JSM-3, since the common component is not sparse.

A practical situation well-modeled by JSM-3 is where several sources are recorded by different sensors together with a background signal that is not sparse in any basis. Consider, for example, an idealized computer vision-based verification system in a device production plant. Cameras acquire snapshots of components in the production line; a computer system then checks for failures in the devices for quality control purposes. While each image could be extremely complicated, the ensemble of images will be highly correlated, since each camera is observing the same device with minor (sparse) variations.

JSM-3 could also be useful in some non-distributed scenarios. For example, it motivates the compression of data such as video, where the innovations or differences between video frames may be sparse, even though a single frame may not be very sparse. In this case, JSM-3 suggests that we encode each video frame independently using CS and then decode all frames of the video sequence jointly. This has the advantage of moving the bulk of the computational complexity to the video decoder. Puri and Ramchandran have proposed a similar scheme based on Wyner-Ziv distributed encoding in their PRISM system (see R. Puri and K. Ramchandran, "PRISM: A new robust video coding architecture based on distributed compression principles," in Proc. 40th Allerton Conf. Communication, Control, and Computing, Monticello, Ill., October 2002). In general, JSM-3 may be invoked for ensembles with significant inter-signal correlations but insignificant intra-signal correlations.

Additional JSM Embodiments

Each of the JSMs proposes a basic framework for joint sparsity among an ensemble of signals. These models are intentionally generic; we have not, for example, mentioned the processes by which the index sets and coefficients are assigned. In subsequent sections, to give ourselves a firm footing for analysis, we will often consider specific stochastic generative models, in which (for example) the nonzero indices are distributed uniformly at random and the nonzero coefficients are drawn from a random Gaussian distribution. While some of our specific analytical results rely on these assumptions, the basic algorithms we propose generalize in additional embodiments to a wide variety of settings that resemble the JSM-1, 2, and 3 models.

Additional embodiments can be presented using additional joint sparsity models beyond the three we have introduced. One immediate extension is a combination of JSM-1 and JSM-2, where the signals share a common set of sparse basis vectors but with different expansion coefficients (as in JSM-2) plus additional innovation components (as in JSM-1). For example, consider a number of sensors acquiring different delayed versions of a signal that has a sparse representation in a multiscale basis such as a wavelet basis. The acquired signals will share the same wavelet coefficient support at coarse scales with different values, while the supports at each sensor will be different for coefficients at finer scales. Thus, the coarse scale coefficients can be modeled as the common support component, and the fine scale coefficients can be modeled as the innovation components.

Further work in this area will yield new joint signal models (using joint sparsity and other notions of joint signal coherence) suitable for other application scenarios. Applications that could benefit include multiple cameras taking digital photos of a common scene from various angles (see R. Wagner, R. G. Baraniuk, and R. D. Nowak, "Distributed image compression for sensor networks using correspondence analysis and super-resolution," in Proc. Int. Conf. Image Proc. (ICIP), September 2003). In such a case the structure of the scene (such as the geometry of the objects, etc.) being imaged will impose a certain coherency among the multiple images. A joint decoder can impose such coherency among the reconstructed images, enforcing, for example, a geometrically plausible scene, in addition to the possible sparsity of each image.

Other more general joint signal structure models may not involve sparsity, following the framework described in the section on the invention summary. In general, when some phenomenon affects multiple signals, it may impose some coherency or correlation among the signals. The DCS approach still applies in these settings—the signals can be measured separately yet reconstructed jointly (or stasistics about the signals could be estimated from the joint set of measurements). If the joint models do not involve sparsity, different recovery/estimation algorithms will be required. Additional models and extensions are discussed in the section on additional Embodiments.

Recovery Strategies for Sparse Common Component+Innovations (JSM-1)

Figure 11:
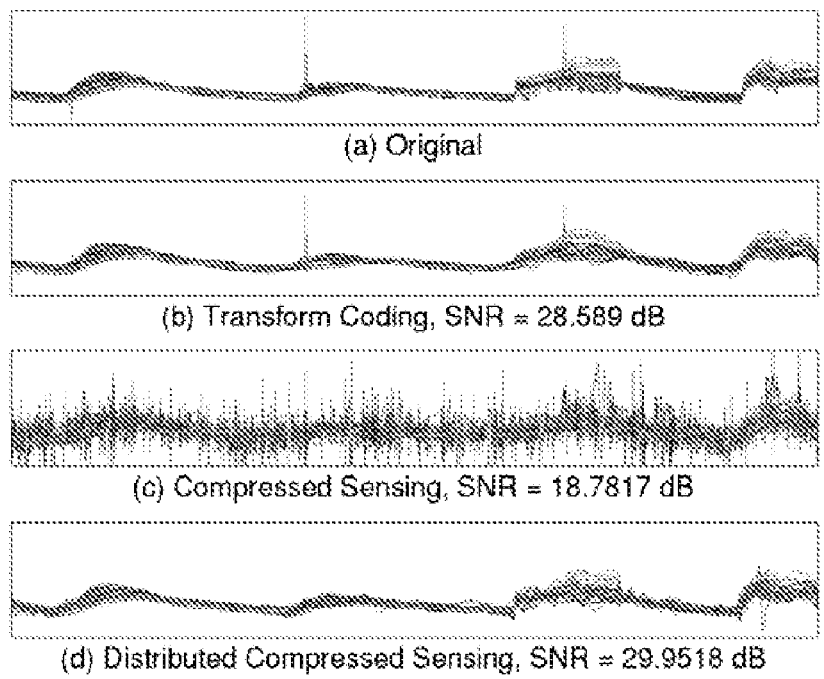
FIG. 11 illustrates reconstruction of temperature signals from 48 sensors with length N=1024 in accordance with a preferred embodiment of the present invention as follows: (a) Original signals; (b) wavelet thresholding using 20 coefficients per sensor, average SNR=28.59 dB; (c) separate reconstruction of each signal using CS from M=80 random projections per sensor, average SNR=18.78 dB; (c) joint reconstruction of the signal ensemble using DCS from M=80 random projections per sensor, average SNR=29.95 dB.

In the section on distributed source coding, there exists an entire region of rate pairs where distributed source coding is feasible (recall FIG. 11). Our goal is to provide a similar characterization for measurement rates in DCS. In this section, we characterize the sparse common signal and innovations model (JSM-1); we study JSMs 2 and 3 in the sections on recovery strategies for JSM-2 and JSM-3, respectively.

Stochastic Signal Model for JSM-1

For our model, we assume without loss of generality that $\Psi = I_N$, where $I_N$ is the N×N identity matrix. If the measurement basis $\Phi$ is i.i.d. random Gaussian, then the matrix $\Phi\Psi$ remains i.i.d. Gaussian no matter what (orthonormal) sparse basis $\Psi$ we choose. Although the extension to arbitrary bases is straightforward, this assumption simplifies the presentation because we have $x_1(n) = z_C(n) + z_1(n) = \theta_C(n) + \theta_1(n)$ and $x_2(n) = z_C(n) + z_2(n) = \theta_C(n) + \theta_2(n)$. We generate the common and innovation components in the following manner. For $n \in \{1, 2, \ldots, N\}$ the decision whether $z_C(n)$ is zero or not is an i.i.d. process, where the probability of a nonzero value is given by a parameter denoted $S_C$. The values of the nonzero coefficients are then generated from an i.i.d. Gaussian distribution. In a similar fashion we pick the $K_j$ indices that correspond to the nonzero indices of $z_j$ independently, where the probability of a nonzero value is given by a parameter $S_j$. The values of the nonzero innovation coefficients are then generated from an i.i.d. Gaussian distribution.

The outcome of this process is that each component $z_j$ has an operational sparsity of $K_j$, where $K_j$ has a Binomial distribution with mean $NS_j$, that is, $K_j\sim\text{Binomial}(N, S_j)$. A similar statement holds for $z_C$, $K_C$, and $S_C$. Thus, the parameters $S_j$ and $S_C$ can be thought of as sparsity rates controlling the random generation of each signal.

Information Theoretic Framework and Notion of Sparsity Rate

In order to glean some theoretic insights, consider the simplest case where a singlejoint encoder processes J=2 signals. By employing the CS machinery, we expect that (i) $(K_C+K_1)c$ measurements suffice to reconstruct $x_1$, (ii) $(K_C+K_2)c$ measurements suffice to reconstruct $x_2$, and (iii) $(K_C+K_1+K_2)c$ measurements suffice to reconstruct both $x_1$ and $x_2$, because we have $K_C+K_1+K_2$ nonzero elements in $x_1$ and $x_2$. With a slight abuse of notation, we denote the oversampling factors for coding $x_1$, $x_2$, or both signals by c. Next, consider the case where the two signals are processed by separate encoders. Given the $(K_C+K_1)c$ measurements for $x_1$ as side information and assuming that the partitioning of $x_1$ into $z_C$ and $z_1$ is known, $cK_2$ measurements that describe $z_2$ allows reconstruction of $x_2$. Similarly, conditioned on $x_2$, we need only $cK_1$ measurements to reconstruct $x_1$.

These observations seem related to various types of entropy from information theory; we thus expand our notions of sparsity to draw such analogies. As a motivating example, suppose that the signals $x_j$, $j\in\{1, 2, \ldots, J\}$ are generated by sources $X_j$, $j\in\{1, 2, \ldots, J\}$ using our stochastic model. As the signal length N is incremented one by one, the sources provide new values for $z_C(N)$ and $z_j(N)$, and the operational sparsity levels increase roughly linearly in the signal length. We thus define the sparsity rate of $X_j$ as the limit of the proportion of coefficients that need to be specified in order to reconstruct the signal $x_j$ given its support set $\Omega_j$; that is, $$S(X_j) \triangleq \lim_{N\to\infty} \frac{K_C + K_j}{N}, \ j \in \{1, 2, \ldots, J\}.$$

We also define the joint sparsity $S(X_{j_1}, X_{j_2})$ of $x_{j_1}$ and $x_{j_2}$ as the proportion of coefficients that need to be specified in order to reconstruct both signals given the support sets $\Omega_{j_1}$, $\Omega_{j_2}$ of both signals. More formally, $$S(X_{j_1}, X_{j_2}) \triangleq \lim_{N\to\infty} \frac{K_C + K_{j_1} + K_{j_2}}{N}, \ j_1, j_2 \in \{1, 2, \ldots, J\}.$$

Finally, the conditional sparsity of $x_{j_1}$ given $x_{j_2}$ is the proportion of coefficients that need to be specified in order to reconstruct $x_{j_1}$, where $x_{j_2}$ and $\Omega_{j_1}$ are available $$S(X_{j_1} \mid X_{j_2}) \triangleq \lim_{N\to\infty} \frac{K_{j_1}}{N}, \ j_1, j_2, \in \{1, 2, \ldots, J\}.$$

The joint and conditional sparsities extend naturally to groups of more than two signals.

Ambiguous Representations for Signal Ensembles

As one might expect, the basic quantities that determine the measurement rates for a JSM-1 ensemble will be the sparsities $K_C$ and $K_j$ of the components $z_C$ and $z_j$, j=1, 2, ..., J. However we must account for an interesting side effect of our generative model. The representation $(z_C, z_1, \ldots, z_J)$ for a given signal ensemble $\{x_j\}$ is not unique; in fact many sets of components $(z_C, z_1, \ldots, z_J)$ (with different sparsities $K_C$ and $K_j$) could give rise to the same signals $\{x_j\}$. We refer to any representation $(\overline{z_C}, \overline{z_1}, \ldots, \overline{z_J})$ for which $x_j=\overline{z_C}+\overline{z_j}$ for all j as a viable representation for the signals $\{x_j\}$. The sparsities of these viable representations will play a significant role in our analysis.

To study JSM-1 viability, we confine our attention to J=2 signals. Consider the n-th coefficient $z_C(n)$ of the common component $z_C$ and the corresponding innovation coefficients $z_1(n)$ and $z_2(n)$. Suppose that these three coefficients are all nonzero. Clearly, the same signals $x_1$ and $x_2$ could have been generated using at most two nonzero values among the three, for example by adding the value $z_C(n)$ to $z_1(n)$ and $z_2(n)$ (and then setting $z_C(n)$ to zero). Indeed, when all three coefficients are nonzero, we can represent them equivalently by any subset of two coefficients. Thus, there exists a sparser representation than we might expect given $K_C$, $K_1$, and $K_2$. We call this process sparsity reduction.

Likelihood of sparsity reduction: Having realized that sparsity reduction is possible, we now characterize when it can happen and how likely it is. Consider the modification of $z_C(n)$ to some fixed $\overline{z_C(n)}$. If $z_1(n)$ and $z_2(n)$ are modified to $$\overline{z_1(n)}=z_1(n)+z_C(n)-\overline{z_C(n)} \text{ and } \overline{z_2(n)}=z_2(n)+z_C(n)-\overline{z_C(n)},$$

then $\overline{z_C(n)}$, $\overline{z_1(n)}$, and $\overline{z_2(n)}$ form a viable representation for $x_1(n)$ and $x_2(n)$. For example, if $z_C(n)$, $z_1(n)$, and $z_2(n)$ are nonzero, then $$\overline{z_C(n)}=0, \overline{z_1(n)}=z_1(n)+z_C(n) \text{ and } \overline{z_2(n)}=z_2(n)+z_C(n)$$

form a viable representation with reduced sparsity. Certainly, if all three original coefficients $z_C(n)$, $z_1(n)$, and $z_2(n)$ are nonzero, then the $l_0$ sparsity of the n-th component can be reduced to two. However, once the sparsity has been reduced to two, it can only be reduced further if multiple original nonzero coefficient values were equal. Since we have assumed independent Gaussian coefficient amplitudes (see the section on the stochastic signal model for JSM-1), further sparsity reduction is possible only with probability zero. Similarly, if two or fewer original coefficients are nonzero, then the probability that the sparsity can be reduced is zero. We conclude that sparsity reduction is possible with positive probability only in the case where three original nonzero coefficients have an equivalent representation using two nonzero coefficients.

Since the locations of the nonzero coefficients are uniform (see the section on the stochastic signal model for JSM-1), the probability that for one index n all three coefficients are nonzero is $$Pr(\text{sparsity reduction}) = \frac{K_C}{N}\frac{K_1}{N}\frac{K_2}{N}. \qquad (6)$$

We denote the number of indices n for which $z_C(n)$, $z_1(n)$, and $z_2(n)$ are all nonzero by $K_{C12}$. Similarly, we denote the number of indices n for which both $z_C(n)$ and $z_1(n)$ are nonzero by $K_{C1}$, and so on. Asymptotically, the probability that all three elements are nonzero is $$S_{C12} \triangleq Pr(\text{sparsity reduction}) = S_C S_1 S_2.$$

Similarly, we denote the probability that both $z_C(n)$ and $z_1(n)$ are nonzero by $S_{C1}=S_C S_1$, and so on.

The previous arguments indicate that with probability one the total number of nonzero coefficients $K_C+K_1+K_2$ can be reduced by $K_{C12}$ but not more. Since N is finite, the expected number of indices n for which further sparsity reduction is possible is zero.

Consider a viable representation with minimal number of nonzero coefficients. We call this a minimal sparsity representation. Let the sparsity of the viable common component $\overline{z}_C$ be $\overline{K}_C$, and similarly let the number of nonzero coefficients of the viable j-th innovation component $\overline{z}_j$ be $\overline{K}_j$. The previous arguments indicate that with probability one a minimal sparsity representation satisfies $$\overline{K}_C + \overline{K}_1 + \overline{K}_2 = K_C + K_1 + K_2 - K_{C12}. \tag{7}$$

One can view ($\overline{K}_C$, $\overline{K}_1$, $\overline{K}_2$) as operational sparsities that represent the sparsest way to express the signals at hand.

Sparsity swapping: When the three signal coefficients $z_C(n)$, $z_1(n)$, $z_2(n)$ are nonzero, an alternative viable representation exists in which any one of them is zeroed out through sparsity reduction. Similarly, if any two of the coefficients are nonzero, then with probability one the corresponding signal values $x_1(n)$ and $x_2(n)$ are nonzero and differ. Again, any two of the three coefficients suffice to represent both values, and we can "zero out" any of the coefficients that are currently nonzero at the expense of the third coefficient, which is currently zero. This sparsity swapping provides numerous equivalent representations for the signals $x_1$ and $x_2$. To characterize sparsity swapping, we denote the number of indices for which at least two original coefficients are nonzero by $$K_\cap = K_{C1} + K_{C2} + K_{12} - 2K_{C12};$$

this definition is easily extendable to J>2 signals. As before, we use the generic notation $\Omega$ to denote the coefficient support set. Since $\Psi = I_N$, the coefficient vectors $\theta_C$, $\theta_1$, and $\theta_2$ correspond to the signal components $z_C$, $z_1$, and $z_2$, which have support sets $\Omega_C$, $\Omega_1$, and $\Omega_2$, respectively. In an asymptotic setting, the probability of intersection satisfies $$S_\cap = S_{C1} + S_{C2} + S_{12} - 2S_{C12}. \tag{8}$$

We call $K_\cap$ the intersection sparsity and $S_\cap$ the intersection sparsity rate. In addition to satisfying (7), a minimal sparsity representation must also obey $$\overline{K_\cap} = K_\cap, \tag{9}$$

since for every index n where two or more coefficients intersect, $x_1(n)$ and $x_2(n)$ will differ and be nonzero with probability one, and so will be represented by two nonzero coefficients in any minimal sparsity representation. Furthermore, for any index n where two nonzero coefficients intersect, any of the three coefficients $z_C(n)$, $z_1(n)$, and $z_2(n)$ can be "zeroed out." Therefore, the set of minimal representations lies in a cube with sidelength $K_\cap$.

Clearly, no matter what sparsity reduction and swapping we perform, the potential for reducing $K_C$ is no greater than $K_{C1} + K_{C2} - K_{C12}$. We denote the minimal sparsity that $\overline{z}_C$, $\overline{z}_1$, and $\overline{z}_2$ may obtain by $K'_C$, $K'_1$, and $K'_2$, respectively. We have $$\overline{K}_C \geq K'_C \triangleq K_C - K_{C1} - K_{C2} + K_{C12}, \tag{10a}$$

$$\overline{K}_1 \geq K'_1 \triangleq K_1 - K_{C1} - K_{12} + K_{C12}, \tag{10b}$$

$$\overline{K}_2 \geq K'_2 \triangleq K_2 - K_{C2} - K_{12} + K_{C12}. \tag{10c}$$

Therefore, the minimal sparsity representations lie in the cube $[K'_C, K'_C + K_\cap] \times [K'_1, K'_1 + K_\cap] \times [K'_2, K'_2 + K_\cap]$. We now summarize the discussion with a result on sparsity levels of minimal sparsity representations.

Lemma 1 With probability one, the sparsity levels $\overline{K}_\cap$, $\overline{K}_1$, and $\overline{K}_2$ of a minimal sparsity representation satisfy $$K'_C \leq \overline{K}_C \leq K'_C + K_\cap, \tag{11a}$$

$$K'_1 \leq \overline{K}_1 \leq K'_1 + K_\cap, \tag{11b}$$

$$K'_2 \leq \overline{K}_2 \leq K'_2 + K_\cap, \tag{11c}$$

$$\overline{K}_C + \overline{K}_1 + \overline{K}_2 = K'_C + K'_1 + K'_2 + 2K_\cap. \tag{11d}$$

Remark 2 Equation (11d) is obtained by combining (7) with the useful identity $$K_C + K_1 + K_2 - K_{C12} = K'_C + K'_1 + K'_2 + 2K_\cap.$$

Combining these observations, among minimal sparsity representations, the values ($K_C$, $K_1$, $K_2$) lie on the intersection of a plane (7) with a cube. This intersection forms a triangle.

$\epsilon$-point: Among all minimal sparsity representations ($z_C$, $z_1$, $z_2$) there is one of particular interest because it determines the minimal measurement rates necessary to recover the signal ensemble $\{x_j\}$. The fact is that one cannot exploit any minimal sparsity representation for reconstruction. Consider, for example, the situation where the supports of $z_C$, $z_1$, and $z_2$ are identical. Using sparsity swapping and reduction, one might conclude that a representation where $\overline{z}_C = z_2$, $\overline{z}_1 = z_1 - z_2$, and $\overline{z}_2 = 0$ could be used to reconstruct the signal, in which case there is no apparent need to measure $x_2$ at all. Of course, since $x_1$ and $x_2$ differ and are both nonzero, it seems implausible that one could reconstruct $x_2$ without measuring it at all.

Theorems 3 and 4 suggest that the representation of particular interest is the one that places as few entries in the common component $z_C$ as possible. There is a unique minimal sparsity representation that satisfies this condition. We call this representation the $\epsilon$-point (for reasons that will be more clear later), and we denote its components by $z_C^\epsilon$, $z_1^\epsilon$, and $z_2^\epsilon$. The sparsities of these components satisfy $$K^\epsilon_C = K'_C, \tag{12a}$$

$$K^\epsilon_1 = K'_1 + K_\cap, \tag{12b}$$

$$K^\epsilon_2 = K'_2 + K_\cap. \tag{12c}$$

We also define the sparsity rates $S_C^\epsilon$, $S_1^\epsilon$, and $S_2^\epsilon$ in an analogous manner.

Measurement Rate Region

To characterize DCS performance, we introduce a measurement rate region. Let $M_1$ and $M_2$ be the number of measurements taken of $x_1$ and $x_2$, respectively. We define the measurement rates $R_1$ and $R_2$ in an asymptotic manner as $$R_1 \triangleq \lim_{N \to \infty} \frac{M_1}{N} \text{ and } R_2 \triangleq \lim_{N \to \infty} \frac{M_2}{N}.$$

For a measurement rate pair ($R_1$, $R_2$) and sources $X_1$ and $X_2$, we wish to see whether we can reconstruct the signals with vanishing probability as N increases. In this case, we say that the measurement rate pair is achievable.

For signals that are jointly sparse under JSM-1, the individual sparsity rate of signal $x_j$ is $S(X_j) = S_C + S_j - S_C S_j$. Separate recovery via $l_0$ minimization would require a measurement rate $R_j = S(X_j)$. Separate recovery via $l_1$ minimization would require an oversampling factor $c(S(X_j))$, and thus the measurement rate would become $S(X_j) \cdot C(S(X_j))$. To improve upon these figures, we adapt the standard machinery of CS to the joint recovery problem.

Joint Recovery Via $l_0$ Minimization

In this section, we begin to characterize the theoretical measurement rates required for joint reconstruction. We provide a lower bound for all joint reconstruction techniques, and we propose a reconstruction scheme based on $l_0$ minimization that approaches this bound but has high complexity. In the section on joint recovery via $l_0$ minimization we pursue more efficient approaches.

Lower Bound

For simplicity but without loss of generality we again consider the case of J=2 received signals and sparsity basis $\Psi=I_N$. We can formulate the recovery problem using matrices and vectors as $$z = \begin{bmatrix} z_C \\ z_1 \\ z_2 \end{bmatrix}, x = \begin{bmatrix} x_1 \\ x_2 \end{bmatrix}, y = \begin{bmatrix} y_1 \\ y_2 \end{bmatrix}, \Phi = \begin{bmatrix} \Phi_1 & 0 \\ 0 & \Phi_2 \end{bmatrix}. \tag{13}$$

Since $\Psi=I_N$, we can define $$\tilde{\Psi} = \begin{bmatrix} \Psi & \Psi & 0 \\ \Psi & 0 & \Psi \end{bmatrix} \tag{14}$$

and write $x=\tilde{\Psi}z$. We measure the sparsity of a representation $z$ by its total $l_0$ sparsity $$\|z\|_0 = \|z_C\|_0 + \|z_1\|_0 + \|z_2\|_0.$$

We assume that any two representations $z$ and $\hat{z}$ for which $y=\Phi\tilde{\Psi}z=\Phi\Psi\hat{z}$ and $\|z\|_0=\|\hat{z}\|_0$ are indistinguishable to any recovery algorithm.

The following theorem incorporates the lower bound of Theorem 2 for single signal CS into every measurement component of the representation region described in Lemma 1.

Theorem 3 (see D. Baron, M. B. Wakin, M. F. Duarte, S. Sarvotham and R. G. Baraniuk, "Distributed Compressed Sensing", 2005, preprint.) Assume the measurement matrices $\Phi_j$ contain i.i.d. Gaussian entries. The following conditions are necessary to enable recovery of all signals in the ensemble $\{x_j\}$:

$$M_j \geq K'_j + K_\cap + 1, j=1, 2, \ldots, J, \tag{15a}$$

$$\Sigma_j M_j \geq K'_C + \Sigma_j K'_j + J \cdot K_\cap + 1. \tag{15b}$$

The measurement rates required in Theorem 3 are somewhat similar to those in the Slepian-Wolf theorem (see D. Slepian and J. K. Wolf, "Noiseless coding of correlated information sources," IEEE Trans. Inf. Theory, vol. 19, pp. 471-480, July 1973), where each signal must be encoded above its conditional entropy rate, and the entire collection must be coded above the joint entropy rate. In particular, we see that the measurement rate bounds reflect the sparsities of the $\epsilon$-point defined in (12a)-(12c). We note also that this theorem is easily generalized beyond the stochastic model of the section on the stochastic signal model for JSM-1 to other JSM-1 scenarios.

Constructive Algorithm

We now demonstrate an achievable result, tight with the converse bounds, by considering a specific algorithm for signal recovery. As suggested by Theorem 1, to approach the theoretical bounds we must employ $l_0$ minimization. We solve $$z = \arg\min \|z_C\|_0 + \|z_1\|_0 + \|z_2\|_0 \text{ s.t. } y=\Phi\tilde{\Psi}z. \tag{16}$$

The flowchart in FIG. 19 extends to this algorithm, where a suite of measurements may be used in a reconstruction algorithm, where the set of measurements 410 is input to the algorithm along with possible side information 420 detailing the various signal sparsities. These sparsities are then enumerated 430 among the possible sparse supports and tested for candidate reconstruction 440 using linear algebra. The process is then repeated 450 for each possible set of sparse supports, among which the sparsest viable solution is chosen 460 for the reconstructed set of signals 470.

Theorem 4 (see D. Baron, M. B. Wakin, M. F. Duarte, S. Sarvotham and R. G. Baraniuk, "Distributed Compressed Sensing", 2005, preprint.) Assume the measurement matrices $\Phi_j$ contain i.i.d. Gaussian entries. Then the $l_0$ optimization program (1) recovers all signals in the ensemble $\{x_j\}$ almost surely if the following conditions hold:

$$M_j \geq K'_j + K_\cap + 1, j=1, 2, \ldots, J, \tag{17a}$$

$$\Sigma_j M_j \geq K'_C + \Sigma_j K'_j + J \cdot K_\cap + 1. \tag{17b}$$

As before, one measurement separates the achievable region of Theorem 4 where perfect reconstruction is possible with probability one, from the converse region of Theorem 3. These results again provide a strong converse measurement rate region in a manner analogous to the results by Wolfowitz (see J. Wolfowitz, Coding Theorems of Information Theory, Springer-Verlag, Berlin, 1978). Our joint recovery scheme provides a significant savings in measurements, because the common component can be measured as part of all J signals.

We note that when it succeeds, the $l_0$ optimization program (16) could recover any of the minimal sparsity representations (each has the same sparsity $\|z\|_0$ and each provides a valid reconstruction of x). If one were so inclined, this program could be modified to provide a unique solution (the $\epsilon$-point) by replacing the optimization program (16) with $$z = \arg\min(1+\epsilon)\|z_C\|_0 + \|z_1\|_0 + \|z_2\|_0 \text{ s.t. } y=\Phi\tilde{\Psi}z, \tag{18}$$

for small $\epsilon>0$. This slight $\epsilon$-modification to a minimization problem of the form $\arg\min\|z\|_0$ (16) prioritizes the innovations components in cases where sparsity swapping is possible. It is from this formulation that the $\epsilon$-point draws its name.

Despite the elegance of Theorem 4, it is of limited utility, since in practice we do not know how much sparsity reduction and swapping can be performed. However, if we fix the common sparsity rate $S_C$ and innovation sparsity rates $S_1, S_2, \ldots, S_J$ and increase N, then $$\lim_{N\to\infty} \frac{K_{C12}}{N} = S_{C12}.$$

Using (7), the minimal sparsity representation satisfies $$\lim_{N\to\infty} \frac{K + \sum_j K_j}{N} = S_C + \sum_j S_j - S_{C12} \tag{19}$$

$$= S'_C + \sum_j S'_j + J \cdot S_C,$$

and the sparsity rates of the $\epsilon$-point satisfy $$S_C^\epsilon \triangleq \lim_{N\to\infty} \frac{K_C^\epsilon}{N} = S'_C,$$

$$S_j^\epsilon \triangleq \lim_{N\to\infty} \frac{K_j^\epsilon}{N} = S'_j + S_C,$$

where the minimal sparsity rates $S'_C$, $S'_1$, and $S'_2$ are derived form (10a)-(10c):

$$S'_C = S_C - S_{C1} - S_{C2} + S_{C12} \quad (20a)$$

$$S'_1 = S_1 - S_{C1} - S_{12} + S_{C12} \quad (20b)$$

$$S'_2 = S_2 - S_{C2} - S_{12} + S_{C12} \quad (20c)$$

We incorporate these results to characterize the measurement rate region in the following corollary.

Corollary 1 Assume the measurement matrices $\Phi_j$ contain i.i.d. Gaussian entries. Then as N increases, the $l_0$ optimization program (16) recovers all signals in the ensemble $\{x_j\}$ almost surely if the following conditions hold:

$$R_j > S'_j + S_C, \quad j = 1, 2, \ldots, J,$$

$$\sum_j R_j > S'_C + \sum_j S'_j + J \cdot S_C.$$

Joint Recovery Via $l_1$ Minimization

We again confine our attention to J=2 signals with $\Psi = I_N$. We also assume that the innovation sparsity rates are equal and dub them $S_1 = S(Z_1) = S(Z_2)$.

As an example, FIG. 19 is a flow chart for reconstruction with side measurements in accordance with a preferred embodiment of the invention. The central processor processes incoming measurements from a sensor 410 using side information 420. For each possible subset 430, the central processor subtracts the implied measurements from the actual measurements, and attempts to reconstruct the measurement remainder with a reconstruction algorithm 440. This process continues at step 450 until no additional subsets are available. At that step 460, the sparsest solution among all possible subsets is chosen and the exact reconstruction 470 is produced.

Formulation

In regular (non-distributed) CS (the section on compressed sensing), $l_1$ minimization, as a relaxation of the $l^0$ minimization problem, can be implemented via linear programming but requires an oversampling factor of c(S) (Theorem 2). In contrast, $l_0$ reconstruction only requires one measurement above the sparsity level K, both for regular and distributed compressed sensing (Theorems 1, 3, and 4). We now wish to understand what penalty must be paid for $l_1$ reconstruction of jointly sparse signals.

Using the frame $\Psi$, as shown in (14), we can represent the data vector x sparsely using the coefficient vector z, which contains $K_C + K_1 + K_2$ nonzero coefficients, to obtain $x = \Psi z$. The concatenated measurement vector y is computed from separate measurements of the signals $x_j$, where the joint measurement basis is $\Phi$ and the joint holographic basis is then $V = \Phi\Psi$. With sufficient oversampling, we can recover a vector z, which is a viable representation for x, by solving the linear program $$z = \arg\min\|z\|_1 \text{ s.t. } y = \Phi\Psi z. \quad (21)$$

The vector z enables the reconstruction of the original signals $x_1$ and $x_2$.

We find it helpful to modify the Basis Pursuit algorithm to account for the special structure of JSM-1 recovery. In the linear program (21), we replace the $l_1$ performance metric $$\|z\|_1 = \|z_C\|_1 + \|z_1\|_1 + \|z_2\|_1$$

with the modified $l_1$ metric $$\gamma_C \|z_C\|_1 + \gamma_1 \|z_1\|_1 + \gamma_2 \|z_2\|_1, \quad (22)$$

where $\gamma_C, \gamma_1, \gamma_2 \geq 0$. We call this the $\gamma$-weighted $l_1$ formulation. If $K_1 = K_2$ and $M_1 = M_2$, then we set $\gamma_1 = \gamma_2$. In this scenario, without loss of generality, we set $\gamma_1 = \gamma_2 = 1$ and optimize $\gamma_C$. We discuss the asymmetric case with $K_1 \neq K_2$ and $M_1 \neq M_2$ below in the section on optimal $\gamma$ values.

Figure 20:
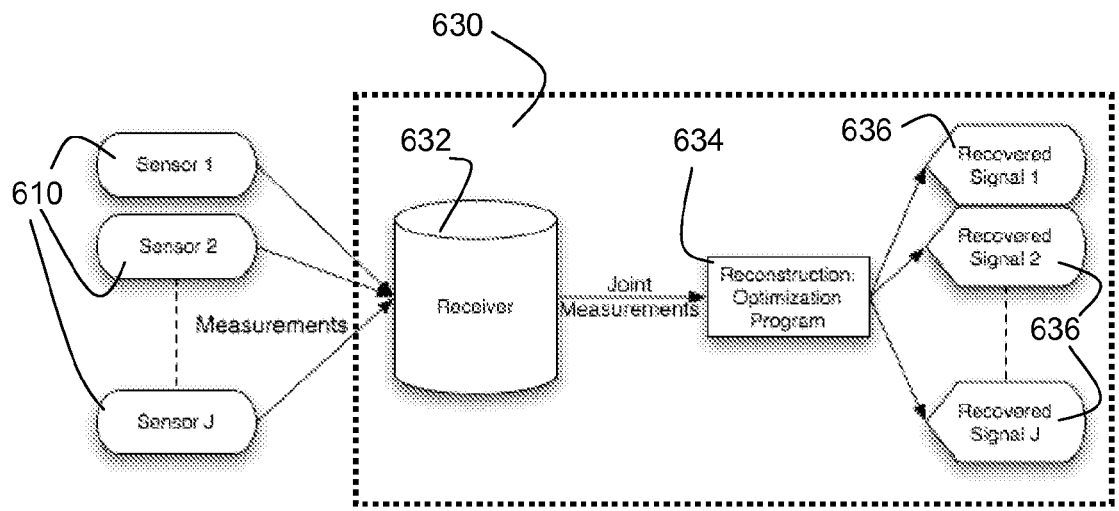
FIG. 20 is a flow chart illustrating Basis Pursuit and other optimization-based methods in accordance with a preferred embodiment of the present invention.

FIG. 20 is a flowchart for basis pursuit in accordance with a preferred embodiment of the invention. The T sensors 610 transmit their measurements 620 to a receiver 632 at the central processor 630, which reconstructs the signals jointly using a linear program 634 or a similar approach intended to minimize an $\bar{l}$-like joint sparsity measure. The solution of the linear program is then partitioned into T reconstructed components 636.

Converse Bounds on Performance of $\gamma$-weighted $l_1$ Signal Recovery

We now provide several converse bounds that describe what measurement rate pairs cannot be achieved via $l_1$ recovery. Before proceeding, we shed some light on the notion of a converse region in this computational scenario. We focus on the setup where each signal $x_j$ is measured via multiplication by the $M_j$ by N matrix $\Phi_j$ and joint reconstruction of the J signals is performed via our $\gamma$-weighted $l_1$ formulation (22). Within this setup, a converse region is a set of measurement rates for which the reconstruction techniques fail with overwhelming probability as N increases.

We now present our bounds, assuming J=2 sources with innovation sparsity rates satisfying $S_1 = S_2 = S_I$. For brevity we define the measurement function $$c'(S) = S \cdot c(S)$$

based on Donoho and Tanner's oversampling factor c (see E. Candès and T. Tao, "Error correction via linear programming," Found. of Comp. Math., 2005, Submitted; D. Donoho and J. Tanner, "Neighborliness of randomly projected simplices in high dimensions," March 2005, Preprint and D. Donoho, "High-dimensional centrally symmetric polytopes with neighborliness proportional to dimension," January 2005, Preprint).

Theorem 5 (see D. Baron, M. B. Wakin, M. F. Duarte, S. Sarvotham and R. G. Baraniuk, "Distributed Compressed Sensing", 2005, preprint.) Let J=2 and fix the sparsity rate of the common part to $S(Z_C) = S_C$ and the innovation sparsity rates to $S(Z_1) = S(Z_2) = S_I$. Then the following conditions on the measurement rates are necessary to enable reconstruction using the $\gamma$-weighted $l_1$ formulation (22) with vanishing probability of error:

$$R_1 \geq c'(S'_I),$$

$$R_2 \geq c'(S'_I),$$

$$R_1 + R_2 \geq c'(S'_C).$$

The theorem provides a converse region such that, if $(R_1, R_2)$ violate these conditions and we perform $M_1 = \lceil (R_1 - \epsilon)N \rceil$ measurements for $x_1$ or $M_2[(R_2-\epsilon)N]$ measurements for $x_2$, then the probability of incorrect reconstruction will converge to one as N increases.

Optimal γ Values

In our $l_1$ reconstruction (22), the optimal choice of $\gamma_C$, $\gamma_1$, and $\gamma_2$ depends on the relative sparsities $K_C$, $K_1$, and $K_2$. At this stage we have not been able to determine the optimal values analytically. Instead, we rely on a numerical optimization, which is computationally intense. In this section we offer our intuition behind the choice of the optimal γ (confirmed with numerical examples).

When the number of signals J is small and the measurement matrices $\Phi_j$ are different, and in any case when $$\sum_j M_j < N,$$

it is possible to construct a common signal $z_C$ that explains all the measurements without the need for any innovation signals. (This is accomplished by concatenating all the measurements and using a pseudoinverse.) However, such a $z_C$ will presumably not be sparse. Therefore, when using different $\Phi_j$ matrices and jointly reconstructing, it may be important to penalize the sparsity of $z_C$, and the tradeoff is biased in favor of larger $\gamma_C$. This is especially important when $$\sum_j K_j \gg K_C.$$

An entirely different behavior occurs if identical measurement matrices $\Phi_j$ are used. In this case, we cannot "hide" all the measurements in $z_C$, and so it may be less important to penalize the sparsity of $z_C$ via $\gamma_C$, and the bias to increase $\gamma_C$ is reduced. However, in the setup where we try to recover $(z_C, z_1, \ldots, z_J)$ jointly, the measurement matrix Φ has worse incoherency with the sparsity matrix $\tilde{\Psi}$ when all $\Phi_j$ are the same. The biggest problem comes in the first N columns of $\tilde{\Psi}$—those that are measuring $z_C$. Hence the incoherency is most challenging when $$K_C \gg \sum_j K_j.$$

When J is large, we have abundant information for recovering the common component. Using identical $\Phi_j$ matrices, we can average our (many) observations to obtain a good approximation of $\Phi z_C$ from which we can recover $z_C$ via single-signal CS. Using different $\Phi_j$, we could use a pseudoinverse to recover $z_C$, completely ignoring the fact that it may be sparse (a similar procedure is applied to recover $z_C$ in JSM-3; see the section on recovery strategies for JSM-3). Both methods may provide somewhat noisy reconstructions, but that noise decreases as J becomes larger. In any case, as J increases the bias is to increase $\gamma_C$, since the abundant information to reconstruct the common component must be offset by a penalty that increases the $l_1$ term.

Figure 2:
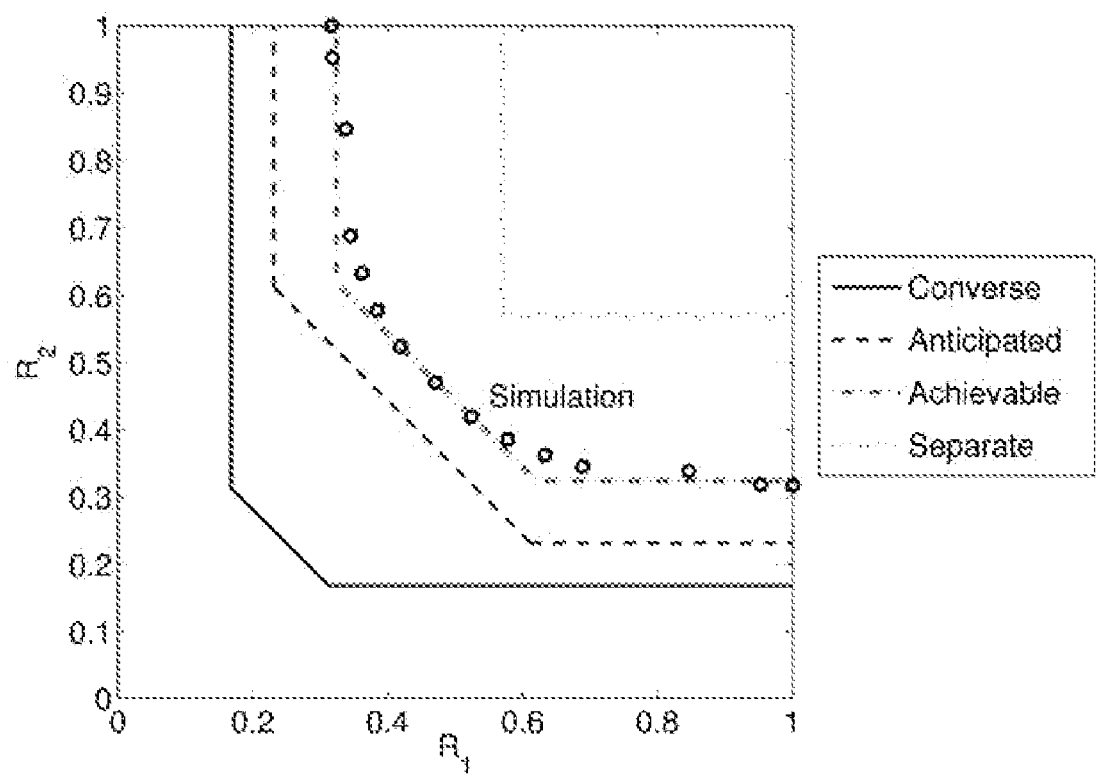
FIG. 2 is a chart illustrating a rate region for Joint Sparsity Model 1 in accordance with a preferred embodiment of the present invention. We chose a common sparsity rate $S_C=0.2$ and innovation sparsity rates $S_I=S_1=S_2=0.05$. Our example results use the g-weighted $l_1$-formulation on signals of length $N=1000$.

Finally, $\gamma_C$ must be modified when asymmetric measurement rates are used. Consider as a simple example the case where J=2 and $K_1=K_2$. Suppose also that we use the convention where a single $\gamma_C$ is used for the common component (instead of weighting $z_1$ and $z_2$ differently in the reconstruction), and $M_1+M_2=M$ is fixed. If $M_1$ is increased, then fewer measurements are available to reconstruct $z_2$; hence $\gamma_C$ must be increased. Unfortunately, this causes a degradation in performance, as illustrated in FIG. 2, where M must be increased to provide the same probability of correct reconstruction. We also evaluated the case where $z_1$ and $z_2$ are weighted differently by choosing $\gamma_C=1$ and optimizing $\gamma_1$ and $\gamma_2$ numerically. Our preliminary results indicate an insignificant performance enhancement.

Achievable Bounds on Performance of $l_1$ Signal Recovery

Now that we have ruled out part of the measurement region, we wish to specify regions where joint reconstruction can succeed. Unfortunately, we have not been able to characterize the performance of our γ-weighted $l_1$ formulation (22) analytically. Instead, Theorem 6 below uses an alternative $l_1$-based reconstruction technique. The proof describes a constructive reconstruction algorithm that is very insightful (see D. Baron, M. B. Wakin, M. F. Duarte, S. Sarvotham and R. G. Baraniuk, "Distributed Compressed Sensing", 2005, preprint.). We construct measurement matrices $\Phi_1$ and $\Phi_2$ which each consist of two parts. The first parts of the matrices are identical and reconstructs $x_1-x_2$. The second parts of the matrices are different and enable the reconstruction of $$\frac{1}{2}x_1 + \frac{1}{2}x_2.$$

Once these two components have been reconstructed, the computation of $x_1$ and $x_2$ is straightforward. The measurement rate can be computed by considering both common and different parts of the measurement matrices.

Theorem 6 (see D. Baron, M. B. Wakin, M. F. Duarte, S. Sarvotham and R. G. Baraniuk, "Distributed Compressed Sensing", 2005, preprint.) Let J=2 and fix the sparsity rate of the common part $S(Z_C)=S_C$ and the innovation sparsity rates $S(Z_1)=S(Z_2)=S_I$. Then there exists an $l_1$ reconstruction technique (along with a measurement strategy) if the measurement rates satisfy the following conditions $$R_1 \geq c'(2S_I-(S_I)^2), \tag{23a}$$

$$R_2 \geq c'(2S_I-(S_I)^2), \tag{23b}$$

$$R_1+R_2 \geq c'(2S_I-(S_I)^2)+c'(S_C+2S_I-2S_CS_I-(S_I)^2+S_C(S_I)^2). \tag{23c}$$

Furthermore, as $S_I \to 0$ the sum measurement rate approaches $c'(S_C)$.

Comparison to γ-weighted $l_1$ formulation (22): The achievable approach of Theorem 6 offers a computational advantage with respect to our γ-weighted $l_1$ formulation (22). In our previous reconstruction approach (22), the linear program must reconstruct the J+1 vectors $z_C, z_1, \ldots, z_J$. Since the complexity of linear programming is roughly cubic, the computational burden scales with $J^3$. In contrast, the achievable approach of Theorem 6 reconstructs J(J−1)/2 pairs of the form $x_{j_1}-x_{j_2}$ and one additional average part, but each such reconstruction is only for a length-N signal. Therefore the computational load is lighter by an O(J) factor. However, our γ-weighted $l_1$ formulation also offers some advantages.

Examples for JSM-1

We now present examples results for several different JSM-1 setups. We used the γ-weighted $l_1$ formulation (22) throughout.

Reconstructing two signals with symmetric measurement rates: Our example setup is as follows. We consider two correlated signals $x_1$ and $x_2$ that satisfy our JSM-1 model. The signal components $z_C$, $z_1$, and $z_2$ are assumed (without loss of generality) to be sparse in $\Psi = I_N$ with sparsities $K_C$, $K_1$, and $K_2$, respectively. We assign random Gaussian values to the nonzero coefficients. We restrict our attention to the symmetric setup in which $K_1 = K_2$ and $M_1 = M_2$, and consider signals of length N=50 and sparsity parameters chosen such that $K_C + K_1 + K_2 = 15$ and $K_1 = K_2$.

Figure 3:
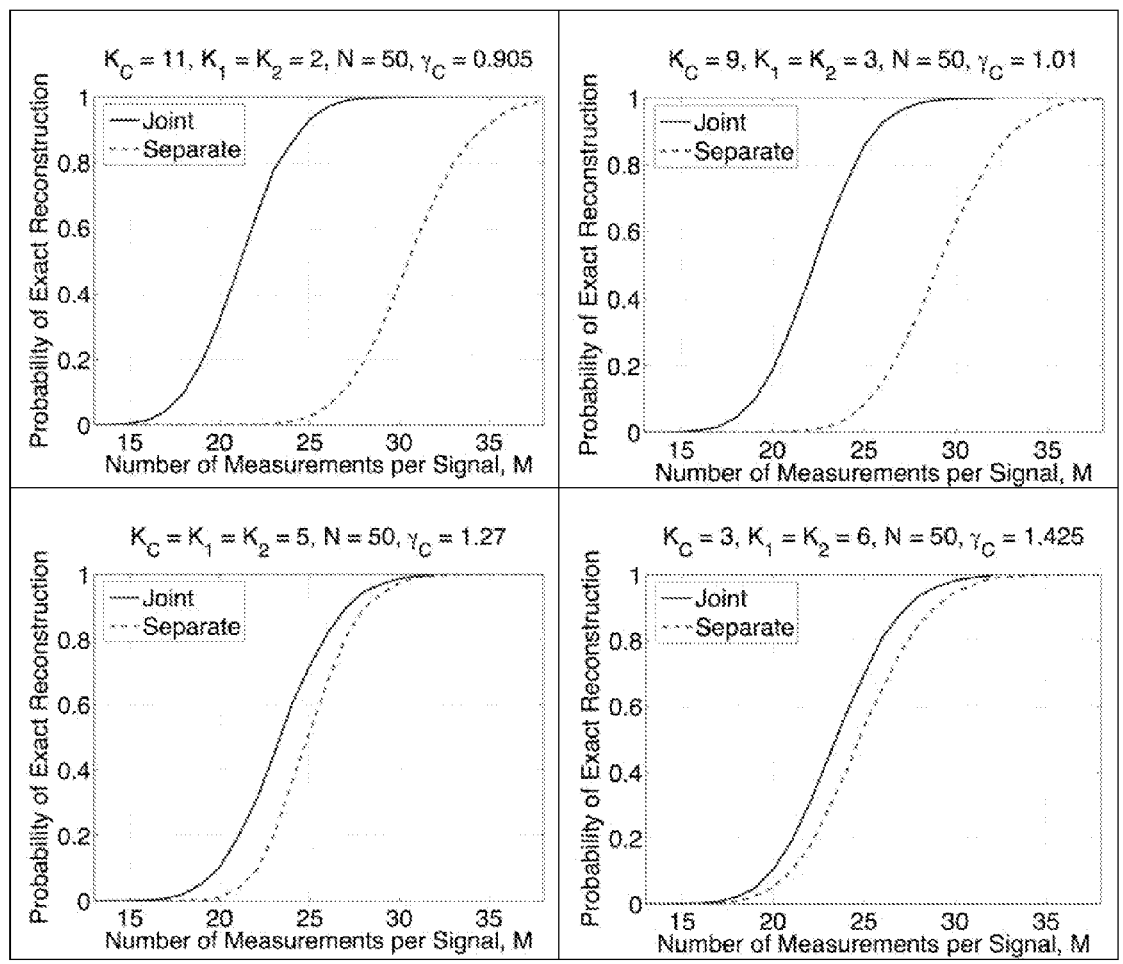
FIG. 3 is a chart comparing joint decoding and separate decoding for JSM-1 in accordance with a preferred embodiment of the present invention. The advantage of joint over separate decoding depends on the common sparsity.

In our joint decoding examples, we consider values of $M_1$ and $M_2$ in the range between 10 and 40. We find the optimal $\gamma_C$ in the γ-weighted $l_1$ formulation (22) using a line search optimization, where the example indicates the "goodness" of specific $\gamma_C$ values in terms of the likelihood of reconstruction. With the optimal $\gamma_C$, for each set of values we run several thousand trials to determine the empirical probability of success in decoding $z_1$ and $z_2$. The results of the example are summarized in FIG. 3. The results reveal that the degree to which joint decoding outperforms separate decoding is directly related to the amount of shared information $K_C$. The savings in the number of required measurements M can be substantial, especially when the common component $K_C$ is large (FIG. 3). For $K_C = 11$, $K_1 = K_2 = 2$, M is reduced by approximately 30%. For smaller $K_C$, joint decoding barely outperforms separate decoding, since most of the measurements are expended on innovation components.

Reconstructing two signals with asymmetric measurement rates: In FIG. 2, we compare separate CS reconstruction with the converse bound of Theorem 5, the anticipated converse bound of Conjecture I, the achievable bound of Theorem 6, and numerical results.

We use J=2 signals and choose a common sparsity rate $S_C = 0.2$ and innovation sparsity rates $S_I = S_1 = S_2 = 0.05$. Several different asymmetric measurement rates are considered. In each such setup, we constrain $M_2$ to have the form $M_2 = \alpha M_1$ for some α. In the example itself, we first find the optimal $\gamma_C$ using a line search optimization as described above. In order to accelerate this intense optimization, we use relatively short signals of length N=40. Once the optimal gammas have been determined, we simulate larger problems of size N=1000. The results plotted indicate the smallest pairs ($M_1$, $M_2$) for which we always succeeded reconstructing the signal over 100 runs. The figure shows that in some areas of the measurement rate region our γ-weighted $l_1$ formulation (22) requires fewer measurements than the achievable approach of Theorem 6.

Reconstructing multiple signals with symmetric measurement rates: The reconstruction techniques of this section are especially promising when more than J=2 sensors are used, since the innovation sparsity rates may become smaller as additional side information from other signals becomes available, thus enabling even greater savings in the measurement rates. These savings may be especially valuable in applications such as sensor networks, where data may contain strong spatial (inter-source) correlations.

Figure 4:
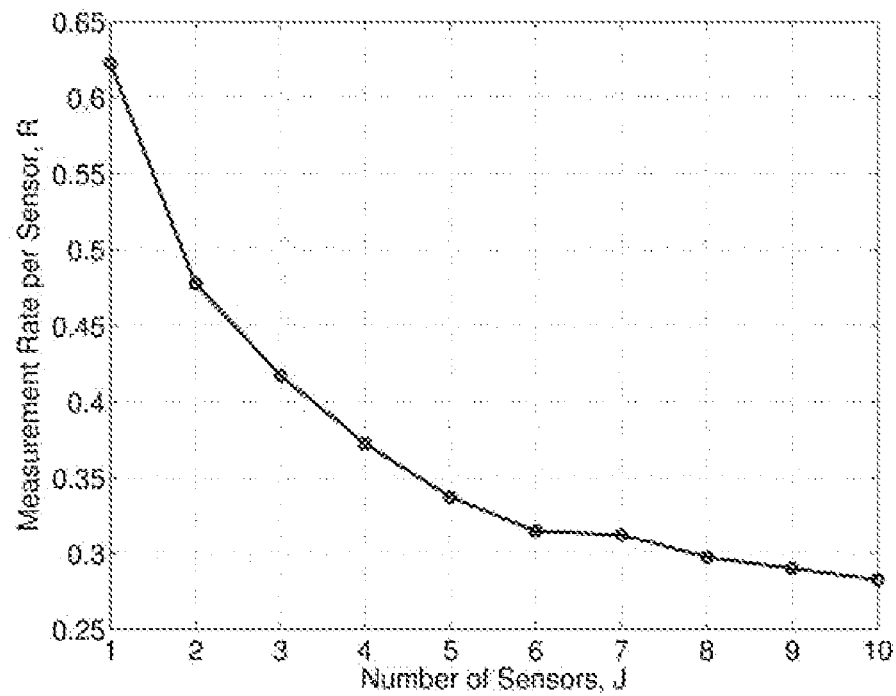
FIG. 4 is a graph illustrating multi-sensor measurement results for JSM-1 in accordance with a preferred embodiment of the present invention. We choose a common sparsity rate $S_C=0.2$, innovation sparsity rates $S_I=0.05$, and signals of length $N=500$.

We use J∈{2, . . . , 10} signals and choose the same sparsity rates $S_C = 0.2$ and $S_I = 0.05$ as the asymmetric rate examples; here we use symmetric measurement rates. We first find the optimal $\gamma_C$ using a line search optimization as described above; during this procedure we use relatively short signals of length N=40 to accelerate the computation. Once the optimal gammas are determined, we simulate larger problems of size N=500. The results of FIG. 4 describe the smallest symmetric measurement rates for which we always succeeded reconstructing the signal over 100 runs. Clearly, as J increases, lower measurement rates can be used.

Recovery Strategies for Common Sparse Supports (JSM-2)

Under the JSM-2 signal ensemble model, separate recovery of each signal via $l_0$ minimization would require K+1 measurements per signal, while separate recovery via $l_1$ minimization would require cK measurements per signal. As we now demonstrate, the total number of measurements can be reduced substantially by employing specially tailored joint reconstruction algorithms that exploit the common structure among the signals, in particular the common coefficient support set Ω.

The algorithms we propose are inspired by conventional greedy pursuit algorithms for CS (such as OMP, see J. Tropp and A. C. Gilbert, "Signal recovery from partial information via orthogonal matching pursuit," April 2005, Preprint). In the single-signal case, OMP iteratively constructs the sparse support set Ω; decisions are based on inner products between the columns of ΦΨ and a residual. In the multi-signal case, there are more clues available for determining the elements of Ω.

Recovery Via Trivial Pursuit

When there are many correlated signals in the ensemble, a simple non-iterative greedy algorithm based on inner products will suffice to recover the signals jointly. For simplicity but without loss of generality, we again assume that $\Psi = I_N$ and that an equal number of measurements $M_j = M$ are taken of each signal. We write $\Phi_j$ in terms of its columns, with $\Phi_j = [\phi_{j,1}, \phi_{j,2}, \ldots, \phi_{j,N}]$.

Trivial Pursuit (TP) Algorithm for JSM-2

1. Get greedy: Given all of the measurements, compute the test statistics $$\xi_n = \frac{1}{J} \sum_{j=1}^{J} \langle y_j, \phi_{j,n} \rangle^2, n \in \{1, 2, \ldots, N\} \quad (24)$$

and estimate the elements of the common coefficient support set by $\tilde{\Omega} = \{n$ having one of the K largest $\xi_n\}$.

When the sparse, nonzero coefficients are sufficiently generic (as defined below), we have the following surprising result.

Theorem 7 (see D. Baron, M. B. Wakin, M. F. Duarte, S. Sarvotham and R. G. Baraniuk, "Distributed Compressed Sensing", 2005, preprint.) Let Ψ be an orthonormal basis for $R^N$, let the measurement matrices $\Phi_j$ contain i.i.d. Gaussian entries, and assume that the nonzero coefficients in the $\theta_j$ are i.i.d. Gaussian random variables. Then with M≧1 measurements per signal, TP recovers Ω with probability approaching one as J→∞.

In words, with fewer than K measurements per sensor, it is possible to recover the sparse support set Ω under the JSM-2 model. One can also show the somewhat stronger result that, as long as $$\sum_j K_j \gg N,$$

TP recovers Ω with probability approaching one. We have omitted this additional result for brevity. Of course, this approach does not recover the K coefficient values for each signal; K measurements per sensor are required for this.

Theorem 8 (see D. Baron, M. B. Wakin, M. F. Duarte, S. Sarvotham and R. G. Baraniuk, "Distributed Compressed Sensing", 2005, preprint.) Assume that the nonzero coefficients in the $\theta_j$ are i.i.d. Gaussian random variables. Then the following statements hold:

1. Let the measurement matrices $\Phi_j$ contain i.i.d. Gaussian entries, with each matrix having an oversampling factor of c=1 (that is, $M_j$=K for each measurement matrix $\Phi_j$). Then TP recovers all signals from the ensemble $\{x_j\}$ with probability approaching one as J→∞.
2. Let $\Phi_j$ be a measurement matrix with oversampling factor c<1 (that is, $M_j$<K), for some j∈{1, 2, . . . , J}. Then with probability one, the signal $x_j$ cannot be uniquely recovered by any algorithm for any value of J.

The first statement is an immediate corollary of Theorem 8; the second statement follows because each equation $y_j = \Phi_j x_j$ would be underdetermined even if the nonzero indices were known. Thus, under the JSM-2 model, the TP algorithm asymptotically performs as well as an oracle decoder that has prior knowledge of the locations of the sparse coefficients. From an information theoretic perspective, Theorem 8 provides tight achievable and converse bounds for JSM-2 signals.

Figure 5:
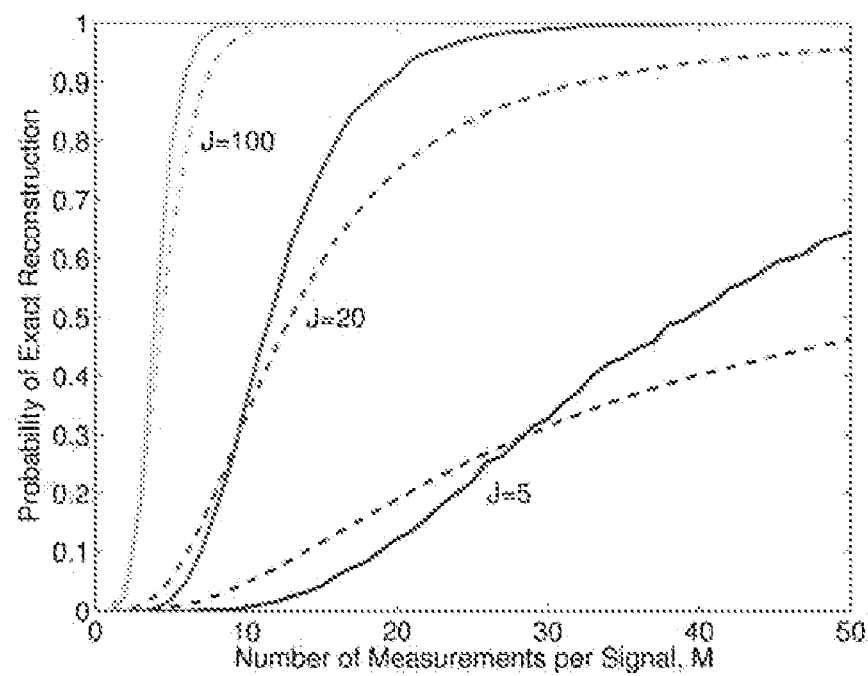
FIG. 5 is a graph illustrating reconstruction using Trivial Pursuit for JSM-2 in accordance with a preferred embodiment of the present invention. Approximate formula (dashed lines) for the probability of error in recovering the support set $\Omega$ in JSM-2 using Trivial Pursuit given J, N, K, and M compared against example results (solid) for fixed $N=50$, $K=5$ and varying number of measurements M and number of signals $J=5$, $J=20$, and $J=100$.

In a technical report (see S. Sarvotham, M. B. Wakin, D. Baron, M. F. Duarte, and R. G. Baraniuk, "Analysis of the DCS one-stage greedy algoritm for common sparse supports," Tech. Rep., Rice University ECE Department, October 2005), we derive an approximate formula for the probability of error in recovering the common support set Ω given J, N, K, and M. FIG. 5 depicts the performance of the formula in comparison to example results. We now describe another algorithm that may offer favorable performance for small J.

Recovery Via Iterative Greedy Pursuit

In practice, the common sparse support among the J signals enables a fast iterative algorithm to recover all of the signals jointly. Tropp and Gilbert have proposed one such algorithm, called Simultaneous Orthogonal Matching Pursuit (SOMP) (see J. Tropp, A. C. Gilbert, and M. J. Strauss, "Simulataneous sparse approximation via greedy pursuit," in IEEE 2005 Int. Conf. Acoustics, Speech, Signal Processing (ICASSP), Philadelphia, March 2005), which can be readily applied in our DCS framework. SOMP is a variant of OMP that seeks to identify Ω one element at a time. (A similar simultaneous sparse approximation algorithm has been proposed using convex optimization; see J. Tropp, "Algorithms for simultaneous sparse approximation. Part II: Convex relaxation," EURASIP J. App. Signal Processing, 2005 for details.) We dub the DCS-tailored SOMP algorithm DCS-SOMP.

To adapt the original SOMP algorithm to our setting, we first extend it to cover a different measurement basis $\Phi_j$ for each signal $x_j$. Then, in each DCS-SOMP iteration, we select the column index n∈{1, 2, . . . , N} that accounts for the greatest amount of residual energy across all signals. As in SOMP, we orthogonalize the remaining columns (in each measurement basis) after each step; after convergence we obtain an expansion of the measurement vector on an orthogonalized subset of the holographic basis vectors. To obtain the expansion coefficients in the sparse basis, we then reverse the orthogonalization process using the QR matrix factorization. We assume without loss of generality that $\Psi = I_N$.

Figure 21:
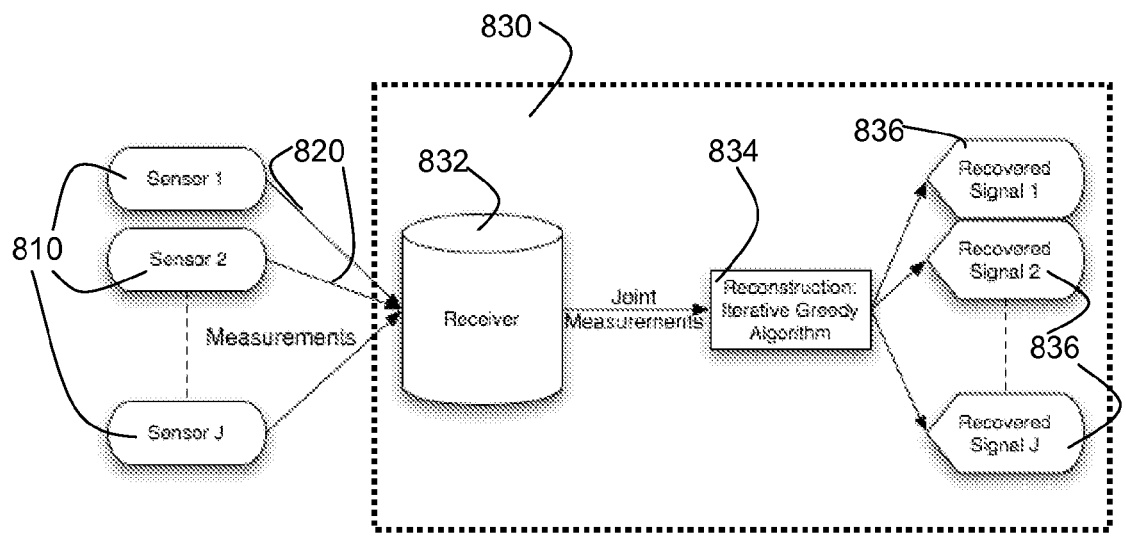
FIG. 21 is a flow chart for a SOMP algorithm and other iterative greedy algorithms in accordance with a preferred embodiment of the present invention.

FIG. 21 is a flowchart for a greedy reconstruction algorithm in accordance with a preferred embodiment of the invention. The T sensors 810 transmit their measurements 820 to the central processor 830 having a receiver 832. The central processor 830 reconstructs the signals using a greedy algorithm 834 reconstructs the signals using a greedy algorithm 834 such as DCS-SOMP, TP, or a similar approach. The solution is partitioned into T reconstructed components 836.

DCS-SOMP Algorithm for JSM-2

1. Initialize: Set the iteration counter l=1. For each signal index j∈{1, 2, . . . , J}, initialize the orthogonalized coefficient vectors $\hat{\beta}_j = 0$, $\hat{\beta}_j \in R^M$; also initialize the set of selected indices $\hat{\Omega} = \emptyset$. Let $r_{j,l}$ denote the residual of the measurement $y_j$ remaining after the first l iterations, and initialize $r_{j,0} = y_j$.

2. Select the dictionary vector that maximizes the value of the sum of the magnitudes of the projections of the residual, and add its index to the set of selected indices $$n_\ell = \arg \max_{n=1,2,\ldots,N} \sum_{j=1}^{J} \frac{|\langle r_{j,\ell-1}, \phi_{j,n} \rangle|}{\|\phi_{j,n}\|_2},$$

$\hat{\Omega} = [\hat{\Omega}\ n_\ell]$.

3. Orthogonalize the selected basis vector against the orthogonalized set of previously selected dictionary vectors $$\gamma_{j,\ell} = \phi_{j,n_\ell} - \sum_{t=0}^{\ell-1} \frac{\langle \phi_{j,n_\ell}, \gamma_{j,t} \rangle}{\|\gamma_{j,t}\|_2^2} \gamma_{j,t}.$$

4. Iterate: Update the estimate of the coefficients for the selected vector and residuals $$\hat{\beta}_j(l) = \frac{\langle r_{j,l-1}, \gamma_{j,l} \rangle}{\|\gamma_{j,l}\|_2^2},$$

$$r_{j,l} = r_{j,l-1} - \frac{\langle \phi_{j,n_\ell}, \gamma_{j,l} \rangle}{\|\gamma_{j,l}\|_2^2} \gamma_{j,l}.$$

5. Check for convergence: If $\|r_{j,l}\|_2 > \epsilon \|y_j\|_2$ for all j, then increment l and go to Step 2; otherwise, continue to Step 6. The parameter ε determines the target error power level allowed for algorithm convergence. Note that due to Step 3 the algorithm can only run for up to M iterations.

6. De-orthogonalize: Consider the relationship between $\Gamma_j = [\gamma_{j,1}, \gamma_{j,2}, \ldots, \gamma_{j,M}]$ and the $\Phi_j$ given by the QR factorization $$\Phi_{j,\hat{\Omega}} = \Gamma_j R_j,$$

where $\Phi_{j,\hat{\Omega}} = [\phi_{j,n_1}, \phi_{j,n_2}, \ldots, \phi_{j,n_M}]$ is the so-called mutilated basis. We define a mutilated basis $\Phi_\Omega$ as a subset of the basis vectors from $\Phi=[\phi_1, \phi_2, \ldots, \phi_N]$ corresponding to the indices given by the set $\Omega=\{n_1, n_2, \ldots, n_M\}$, that is, $\Phi_\Omega=[\phi_{n_1}, \phi_{n_2}, \ldots, \phi_{n_M}]$. This concept can be extended to vectors in the same manner. Since $y_j=\Gamma_j\beta_j=\Phi_{j,\hat{\Omega}}x_{j,\hat{\Omega}}=\Gamma_j R_j x_{j,\hat{\Omega}}$, where $x_{j,\hat{\Omega}}$ is the mutilated coefficient vector, we can compute the signal estimates $\{x_j\}$ as $$\hat{\theta}_{j,\hat{\Omega}} = R_j^{-1}\hat{\beta}_j,$$

$$\hat{x}_j = \Psi\hat{\theta}_j,$$

where $\hat{\theta}_{j,\hat{\Omega}}$ is the mutilated version of the sparse coefficient vector $\hat{\theta}_j$.

In practice, each sensor projects its signal $x_j$ via $\Phi_j x_j$ to produce $\hat{c}K$ measurements for some $\hat{c}$. The decoder then applies DCS-SOMP to reconstruct the J signals jointly. We orthogonalize because as the number of iterations approaches M the norms of the residues of an orthogonal pursuit decrease faster than for a non-orthogonal pursuit.

Thanks to the common sparsity structure among the signals, DCS-SOMP will succeed with $\hat{c}<c(S)$. Empirically, we have observed that a small number of measurements proportional to K suffices for a moderate number of sensors J. We conjecture that K+1 measurements per sensor suffice as $J\to\infty$; numerical experiments are presented in the section on examples for JSM-2. Thus, in practice, this efficient greedy algorithm enables an oversampling factor $\hat{c}=(K+1)/K$ that approaches 1 as J, K, and N increase.

Examples for JSM-2

Figure 6:
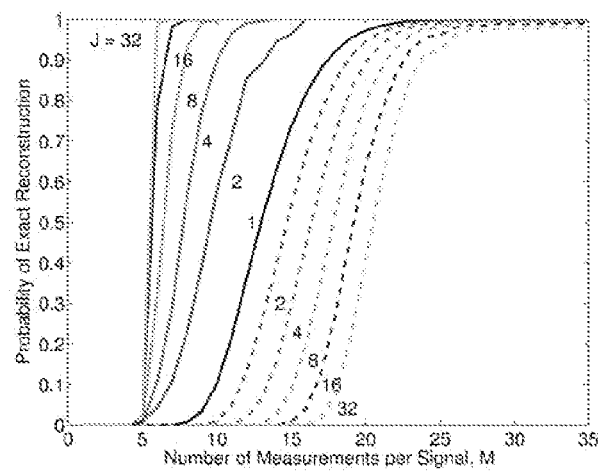
FIG. 6 is a graph illustrating reconstructing a signal ensemble with common sparse supports (JSM-2) in accordance with a preferred embodiment of the present invention. We plot the probability of perfect reconstruction via DCS-SOMP (solid lines) and independent CS reconstruction (dashed lines) as a function of the number of measurements per signal M and the number of signals J. We fix the signal length to $N=50$, the sparsity to $K=5$, and average over 1000 runs. An oracle encoder that knows the positions of the large signal expansion coefficients would use 5 measurements per signal.

We now present an example comparing separate CS reconstruction versus joint DCS-SOMP reconstruction for a JSM-2 signal ensemble. FIG. 6 plots the probability of perfect reconstruction corresponding to various numbers of measurements M as the number of sensors varies from J=1 to 32. We fix the signal lengths at N=50 and the sparsity of each signal to K=5.

With DCS-SOMP, for perfect reconstruction of all signals the average number of measurements per signal decreases as a function of J. The trend suggests that, for very large J, close to K measurements per signal suffice. On the contrary, with separate CS reconstruction, for perfect reconstruction of all signals the number of measurements per sensor increases as a function of J. This surprise is due to the fact that each signal will experience an independent probability $p\leq 1$ of successful reconstruction; therefore the overall probability of complete success is $p^J$. Consequently, each sensor must compensate by making additional measurements. This phenomenon further motivates joint reconstruction under JSM-2.

Finally, we note that we can use algorithms other than DCS-SOMP to recover the signals under the JSM-2 model. Cotter et al. (see S. F. Cotter, B. D. Rao, K. Engan, and K. Kreutz-Delgado, "Sparse solutions to linear inverse problems with multiple measurement vectors," IEEE Trans. Signal Processing, vol. 51, pp. 2477-2488, July 2005) have proposed additional algorithms (such as the M-FOCUSS algorithm, see S. F. Cotter, B. D. Rao, K. Engan, and K. Kreutz-Delgado, "Sparse solutions to linear inverse problems with multiple measurement vectors," IEEE Trans. Signal Processing, vol. 51, pp. 2477-2488, July 2005) that iteratively eliminate basis vectors from the dictionary and converge to the set of sparse basis vectors over which the signals are supported; such algorithms are also appropriate for signals obeying JSM-2 or a similar model. Another approach to recover signals under the JSM-2 model would be to use techniques such as group testing (see D-Z Du and F. K. Hwang, "Combinatorial group testing and its applications", vol 3, series on App. Math., World Scientific for an introduction to group testing. For group testing applied to compressed sensing, see G. Cormode and S. Muthukrishnan, "Towards an algorithmic theory of compressed sensing", DIMACS Technical Report TR 2005-25, 2005; A. C. Gilbert and M. J. Strauss and J. Tropp and R. Vershynin, "Algorithmic linear dimension reduction in the ell_1 norm for sparse vectors", Submitted, April 2006 and S. Sarvotham and D. Baron and R. G. Baraniuk, "Sudocodes: efficient compressive sampling algorithms for sparse signals", To appear in Proc. IEEE Int. Symposium on Inf. Theory, July 2006) to infer the sparse supports for each signal. The key idea is that the confirmation or exclusion of an index from the support of one signal can be extended to all other signals. In this way, the burden of identifying (or encoding) the sparse support is shared amongst the encoders. The decoding process could be performed in two stages. In the first stage, the decoder identifies the sparse support using the shared grouped testing technique described above. In the second stage, the coefficient values can be inferred by matrix inversion of a K×K sub-matrix of $\Phi$ applied to each of the J measurement vectors.

Recovery Strategies for Nonsparse Common Component+Sparse Innovations (JSM-3)

The JSM-3 signal ensemble model provides a particularly compelling motivation for joint recovery. Under this model, no individual signal $x_j$ is sparse, and so recovery of each signal separately would require fully N measurements per signal. As in the other JSMs, however, the commonality among the signals makes it possible to substantially reduce this number.

Recovery Via Transpose Estimation of Common Component (TECC)

Figure 22:
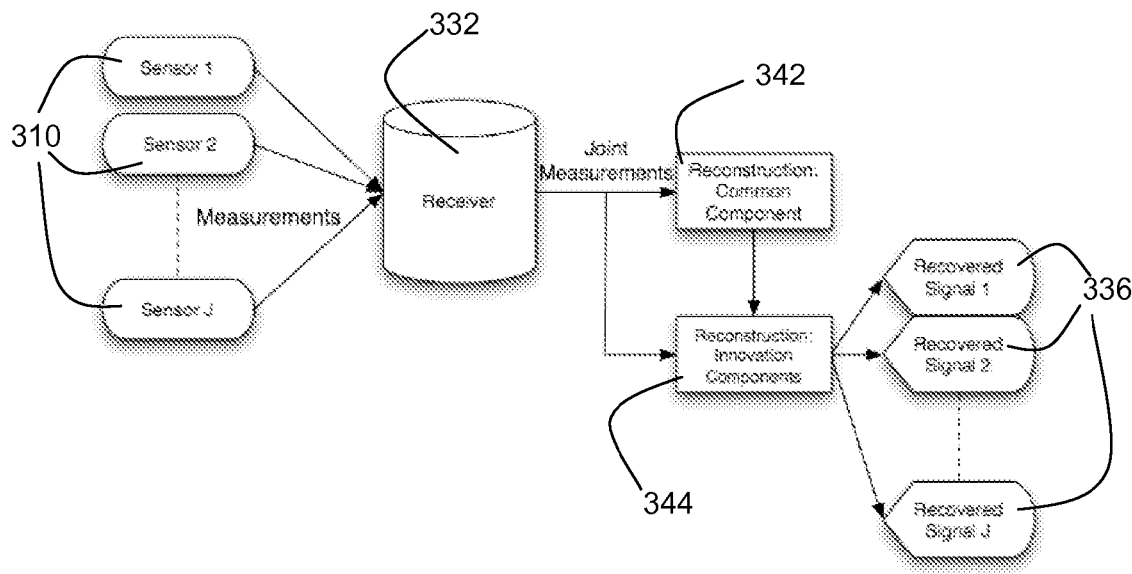
FIG. 22 is a flow chart for a TECC algorithm in accordance with a preferred embodiment of the present invention.

FIG. 22 is a flow chart for a TECC algorithm in accordance with a preferred embodiment of the present invention. The J sensors 310 transmit their measurements to the central processor 332, which reconstructs the common component using a concatenated inverse or transpose matrix; the result is used to estimate the innovations by subtracting the common component 342, 344. The estimates of the common and innovation components are summed to obtain J reconstructed signals 336.

Successful recovery of the signal ensemble $\{x_j\}$ requires recovery of both the nonsparse common component $z_C$ and the sparse innovations $\{z_j\}$. To illustrate the potential for signal recovery using far fewer than N measurements per sensor, consider the following gedankenexperiment. Again, for simplicity but without loss of generality, we assume $\Psi=I_N$.

If $z_C$ were known, then each innovation $z_j$ could be estimated using the standard single-signal CS machinery on the adjusted measurements $$y_j - \Phi_j z_C = \Phi_j z_j.$$

While $z_C$ is not known in advance, it can be estimated from the measurements. In fact, across all J sensors, a total of $$\sum_j M_j$$

random projections of $z_C$ are observed (each corrupted by a contribution from one of the $z_j$). Since $z_C$ is not sparse, it cannot be recovered via CS techniques, but when the number of measurements is sufficiently large $$\left(\sum_j M_j \gg N\right),$$

$z_C$ can be estimated using standard tools from linear algebra. A key requirement for such a method to succeed in recovering $z_C$ is that each $\Phi_j$ be different, so that their rows combine to span all of $R^N$. In the limit (again, assuming the sparse innovation coefficients are well-behaved), the common component $z_C$ can be recovered while still allowing each sensor to operate at the minimum measurement rate dictated by the $\{z_j\}$. One prototype algorithm is listed below, where we assume that each measurement matrix $\Phi_j$ has i.i.d. $N(0, \sigma_j^2)$ entries.

TECC Algorithm for JSM-3

1. Estimate common component: Define the matrix $\hat{\Phi}$ as the concatenation of the regularized individual measurement matrices $$\hat{\Phi}_j = \frac{1}{M_j \sigma_j^2} \Phi_j,$$

that is, $\hat{\Phi} = [\hat{\Phi}_1, \hat{\Phi}_2, \ldots, \hat{\Phi}_J]$. Calculate the estimate of the common component as $$\tilde{z}_C = \frac{1}{J} \hat{\Phi}^T y.$$

2. Estimate measurements generated by innovations: Using the previous estimate, subtract the contribution of the common part on the measurements and generate estimates for the measurements caused by the innovations for each signal:

$$\tilde{y}_j = y_j - \Phi_j \tilde{z}_C.$$

3. Reconstruct innovations: Using a standard single-signal CS reconstruction algorithm, obtain estimates of the innovations $\tilde{z}_j$ from the estimated innovation measurements $\tilde{y}_j$.

4. Obtain signal estimates: Estimate each signal as the sum of the common and innovations estimates; that is, $x_j = z_C + z_j$.

The following theorem shows that asymptotically, by using the TECC algorithm, each sensor need only measure at the rate dictated by the sparsity $K_j$.

Theorem 9 (see D. Baron, M. B. Wakin, M. F. Duarte, S. Sarvotham and R. G. Baraniuk, "Distributed Compressed Sensing", 2005, preprint.) Assume that the nonzero expansion coefficients of the sparse innovations $z_j$ are i.i.d. Gaussian random variables and that their locations are uniformly distributed on $\{1, 2, \ldots, N\}$. Then the following statements hold:

1. Let the measurement matrices $\Phi_j$ contain i.i.d. $N(0, \sigma_j^2)$ entries with $M_j \geq K_j + 1$. Then each signal $x_j$ can be recovered using the TECC algorithm with probability approaching one as $J \to \infty$.
2. Let $\Phi_j$ be a measurement matrix with $M_j \leq K_j$ for some $j \in \{1, 2, \ldots, J\}$. Then with probability one, the signal $x_j$ cannot be uniquely recovered by any algorithm for any value of J.

For large J, the measurement rates permitted by Statement 1 are the lowest possible for any reconstruction strategy on JSM-3 signals, even neglecting the presence of the non-sparse component. Thus, Theorem 9 provides a tight achievable and converse for JSM-3 signals. The CS technique employed in Theorem 9 involves combinatorial searches for estimating the innovation components. More efficient techniques could also be employed (including several proposed for CS in the presence of noise (see J. Haupt and R. Nowak, "Signal reconstruction from noisy random projections," IEEE Trans. Inf. Theory, 2005, Submitted; E. Candès and T. Tao, "The Dantzig selector: Statistical estimation when p is much larger than n," Annals of Statistics, 2005, Submitted; E. Candès, J. Romberg, and T. Tao, "Stable signal recovery from incomplete and inaccurate measurements," Comm. on Pure and Applied Math., 2005, Submitted; D. Donoho and Y. Tsaig, "Extensions of compressed sensing," 2004, Preprint and S. Chen, D. Donoho, and M. Saunders, "Atomic decomposition by basis pursuit," SIAM J. on Sci. Comp., vol. 20, no. 1, pp. 33-61, 1998. It is reasonable to expect similar behavior; as the error in estimating the common component diminishes, these techniques perform similarly to their noiseless analogues (Basis Pursuit, for example; see E. Candès, J. Romberg, and T. Tao, "Stable signal recovery from incomplete and inaccurate measurements," Comm. on Pure and Applied Math., 2005, Submitted and D. Donoho and Y. Tsaig, "Extensions of compressed sensing," 2004, Preprint).

Recovery Via Alternating Common and Innovation Estimation (ACIE)

Figure 23:
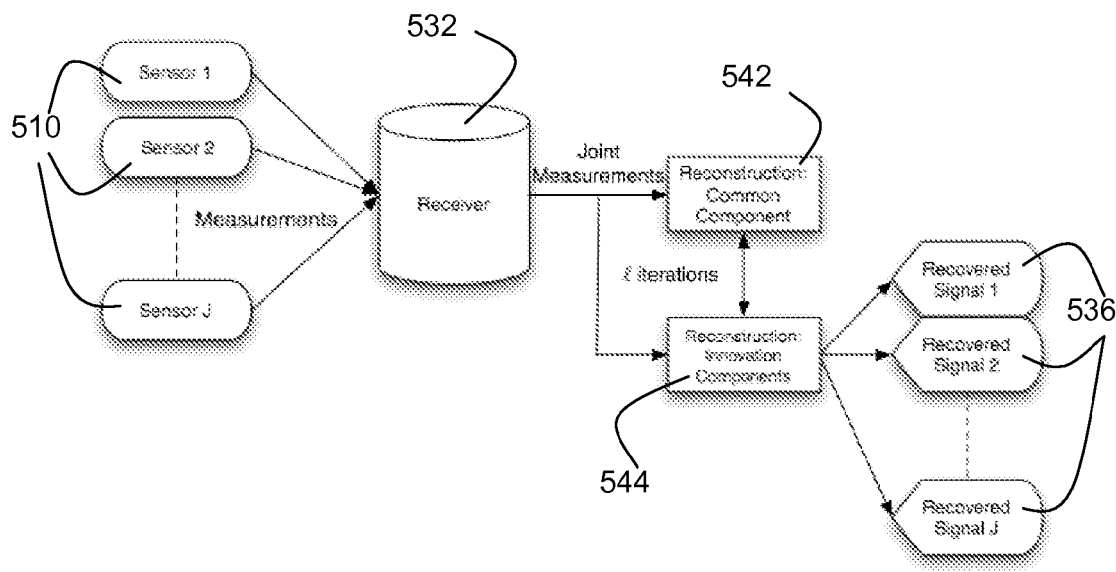
FIG. 23 is a flow chart for an ACIE algorithm in accordance with a preferred embodiment of the present invention.

FIG. 23 is a flow chart for an ACIE algorithm in accordance with a preferred embodiment of the present invention. The J sensors 510 transmit their measurements to the central processor 532, which reconstructs the common component using a concatenated inverse or transpose matrix. This result is used to estimate the innovations by subtracting the common component, which in turn is used to obtain a better estimate of the common component; this process continues iteratively 542, 544. The estimates of the common and innovation components are summed to obtain J reconstructed signals 536.

The preceding analysis demonstrates that the number of required measurements in JSM-3 can be substantially reduced through joint recovery. While Theorem 9 suggests the theoretical gains as $J \to \infty$, practical gains can also be realized with a moderate number of sensors. For example, suppose in the TECC algorithm that the initial estimate $\tilde{z}_C$ is not accurate enough to enable correct identification of the sparse innovation supports $\{\Omega_j\}$. In such a case, it may still be possible for a rough approximation of the innovations $\{z_j\}$ to help refine the estimate $\tilde{z}_C$. This in turn could help to refine the estimates of the innovations. Since each component helps to estimate the other components, we propose here one possible iterative algorithm for JSM-3 recovery.

The Alternating Common and Innovation Estimation (ACIE) algorithm exploits the observation that once the basis vectors comprising the innovation $z_j$ have been identified in the index set $\Omega_j$, their effect on the measurements $y_j$ can be removed to aid in estimating $z_C$. Suppose that we have an estimate for these innovation basis vectors in $\hat{\Omega}_j$. We can then partition the measurements into two parts: the projection into span $(\{\Phi_{j,n}\}_{n \in \hat{\Omega}_j})$ and the component orthogonal to that span. We build a basis for the $R^M$ where $y_j$ lives:

$$B_j[\Phi_{j,\hat{\Omega}_j} Q_j],$$

where $\Phi_{j,\hat{\Omega}_j}$ is the mutilated holographic basis corresponding to the indices in $\hat{\Omega}_j$, and the $M_j \times (M_j - |\hat{\Omega}_j|)$ matrix $Q_j = [q_{j,1} \ldots q_{j,M_j - |\hat{\Omega}_j|}]$ has orthonormal columns that span the orthogonal complement of $\Phi_{j,\hat{\Omega}_j}$.

This construction allows us to remove the projection of the measurements into the aforementioned span to obtain measurements caused exclusively by vectors not in $\hat{\Omega}_j$ $$\tilde{y}_j = Q_j^T y_j, \quad (25)$$

$$\tilde{\Phi}_j = Q_j^T \Phi_j, \quad (26)$$

These modifications enable the sparse decomposition of the measurement, which now lives in $\square^{M_j - |\hat{\Omega}_j|}$, to remain unchanged $$\tilde{y}_j = \sum_{n=1}^{N} \alpha_j \tilde{\phi}_{j,n}.$$

Thus, the modified measurements $\tilde{Y} = [\tilde{y}_1^T \tilde{y}_2^T \ldots \tilde{y}_J^T]^T$ and modified holographic basis $\tilde{\Phi} = [\tilde{\Phi}_1^T \tilde{\Phi}_2^T \ldots \tilde{\Phi}_J^T]^T$ can be used to refine the estimate of the measurements caused by the common part of the signal $$\hat{z}_C = \tilde{\Phi}^\dagger \tilde{Y}, \quad (27)$$

where $A^\dagger = (A^T A)^{-1} A^T$ denotes the pseudoinverse of matrix A.

In the case where the innovation support estimate is correct ($\hat{\Omega}_j = \Omega_j$), the measurements $\tilde{y}_j$ will describe only the common component $z_C$. If this is true for every signal j and the number of remaining measurements $$\sum_j M_j - KJ \geq N,$$

then $z_C$ can be perfectly recovered via (27). However, it may be difficult to obtain correct estimates for all signal supports in the first iteration of the algorithm, and so we find it preferable to refine the estimate of the support by executing several iterations.

ACIE Algorithm for JSM-3

1. Initialize: Set $\hat{\Omega}_j = \emptyset$ for each j. Set the iteration counter l=1.

2. Estimate common component: Update estimate $\hat{z}_C$ according to (25)-(27).

3. Estimate innovation supports: For each sensor j, after subtracting the contribution $\tilde{z}_C$ from the measurements, $\tilde{y}_j = y_j - \Phi_j \tilde{z}_C$, estimate the sparse support of each signal innovation $\hat{\Omega}_j$.

4. Iterate: If l<L, a preset number of iterations, then increment l and return to Step 2. Otherwise proceed to Step 5.

5. Estimate innovation coefficients: For each signal j, estimate the coefficients for the indices in $\hat{\Omega}_j$ $$\hat{\theta}_{j,\hat{\Omega}_j} = \Phi^\dagger_{j,\hat{\Omega}_j}(y_j - \Phi_j \tilde{z}_C),$$

where $\hat{\theta}_{j,\hat{\Omega}_j}$ is a mutilated version of the innovation's sparse coefficient vector estimate $\hat{\theta}_j$.

6. Reconstruct signals: Compute the estimate of each signal as $\hat{x}_j = \tilde{z}_C + \hat{z}_j = \tilde{z}_C + \Phi_j \hat{\theta}_j$.

Estimation of the sparse supports in Step 3 can be accomplished using a variety of techniques. We propose to run L iterations of OMP; if the supports of the innovations are known to match across signals—as in the JSM-2 scenario—then more powerful algorithms like SOMP can be used. As with previous JSMs, many similar algorithms in the same spirit may be proposed, and each may be adapted to any additional nuances present in the model.

Examples for JSM-3

We now present examples of JSM-3 reconstruction in the following scenario. Consider J signals of length N=50 containing a common white noise component $z_C(n) \sim N(0, 1)$ for $n \in \{1, 2, \ldots, N\}$ that, by definition, is not sparse in any fixed basis. Each innovations component $z_j$ has sparsity K=5 (once again in the time domain), resulting in $x_j = z_C + z_j$. The support for each innovations component is randomly selected with uniform probability from all possible supports for K-sparse, length-N signals. We draw the values of the innovation coefficients from a unit-variance Gaussian distribution.

We study two different cases. The first is an extension of JSM-1: we select the supports for the various innovations independently and then apply OMP independently to each signal in Step 3 of the ACIE algorithm in order to estimate its innovations component. The second case is an extension of JSM-2: we select one common support for all of the innovations across the signals and then apply the DCS-SOMP algorithm (see the section on recovery via iterative greedy pursuit) to estimate the innovations in Step 3. In both cases we set L=10. We test the algorithms for different numbers of signals J and calculate the probability of correct reconstruction as a function of the (same) number of measurements per signal M.

Figure 7:
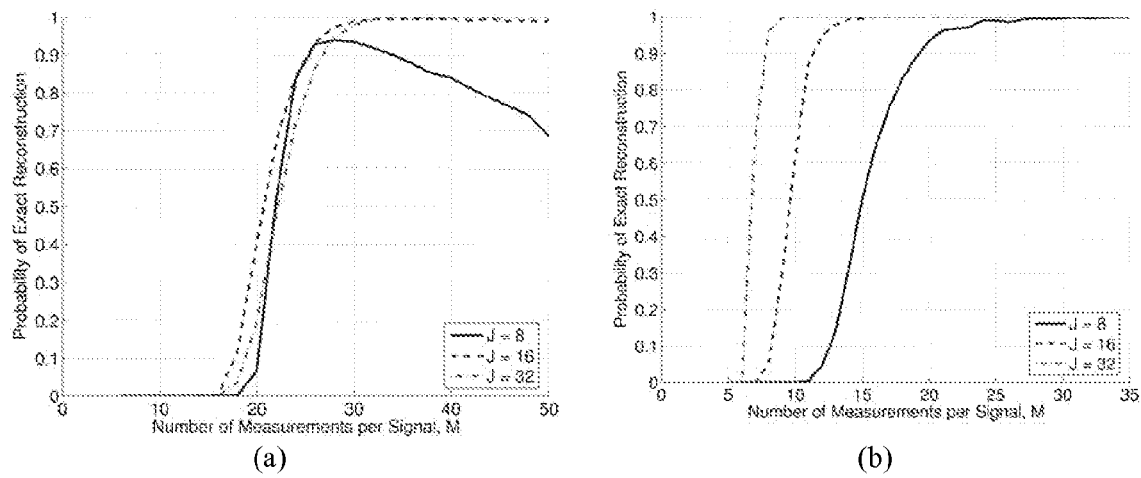
FIGS. 7(a) and (b) are graphs illustrating reconstructing a signal ensemble with nonsparse common component and sparse innovations (JSM-3) using ACIE in accordance with a preferred embodiment of the present invention.
FIG. 7(b) illustrates reconstruction using DCS-SOMP jointly on all signals in Step 3 of the ACIE algorithm (innovations have identical supports). Signal length N=50, sparsity K=5. The common structure exploited by DCS-SOMP enables dramatic savings in the number of measurements. We average over 1000 runs.
Figure 8:
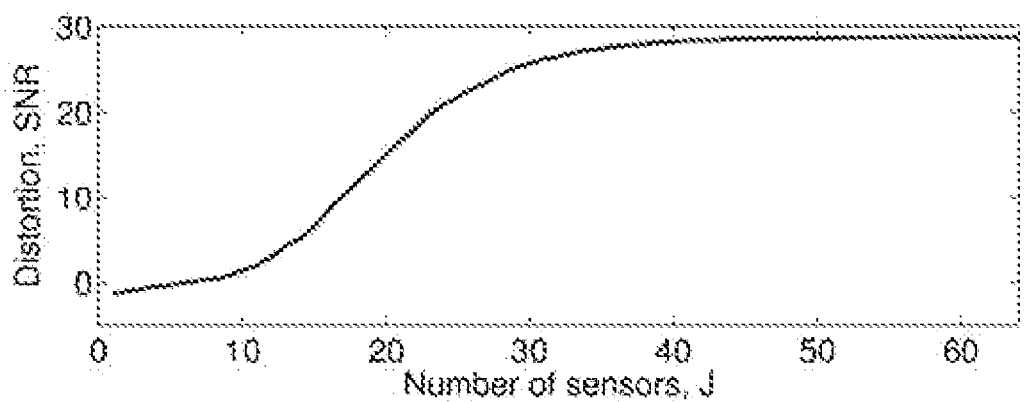
FIG. 8 is a graph illustrating joint reconstruction of synthetic JSM-2 signals having length N=128 and sparsity K=10 using M=11 random measurements per sensor in accordance with a preferred embodiment of the present invention. Each measurement is quantized to approximately 5 bits of precision. The reconstruction is robust to quantization and is progressive: as the number of sensors J increases we see improved reconstruction performance.

FIG. 7(a) shows that, for sufficiently large J, we can recover all of the signals with significantly fewer than N measurements per signal. FIG. 7(b) shows that when the sparse innovations share common supports we see an even greater savings. As a point of reference, a traditional approach to signal encoding would require 1600 total measurements to reconstruct these J=32 nonsparse signals of length N=50. Our approach requires only approximately 10 random measurements per sensor for a total of 320 measurements.

Application to Sensor Networks

The area that appears most likely to benefit immediately from the new DCS theory is low-powered sensor networks, where energy and communication bandwidth limitations require that we perform data compression while minimizing inter-sensor communications (see D. Estrin, D. Culler, K. Pister, and G. Sukhatme, "Connecting the physical world with pervasive networks," IEEE Pervasive Computing, vol. 1, no. 1, pp. 59-69, 2002 and G. J. Pottie and W. J. Kaiser, "Wireless integrated network sensors," Comm. ACM, vol. 43, no. 5, pp. 51-58, 2000). In an example sensor network, shown in FIG. 17, an array of sensing devices 110 register, process, and transmit measured data in an individual or collaborative fashion to a centralized processor 120. Transmission in sensor network settings usually is performed through wireless communications; the restriction on the power consumption for sensors limits the amount of communication each sensor can perform with other sensors (to process data) and with the centralized processor (to transmit data). DCS encoders work completely independently; therefore inter-sensor communication is required in a DCS-enabled sensor network only to support multi-hop networking to the data collection point. Moreover, the fact that typical sensor networks are designed to measure physical phenomena suggests that their data will possess considerable joint structure in the form of inter- and intra-signal correlations (see M. F. Duarte, M. B. Wakin, D. Baron, and R. G. Baraniuk, "Universal distributed sensing via random projections," in Proc. 5th International Workshop on Inf. Processing in Sensor Networks (IPSN '06), 2006).

Distributed Sensing Using Random Projections

In this section we describe the mechanics of implementing DCS in a sensor network environment. In the section on advantages of DCS in sensor networks, we highlight the unique benefits afforded by such an approach.

Figure 17:
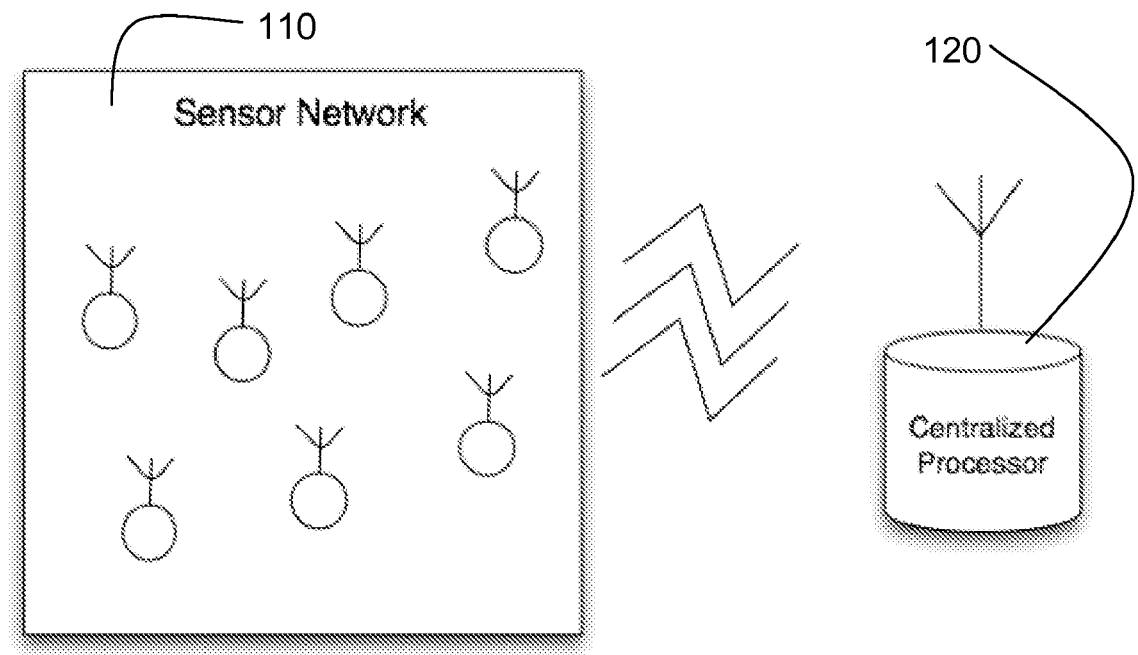
FIG. 17 is a diagram of a sensor network communicating distributed measurements to a centralized processor in accordance with a preferred embodiment of the present invention.

FIG. 17 is a diagram of a sensor network communicating distributed measurements to a centralized processor in accordance with a preferred embodiment of the invention. A collection of sensors 110 measure correlated signals and transmit to a central processor 120, where signals are recovered. This process may proceed with a reduced number of measurements; the recovery process exploits the correlation among the signals in order to recover them.

Figure 18:
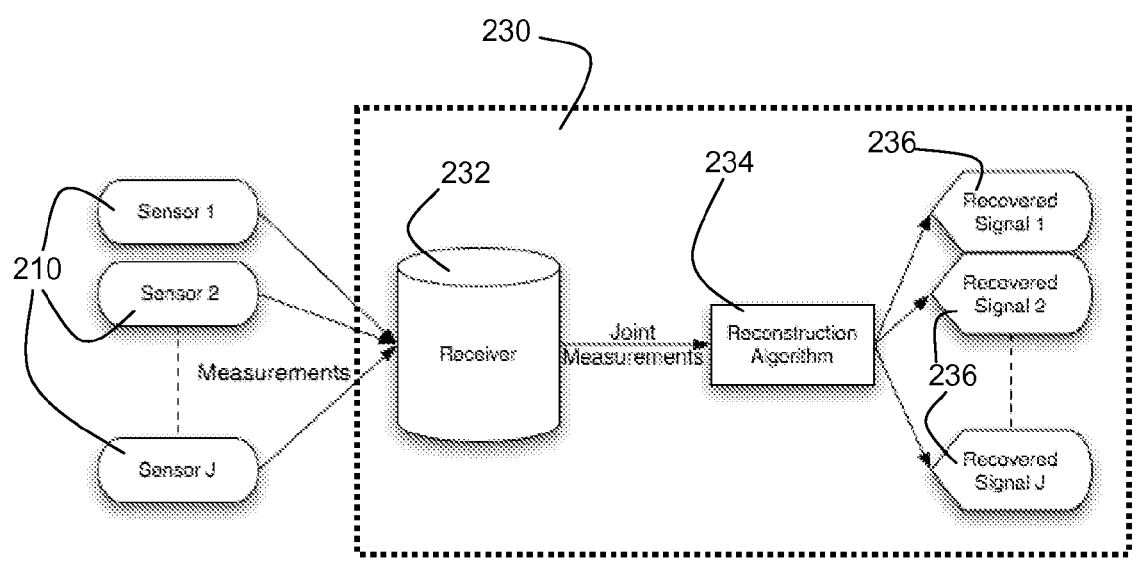
FIG. 18 is a flow chart of a method and apparatus for distributed compressed sensing in accordance with a preferred embodiment of the invention.

FIG. 18 is a flow chart of a method and apparatus for distributed compressed sensing in accordance with a preferred embodiment of the invention. A collection of sensors 210 measure correlated signals and transmit the measurements 220 to a central processing system 230. The central processing systems receives the transmitted signals 220 at receiver 232 and uses a reconstruction algorithm 234 to reconstruct the individual signals 236.

Incoherent Measurements

We consider a collection of synchronized sensor nodes that observe signals obeying one of the JSMs formally or approximately (as described in the section on recovery via iterative greedy pursuit). Each sensor independently collects a set of incoherent measurements and transmits them to a data sink. The signals are then recovered jointly as described later. We emphasize that, thanks to the universal nature of random measurements, the sensors need not be informed of the sparsity-inducing basis for the signals; this information is only required to perform reconstruction at the decoder (see E. Candès and T. Tao, "Near optimal signal recovery from random projections and universal encoding strategies," August 2004, Preprint).

We assume that sensor j acquires the N-sample signal $x_j$ observed during a time interval $[t_0, t_0+T]$ and computes a given number of measurements $M_j$. (The period $[t_0, t_0+T]$ could be the complete duration of the signal of interest or could correspond to a length-N block of a longer signal; the above process can be repeated periodically.) We denote the measurement vector by $y_j=\Phi_j x_j$, where $\Phi_j$ is the measurement matrix for sensor j; $\Phi_j$ is $M_j \times N$ and, in general, the entries of $\Phi_j$ are different for each j. We denote the vector of measurements as $y_j=[y_{j,1}, \ldots, y_{j,M_j}]^T$ and note that $y_{j,m}$ corresponds to the inner product of $x_j$ with row m of the matrix $\Phi_j$. Since all measurements have the same relevance for signal reconstruction, their values are quantized using the same scheme for each index m; the distortion in the reconstruction due to quantization is bounded (see E. Candès, J. Romberg, and T. Tao, "Stable signal recovery from incomplete and inaccurate measurements," Comm. on Pure and Applied Math., 2005, Submitted).

The CS and DCS frameworks require knowledge during reconstruction of the measurement matrix $\Phi_j$ for the different sensors $j=1, \ldots, J$. This can be accomplished by constructing each measurement matrix using a pseudorandom number generator, whose seed could be provided by the data sink or computed as a function of the node ID. While most of the existing theory for CS encoding applies specifically to random Gaussian or Bernoulli measurements, there is active research into developing lower-complexity alternatives (see D. Takhar, J. N. Laska, M. B. Wakin, M. F. Duarte, D. Baron, K. F. Kelly, and R. G. Baraniuk, "A compressed sensing camera: New theory and an implementation using digital micromirrors," in Proc. Computational Imaging IV at SPIE Electronic Imaging, San Jose, January 2006; J. A. Tropp, M. B. Wakin, M. F. Duarte, D. Baron, and R. G. Baraniuk, "Random filters for compressive sampling and reconstruction," in Proc. Int. Conf. Acoustics, Speech, Signal Processing (ICASSP), May 2006 and J. A. Tropp, M. B. Wakin, M. F. Duarte, D. Baron, and R. G. Baraniuk, "Random Filters for Compressive Sampling and Reconstruction", U.S. Provisional Application Ser. No. 60/729,983 and R. G. Baraniuk, M. B. Wakin, D. Baron, M. F. Duarte, M. A. Davenport, Y. Massoud, M. Elnozahi, S. Kirolos, T. S. Mohamed, T. Ragheb and J. A. Tropp, "Method and Apparatus for Compressive Sensing for Analog-to-Information Conversion", U.S. Provisional Application Ser. No. 60/732,374). We have strong experimental evidence that structured measurement matrices $\Phi_j$ (involving, for example, an FIR filter with pseudorandom taps) can provide suitable incoherence with the sparse basis $\Psi$ (see J. A. Tropp, M. B. Wakin, M. F. Duarte, D. Baron, and R. G. Baraniuk, "Random filters for compressive sampling and reconstruction," in Proc. Int. Conf. Acoustics, Speech, Signal Processing (ICASSP), May 2006).

Communication to the Data Sink

Each quantized measurement $y_{j,m}$ is transmitted to the sink together with its timestamp $t_0$, index m, and node ID j. This is the only information necessary from the sensors to reconstruct the signals. Since the measurements can arrive out of order, they can be sent individually over the network or grouped into packets if desired. Many different options exist for routing the measurements, including TreeCast (see S. PalChaudhuri, S. Du, A. K. Saha, and D. B. Johnson, "TreeCast: A stateless addressing and routing architecture for sensor networks," in Proc. International Parallel and Distributed Processing Symposium (IPDPS), Santa Fe, NM, April 2004, pp. 221-228) and DIMENSIONS (see D. Ganesan, D. Estrin, and J. Heidemann, "DIMENSIONS: Why do we need a new data handling architecture for sensor networks?," in Proc. ACM Workshop on Hot Topics in Networks, Princeton, N.J., October 2002, pp. 143-148, ACM).

Joint Reconstruction

As the measurements are received by the data sink, the measurement matrices $\Phi_j$ for the different sensors are built accordingly through the same procedure as in the sensors. Once the data sink receives all $M_j$ measurements from each sensor—or alternatively, once it starts receiving measurements for the next measurement period (beginning at $t_0+T$)—the data sink can begin reconstructing the signal ensemble.

The algorithm used for joint signal reconstruction depends on the relevant JSM for the signals observed by the network, as described earlier.

Advantages of DCS for Sensor Networks

Our DCS implementation for sensor networks is robust and widely applicable in sensor network scenarios. This section describes in more detail several of the desirable features.

Simple, universal encoding: DCS coding is particularly appealing when we employ random projections at the sensors. Random projections are universal in the sense that they are incoherent with any fixed sparsity basis $\Psi$ (see E. Candès and T. Tao, "Near optimal signal recovery from random projections and universal encoding strategies," August 2004, Preprint). In fact, using the same set of random measurements the decoder can attempt to recover the signals using any supposed sparse basis Ψ or JSM. In addition to being universally incoherent, the CS/DCS random measurements are also future-proof: if a better sparsity-inducing basis is found (or a better JSM is proposed), then the same random measurements can be used to reconstruct an even more accurate view of the environment without requiring any changes in the deployed sensing hardware. Additionally, DCS can be applied to any number of sensors $\geq 2$, and furthermore the sensors need not know their physical locations (other than to network their data).

The CS/DCS frameworks, in which measurements can be obtained with low complexity and without collaboration, also shifts the computational load of reconstruction from the sensor network to the data sink or cluster head. Each sensor only needs to compute its incoherent projections of the signal it observes, while the data sink or cluster head reconstructs all of the signals. This computational asymmetry is desirable in many sensor networks since data sinks and cluster heads have typically more computational power than sensor nodes.

Robustness, progressivity, and resiliency: DCS enjoys remarkable robustness properties thanks to the robustness of the CS framework. CS measurements have been shown to be robust to quantization and noise (see J. Haupt and R. Nowak, "Signal reconstruction from noisy random projections," IEEE Trans. Inf. Theory, 2005, Submitted and E. Candès, J. Romberg, and T. Tao, "Stable signal recovery from incomplete and inaccurate measurements," Comm. on Pure and Applied Math., 2005, Submitted), making the framework applicable to real world settings. Additionally, the incoherent measurements coming from each sensor have equal priority, unlike transform coefficients in current coders. Thus, the CS measurements can be transmitted and received in any order. Signal reconstruction can be attempted using any number of the received measurements—as more measurements are received they allow a progressively better reconstruction of the data (see E. Candès and T. Tao, "Near optimal signal recovery from random projections and universal encoding strategies," August 2004, Preprint).

In this sense, DCS is automatically robust to packet loss in wireless sensor networks; any loss of measurements leads to a graceful degradation in the reconstruction quality. This loss resiliency is particularly useful, as errors in wireless sensor network transmissions often cause as many as 10-30% of the packets to be dropped (see J. Zhao and R. Govindan, "Understanding packet delivery performance in dense wireless sensor networks," in Proc. Int. Conf. Embedded Networked Sensor Systems (SENSYS), 2003, pp. 1-13). This effect is exacerbated in multi-hop networks.

One existing approach that is robust to packet drops is multiple description coding (see S. D. Servetto, K. Ramchandran, V. A. Vaishampayan, and K. Nahrstedt, "Multiple Description Wavelet Based Image Coding," IEEE Trans. Image Processing, vol. 9, no. 5, pp. 813-826, 2000 and Y. Wang, M. T. Orchard, and A. Reibman, "Multiple description image coding for noisy channels by pairing transform coefficients," in Proc. Workshop Multimedia Signal Processing (MMSP), Princeton, N.J., 1997). These techniques enable data reconstruction at varying levels of quality depending on the number of packets that arrive. Unfortunately, multiple description coding techniques for distributed source coding have not been fully developed (see S. N. Diggavi and V. A. Vaishampayan, "On multiple description source coding with decoder side information," in Proc. Inf. Theory Workshop (ITW), October 2004, pp. 88-93). Another approach uses layered coding for unequal bit error protection, where the first layer is highly protected with strong channel coding and is also used as side information when decoding the second layer (see S. D. Rane, A. Aaron, and B. Girod, "Systematic lossy forward error protection for error-resilient digital video broadcasting," in Proc. Security, Steganography, and Watermarking of Multimedia Contents VI at SPIE Electronic Imaging, January 2004, pp. 588-595). This layered approach also increases demands on the system resources because the stronger channel code requires substantial redundancy in terms of channel resources and power consumption.

Security: Using a pseudorandom basis (with a random seed) effectively implements encryption: the randomized measurements will themselves resemble noise and be meaningless to an observer who does not know the seed.

Fault tolerance and anomaly detection: DCS reconstruction techniques can be extended to be fault tolerant. In the case where a small number of signals may not obey the overall JSM (due to a faulty sensor, for example), the joint reconstruction techniques can be tailored to detect such anomalies. In the case of JSM-2, for example, after running SOMP to determine the common support set $\Omega$, the data sink could examine each sensor's measurements to check for agreement with $\Omega$. Those signals that appear to disagree can then be reconstructed separately from the remaining (JSM-faithful) nodes.

Adaptivity to channel capacity: The DCS measurement and transmission rates can be scaled to adapt to the conditions of the wireless communication channel and the nuances of the observed signals. If, for example, the communication channel capacity is below the required rate to send $M_j$ measurements, then the sensors can perform rate limitation in a similar manner to congestion control algorithms for communication networks. When the data sink detects congestion in the communication channel, it can send a congestion notification (using a trickle of feedback) to the nodes so that the bit rate of the information sent is reduced in one of two ways. First, the sensors could increase the quantization stepsize of the measurements, since the CS/DCS reconstruction is robust to quantization. Second, the sensors could reduce the number of measurements taken for each signal: due to the resiliency of CS measurements, the effect of having few measurements on the reconstruction distortion is gradual. Thus, the CS/DCS measurement process can easily scale to match the transmission capacity of the communication channel, which is reminiscent of joint source-channel coding.

Application to compressible and analog signals: DCS can also be applied to signals that do not strictly obey the JSMs outlined in the section on joint sparsity models. For example, our JSM models can be generalized to compressible signals, for which the transform coefficients decay quickly but strictly to zero (see D. Donoho, "Compressed sensing," IEEE Trans. Inf. Theory, vol. 52, no. 4, pp. 1289-1306, 2006 and E. Candès and T. Tao, "Near optimal signal recovery from random projections and universal encoding strategies," August 2004, Preprint). The basic requirement is that certain small sets of coefficients approximate the signals with low distortion and that these sets are related among the different sensors. The section on experiments for sensor networks demonstrates numerical experiments on actual data sets that only approximately obey our JSMs.

The measurement rates required to capture compressible signals depend on the level of compressibility of the signals, that is, on the decay rate of the signal coefficient magnitudes in the sparse representation. Fortunately, as mentioned above, DCS enables adaptation of the measurement rate for a given signal. Thus, the measurements can be increased to obtain more accurate reconstructions and scaled back to obtain coarser approximations. Several algorithms for CS reconstruction (see J. Tropp and A. C. Gilbert, "Signal recovery from partial information via orthogonal matching pursuit," April 2005, Preprint and R. Grivonbal, R. M. Figueras i Ventura, and P. Vandergheynst, "A simple test to check the optimality of sparse signal approximations," in Proc. Int. Conf. Acoustics, Speech, Signal Processing (IC-ASSP), Philadelphia, Pa., March 2005) also provide mechanisms to verify the success of the reconstruction, and so the data sink can be aware of when it has received enough measurements.

Finally, DCS can be extended to the acquisition of analog signals directly at the physical sensor (bypassing the analog-to-digital converter). We have introduced one technique for CS analog sensing using a camera that directly acquires random projections of the input light field (see D. Takhar, J. N. Laska, M. B. Wakin, M. F. Duarte, D. Baron, K. F. Kelly, and R. G. Baraniuk, "A compressed sensing camera: New theory and an implementation using digital micromirrors," in Proc. Computational Imaging IV at SPIE Electronic Imaging, San Jose, January 2006); other techniques are currently under investigation. Transmission for the resulting (digital) measurements would then proceed as in the section on communication to the data sink, and reconstruction could be tailored to the measurement structure given by the analog front end, allowing for faster and/or simpler reconstruction (see R. G. Baraniuk, M. B. Wakin, D. Baron, M. F. Duarte, M. A. Davenport, Y. Massoud, M. Elnozahi, S. Kirolos, T. S. Mohamed, T. Ragheb and J.A. Tropp, "Method and Apparatus for Compressive Sensing for Analog-to-Information Conversion", U.S. Provisional Application Ser. No. 60/732, 374).

Information scalability: Incoherent measurements obtained via DCS can be used to recover different levels of information about the sensed signals. It has been shown that the CS framework is information scalable beyond signal reconstruction to a much wider range of statistical inference tasks, including estimation, detection, and classification. Depending on the situation, the smaller amounts of information about the signals can often be extracted using lower computational complexity or fewer incoherent measurements than would be required to reconstruct the signals. For example, statistical detection and classification do not require reconstruction of the signal, but only require an estimate of the relevant sufficient statistics. Consequently, it is possible to directly extract such statistics from a small number of random projections without ever reconstructing the signal. As a result, significantly fewer measurements are required for signal detection than for signal reconstruction. Furthermore, as in reconstruction, random measurements are again universal, in the sense that with high probability the sufficient statistics can be extracted from them regardless of the signal structure. Thus we can take a reduced number of measurements that are still useful even if we don't know what we will want to detect that the time of signal acquisition.

As a first example, we consider sensor networks for surveillance applications. Typically, a detection algorithm is executed continuously on the sensed data; when the algorithm returns an event detection, other algorithms such as classification, localization, and tracking are executed. These algorithms require a larger amount of information from the signals than that of detection. In our DCS scheme, we can adapt the measurement rate of the sensor nodes according to the tasks being performed. We apply a low measurement rate for detection; once the detection returns an event, the measurement rate is increased to that required by the other tasks.

As another example, one may be interested in estimating linear functions of the sensed signals $$v = \sum_j \omega_j x_j;$$

examples include averages and linear interpolations. Thanks to the linearity of the CS/DCS measurement process, we can extract such information from the incoherent measurements without first reconstructing the signals $x_j$. More specifically, assuming we use the same measurement process $\Phi_j = \Phi$ at each sensor, we can write $$\Phi v = \sum_j \omega_j \Phi x_j = \sum_j \omega_j y_j.$$

Assuming that v is sparse, it can be recovered from $\Phi v$ using standard CS techniques. Thus, by aggregating the measurements $y_j$ using the desired linear function we can directly obtain incoherent measurements of v without reconstructing the $x_j$. We also note that the measurement vectors can be aggregated using matched source-channel communication, in which the wireless nodes collaborate to coherently send their measurements so that a receiver directly obtains the weighted sum $\omega_j y_j$. This could enable a significant reduction in power. Such aggregation can also be implemented hierarchically in frameworks such as TreeCast or DIMENSIONS.

The above discussion provides an overview of the benefits of random projections for detection and estimation problems. The key idea is that random projections are information scalable in that we can take a small number of measurements to do detection, classification, or estimation, and that if we have more measurements we can extract more information from them about the signal. This is useful both because it allows us to make very few measurements while still being able to accurately detect, classify, or estimate, and also because these same measurements can be used to reconstruct the signals. We have discussed a few examples and some appropriate algorithms for those settings, but one skilled in the art could easily apply these same ideas to a variety of other detection, classification, or estimation problems or develop algorithms of a similar spirit.

Experiments

In this section, we consider four different sensor network datasets. Although the signals we consider are not strictly sparse, we see that the JSM models provide a good approximation for the joint sparsity structure and that DCS offers a promising approach for such sensing environments.

Environmental sensing: The first three datasets (see F. Koushanfar, N. Taft, and M. Potkonjak, "Sleeping coordination for comprehensive sensing using isotonic regression and domatic partitions," in Proc. IEEE INFOCOM, Barcelona, Spain, April 2006) contain temperature, humidity, and light readings from a group of 48 nodes deployed at the offices of Intel Research Labs in Berkeley, Calif. For the purposes of our experiments, we select signals of length N=1024 and interpolate small amounts of missing data. The signals in FIGS. 9(*a*), 10(*a*) and 11(*a*) were recorded in an office environment and therefore exhibit periodic behavior caused by the activity levels during day and night. Furthermore, there are small fluctuations at each one of these states; thus we expect the signals to be compressible both in the Fourier and wavelet domains. Since the signals are observations of physical processes, they are smoothly varying in time and space; this causes the sensor readings to be close in value to each other, a situation well captured by the JSM-1 and JSM-2 models.

Figure 12:
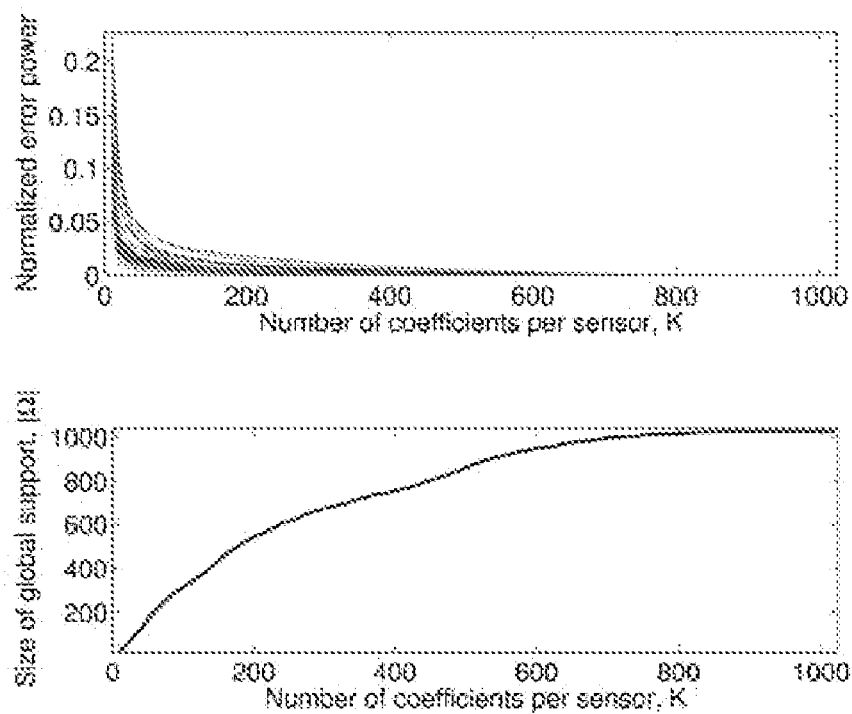
FIG. 12 is a pair of graphs illustrating: quality of approximation of light intensity signals as a function of the number K of wavelet coefficients used per sensor (top) and, when $K \geq 100$, the approximations yield low distortion; thus the signals are compressible; and a number of wavelet vectors required to include the K largest wavelet coefficients for each signal (bottom). The slope of the curve is small, meaning that the supports of the compressible signals overlap, and that the ensemble is well represented by the JSM-2 model.

We now confirm the joint sparsity of the signals under the JSM-2 model. The top panel in FIG. 12 shows the distortion of the best K-term wavelet approximation for each signal in the light dataset as K increases. We use Daubechies-8 wavelets throughout this section. The figure shows that a modest value of K=100 gives low distortion for all signals. However, the union over all signals of the K best wavelet vectors has size greater than K. The bottom panel in FIG. 12 shows the size of this union (the "joint support" for the signals under JSM-2) as K increases. We see that approximately $|\Omega|=200$ vectors are required to include the K=100 most significant vectors for each signal, which makes the JSM-2 model feasible due to the shared compactness of the representation. Similar results are observed for the other datasets, which are compressible in the wavelet domain as well. Thus, we expect that such datasets can be recovered from incoherent projections using DCS with the appropriate sparsity inducing bases.

Figure 9:
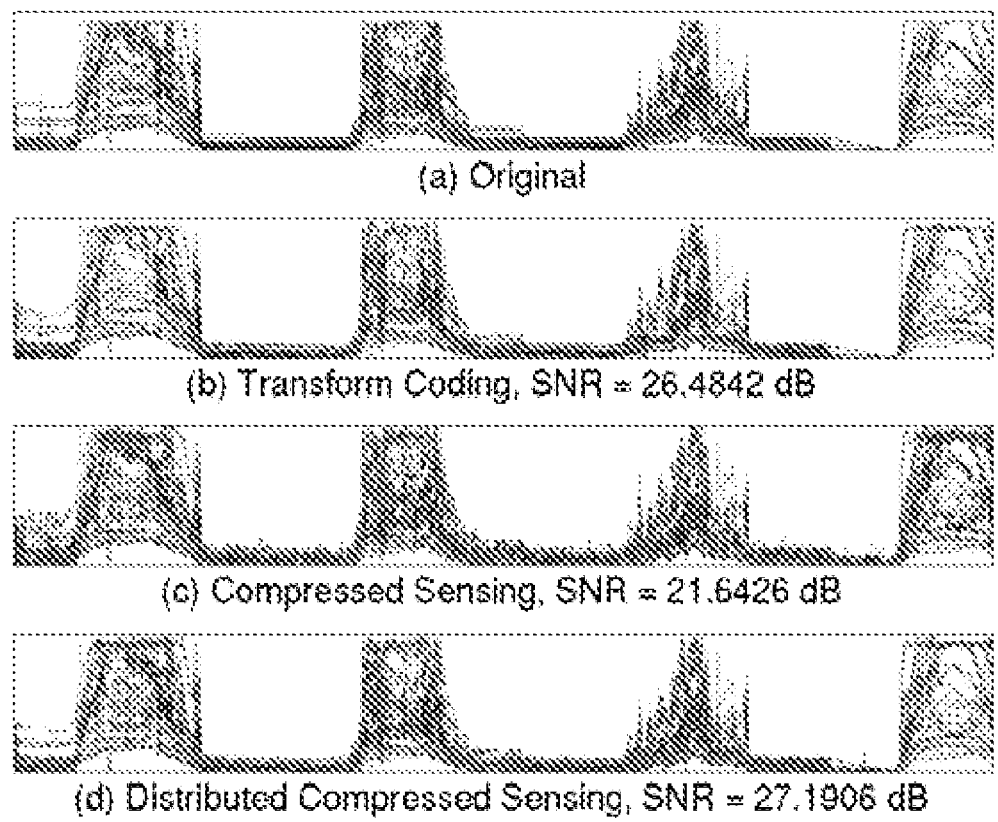
FIG. 9 illustrates reconstruction of light intensity signals from 48 sensors with length N=1024 in accordance with a preferred embodiment of the present invention as follows: (a) Original signals; (b) wavelet thresholding using 100 coefficients per sensor, average SNR=26.48 dB; (c) separate reconstruction of each signal using CS from M=400 random projections per sensor, average SNR=21.64 dB; and (d) joint reconstruction of the signal ensemble using DCS from M=400 random projections per sensor, average SNR=27.19 dB.
Figure 10:
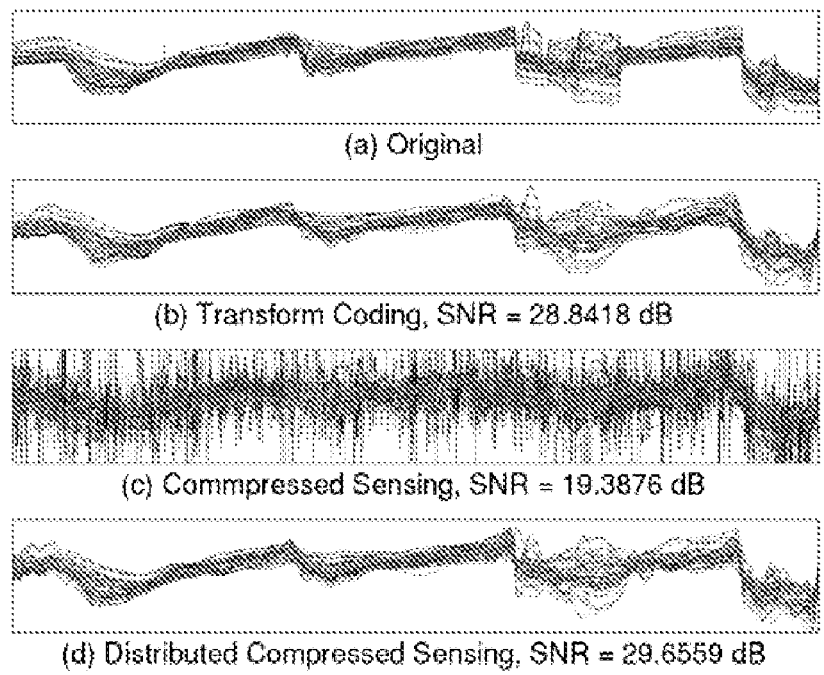
FIG. 10 illustrates reconstruction of humidity signals from 48 sensors with length N=1024 in accordance with a preferred embodiment of the present invention as follows: (a) Original signals; (b) wavelet thresholding using 20 coefficients per sensor, average SNR=28.84 dB; (c) separate reconstruction if each signal using CS from M=80 random projections per sensor, average SNR=19.39 dB; (d) joint reconstruction of the signal ensemble using DCS from M=80 random projections per sensor, average SNR=29.66 dB.
Figure 13:
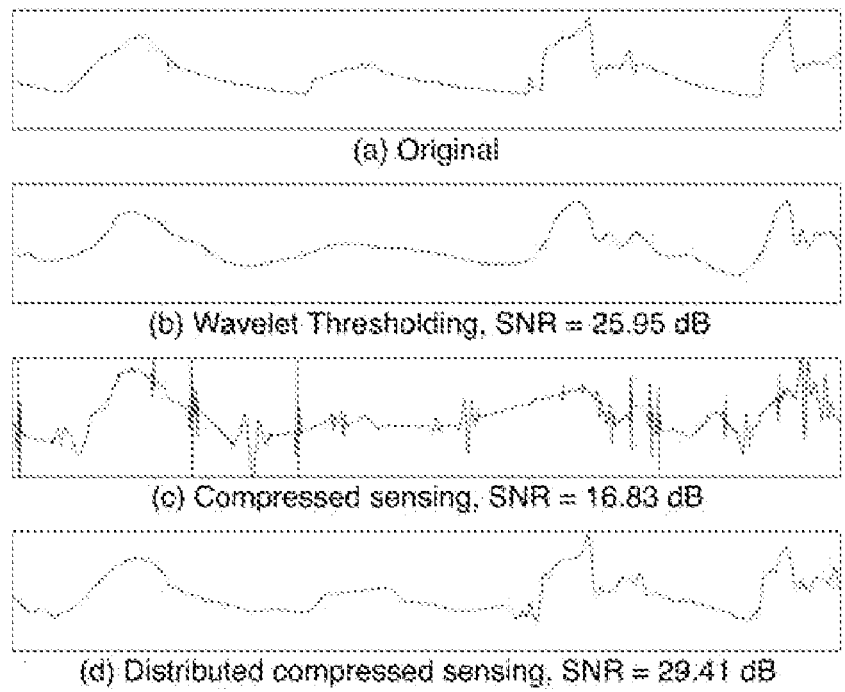
FIG. 13 illustrates reconstruction of temperature signal #41 (extracted from FIG. 11) in accordance with a preferred embodiment of the present invention as follows: (a) Original signal; (b) separate reconstruction of each signal using wavelet tresholding, SNR=25.95 dB; (c) reconstruction using CS, SNR=16.83 dB; (d) joint reconstruction of the signal ensemble using DCS, SNR=29.41 dB.
Figure 14:
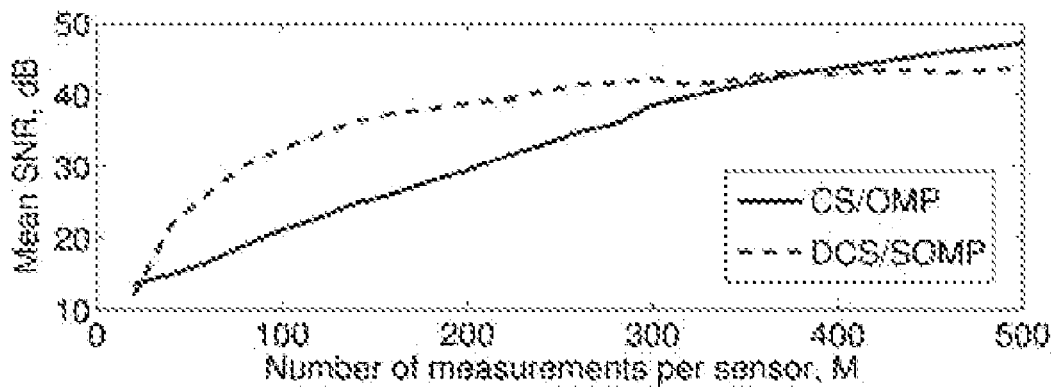
FIG. 14 is a graph illustrating average SNR of temperature signals reconstructed from M measurements per sensor using CS (OMP) and DCS (SOMP) in accordance with a preferred embodiment of the present invention.

We now consider a hypothetical implementation of DCS for these signals. For the light intensity signal we take M=400 random Gaussian measurements per sensor and compare DCS reconstruction (via SOMP using wavelets as the sparsity basis) with separable OMP reconstruction. For comparison, we also compare to wavelet thresholding at each signal using 100 terms. FIG. 9 shows the reconstruction of the light intensity signal ensemble. We see average SNRs of 26.48 dB, 21.64 dB, and 27.19 dB for wavelet thresholding, separate CS, and DCS reconstruction, respectively. The DCS reconstruction algorithm identifies the common structure emphasized by JSM-2, recovering salient common features for all signals in the ensemble in addition to many of the distinct features in each signal. Similar results are seen for the humidity and temperature datasets in FIGS. 10, 11, and 13. To illustrate progressivity, FIG. 14 also plots the CS (OMP) and DCS (SOMP) reconstruction errors for the temperature signal ensemble at a variety of measurement rates M. SOMP reconstruction is superior at low and moderate rates, yet it is surpassed by OMP at high rates. This illustrates the applicability of the JSM-2 model, which becomes less valid as the very fine features of each signal (which vary between sensors) are incorporated. A joint reconstruction algorithm tailored to this fact would likely outperform both approaches.

Figure 15:
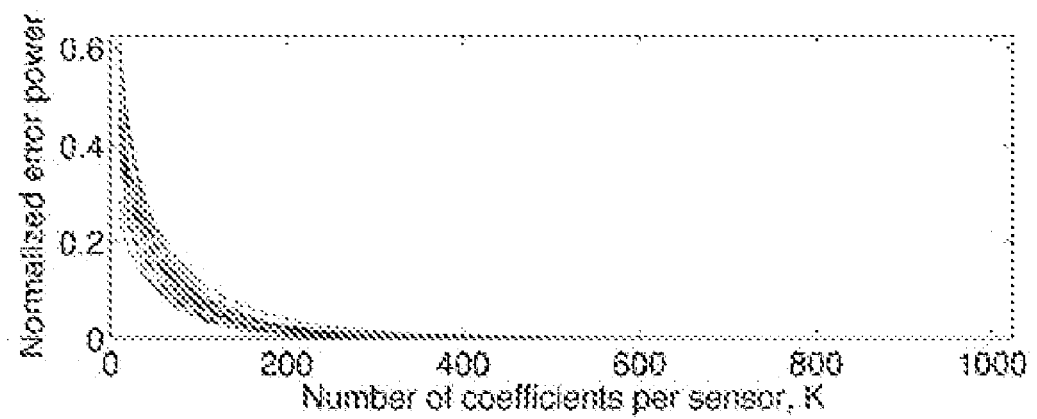
FIG. 15 illustrates the following: Quality of approximation of vehicle audio signals as a function of the number K of Fourier coefficients used per sensor (top); and Number of Fourier vectors required to include the K largest Fourier coefficients for each signal (bottom).
Figure 15:
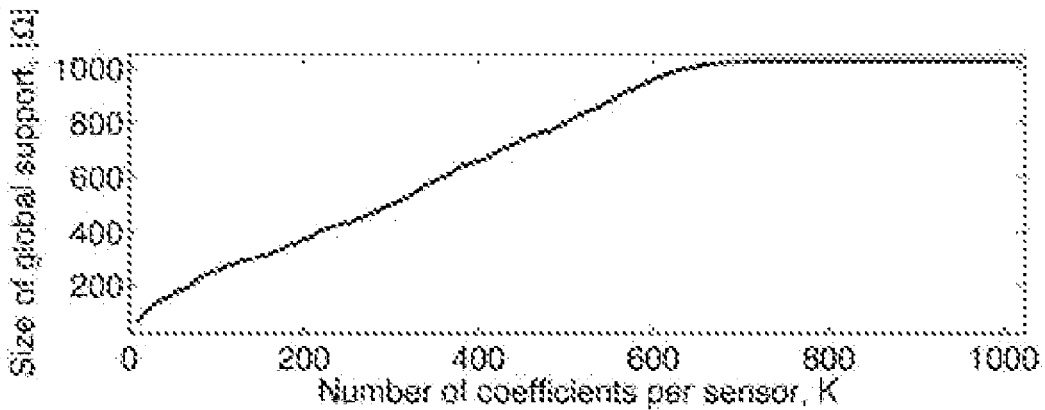
Figure 16:
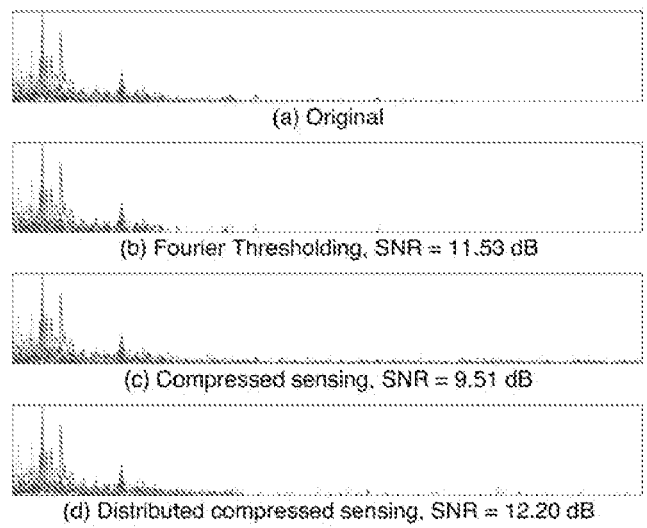
FIG. 16 illustrates Fourier coefficients for reconstructions of vehicle audio signals from 18 sensors with length N=1024 in accordance with a preferred embodiment of the present invention as follows: (a) Original signals; (b) Fourier thresholding using 100 coefficients per sensor, average SNR=11.53 dB; (c) separate reconstruction using CS from M=400 random projections per sensor, average SNR=9.51 dB; (c) joint reconstruction using DCS from M=400 random projections per sensor, average SNR=12.20 dB.

Acoustic sensing: Our fourth dataset (see M. F. Duarte and Y. H. Hu, "Vehicle classification in distributed sensor networks," J. Parallel and Distributed Computing, vol. 64, no. 7, pp. 826-838, July 2004) contains audio recordings of military vehicles from a 16-microphone sensor network array from the University of Wisconsin-Madison. The audio signals are compressible in the Fourier domain and follow the JSM-2 model (see FIG. 15). FIG. 16 shows an example DCS reconstruction (using SOMP with the Fourier sparse basis); the results are similar to those seen in the previous datasets.

Additional Embodiments

There are many opportunities for applications and extensions of these ideas.

Additional Joint Sparsity Models. The models listed in this document are presented as examples of simple correlation structures caused by physical events. Other JSMs can be posed for settings in which one of the previous models does not apply. For example, consider the case of encoding of video sequences. The key is that, as described above, the measurements $\{\phi_m\}$ are taken sequentially in time. Hence, one can view each measurement as a linear projection against a snapshot of the scene at that instant. Viewing the video as a 3D signal (in which the 2D snapshots are stacked), the measurements vectors $\{\phi_m\}$ themselves are each localized onto a different 2D snapshot for each m (see M. B. Wakin, J. N. Laska, M. F. Duarte, D. Baron, S. Sarvotham, D. Takhar, K. F. Kelly and R. G. Baraniuk, "Compressive Imaging for Video Representation and Coding", in Proc. Picture Coding Symposium (PCS), Beijing, China, April 2006).

In order to recover a video sequence from these measurements, we make some simplifying assumptions. Specifically, traditional CS considers an ensemble of measurements taken from a single signal; in our streaming setting, however, each measurement will act on a different snapshot. We can overcome this problem by assuming that the image changes slowly across a group of snapshots, which we can then equate to a single video frame. The number of snapshots assigned to a frame will be determined by the speed of our acquisition system and the desired temporal resolution of the reconstructed video. Under this assumption, we represent the video acquired as a sequence of F frames, each one measured using M/F measurement vectors that we can group as rows of a matrix $\Phi_i$, $i=1, \ldots, F$.

We have several options for reconstructing the video from these measurements. First, we could reconstruct each frame using 2D wavelets, performing a total of F CS reconstructions. Each reconstruction would use the same 2D wavelet sparsity basis $\Psi$ but with a different measurement matrix $\Phi_i$. We refer to this process as frame-by-frame reconstruction.

Alternative methods more fully exploit the correlation between frames. One solution is to use 3D wavelets as a sparse representation for the video sequence; i.e., to define the joint measurement matrix $$\Phi = \begin{bmatrix} \Phi_1 & 0 & \cdots & 0 \\ 0 & \Phi_2 & \cdots & 0 \\ \vdots & \vdots & \ddots & \vdots \\ 0 & 0 & \cdots & \Phi_F \end{bmatrix}$$

for the video sequence and then perform joint reconstruction of the entire video sequence using a 3D wavelet sparse basis $\Psi$ for the frame ensemble. Despite its block diagonal structure, the 3D measurement matrix $\Phi$ enjoys sufficient incoherence with the 3D sparsity matrix $\Psi$.

An additional embodiment extends the imaging architecture to acquire full 3D measurements of a video sequence (that is, where each $\phi_m$ has 3D support). Under this setting, we reconstruct the entire video sequence using a single measurement matrix $\Phi$ that operates on all of the frames and a suitable 3D sparse basis $\Psi$ such as wavelets. We demonstrate that such a scheme would enjoy better incoherence with the video structure (see M. B. Wakin, J. N. Laska, M. F. Duarte, D. Baron, S. Sarvotham, D. Takhar, K. F. Kelly and R. G. Baraniuk, "Compressive Imaging for Video Representation and Coding", in Proc. Picture Coding Symposium (PCS), Beijing, China, April 2006). However, it also increases the complexity of both the measurement and reconstruction processes. Possible solutions to this increased complexity include partitioning the video into blocks, which are then reconstructed separately.

Additional Reconstruction Algorithms: Other single-signal CS reconstruction algorithms can be easily extended and applied to the DCS setting. Group testing algorithms (see G. Cormode and S. Muthukrishnan, "Combinatorial Algorithms for Compressed Sensing", Technical Report DIMACS TR 2005-40, 2005) and Sudocodes (see S. Sarvotham, D. Baron and R. G. Baraniuk, "Sudocodes: Efficient Compressive Sampling Algorithms for Sparse Signals", in Proc. International Symposium in Inf. Theory (ISIT), Seattle, Wash., July 2006) reconstruct the signals by identifying locations of meaningful coefficients, subsequently identifying their magnitudes. These algorithms can be run in parallel for each of the signals; when a significant coefficient is resolved in one signal, the information can be used in all other algorithms running in parallel to achieve faster reconstruction.

Compressible signals: In practice natural signals are not exactly $l_0$ sparse but rather can be better modeled as $l_p$ sparse with $0<p\leq 1$. Roughly speaking, a signal in a weak-$l_p$ ball has coefficients that decay as $n^{-1/p}$ once sorted according to magnitude (see D. Donoho, "Compressed sensing," IEEE Trans. Inf. Theory, vol. 52, no. 4, pp. 1289-1306, 2006). The key concept is that the ordering of these coefficients is important. For JSM-2, we can extend the notion of simultaneous sparsity for $l_p$-sparse signals whose sorted coefficients obey roughly the same ordering. This condition is enforced, as an example, as an $l_p$ constraint on the composite signal $$\left\{\sum_{j=1}^{J}|x_j(1)|, \sum_{j=1}^{J}|x_j(2)|, \ldots, \sum_{j=1}^{J}|x_j(N)|\right\}.$$

Quantized and noisy measurements: In general, (random) measurements will be real numbers; quantization will gradually degrade the reconstruction quality as the quantization becomes coarser (see E. Candès and T. Tao, "The Dantzig selector: Statistical estimation when p is much larger than n," Annals of Statistics, 2005, Submitted). Moreover, in many practical situations some amount of measurement noise will corrupt the $\{x_j\}$, making them not exactly sparse in any basis. There has been work in the single-signal CS literature that we can leverage in additional embodiments, including Basis Pursuit with Denoising (see E. Candès, J. Romberg, and T. Tao, "Stable signal recovery from incomplete and inaccurate measurements," Comm. on Pure and Applied Math., 2005, Submitted; D. Donoho and Y. Tsaig, "Extensions of compressed sensing," 2004, Preprint; S. Chen, D. Donoho, and M. Saunders, "Atomic decomposition by basis pursuit," SIAM J. on Sci. Comp., vol. 20, no. 1, pp. 33-61, 1998 and] J. J. Fuchs, "Recovery of exact sparse representations in the presence of bounded noise," IEEE Trans. Inf. Theory, vol. 51, pp. 3601-3608, October 2005), robust iterative reconstruction algorithms (see J. Haupt and R. Nowak, "Signal reconstruction from noisy random projections," IEEE Trans. Inf. Theory, 2005, Submitted), CS noise sensitivity analysis (see E. Candès, J. Romberg, and T. Tao, "Sparse Signal Recovery from Incomplete and Inaccurate Measurements," April 2005 and Jarvis Haupt and Rob Nowak, "Signal Reconstruction from Noisy Random Projections". To appear in IEEE Transactions in Inf. Theory, 2006), and the Dantzig Selector (see E. Candès and T. Tao, "The Dantzig selector: Statistical estimation when p is much larger than n," Annals of Statistics, 2005, Submitted).

Fast algorithms: Implementations of DCS decoders using optimization algorithms, such as Basis Pursuit, could prove too computationally intense. As we saw in JSM-2, efficient iterative and greedy algorithms could come to the rescue, but these need to be extended to the multi-signal case. SOMP is a solid first step, and some progress has been made on fast algorithms for certain sparse signal classes, such as piecewise smooth signals in wavelet bases (see M. F. Duarte, M. B. Wakin, and R. G. Baraniuk, "Fast reconstruction of piecewise smooth signals from random projections," in Online Proc. Workshop on Signal Processing with Adaptative Sparse Structured Representations (SPARS), Rennes, France, November 2005 and C. La and M. N. Do, "Signal reconstruction using sparse tree representation," in Proc. Wavelets XI at SPIE Optics and Photonics, San Diego, August 2005). This shows that greedy algorithms can be easily adapted to be applicable in settings with multiple signals whose sparse representations exhibit some correlation or structure.

Sparse signals with positive expansion coefficients: Tanner and Donoho have shown that the oversampling factor c(S) required for perfect reconstruction drops dramatically when the sparse expansion coefficients are positive in some basis, that is, when $\theta_j(n)\geq 0$. While we cannot improve upon the (best-possible) theoretical performance of our algorithms for JSM-2 and JSM-3, the measurement rates in JSM-1 could benefit from this additional knowledge of the signal structure.

Sparse measurement matrices: One way to reduce the computational burden from the DCS decoders is to use sparse CS matrix $\Phi$ for encoding. In this framework, a large fraction of the entries in the CS matrix are set to zero. The positions of the non-zero entries are carefully chosen so that the decoder can reconstruct the signal with less computation. For example, carefully constructed sparse $\Phi$ can be used in conjunction with group testing (see G. Cormode and S. Muthukrishnan, "Towards an algorithmic theory of compressed sensing", DIMACS Technical Report TR 2005-25, 2005; A. C. Gilbert, M. J. Strauss, J. Tropp and R. Vershynin, "Algorithmic linear dimension reduction in the ell_1 norm for sparse vectors", Submitted, April 2006 and S. Sarvotham, D. Baron and R. G. Baraniuk, "Sudocodes: efficient compressive sampling algorithms for sparse signals", To appear in Proc. IEEE Int. Symposium on Inf. Theory, July 2006) for signal recovery.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method for approximating a plurality of digital signals or images using compressed sensing, comprising the steps of:

in a scheme where a common component $x_c$ of said plurality of digital signals or images is represented as a vector with m entries, making a measurement $y_c$, where $y_c$ comprises a vector with only $n_i$ entries, where $n_i$ is less than m; and wherein in said scheme an innovative component $x_i$ of each of said plurality of digital signals is represented as a vector with m entries each, further comprising the step of:

making a measurement $y_i$ for each of said digital signals, where $y_i$ comprises a vector with only $n_i$ entries, where $n_i$ is less than m.

2. A method for approximating a plurality of digital signals or images using compressed sensing according to claim 1, further comprising the step of:

from each said innovation components $y_i$, producing an approximate reconstruction of each m-vector $x_i$ using said common component $y_c$ and said innovative component $y_i$.

3. A method for approximating a plurality of digital signals or images using compressed sensing, comprising the steps of:

estimating a common component of said plurality of digital signals;

estimating measurements generated by innovations of each of said plurality of digital signals;

constructing approximations of said innovations of each of said plurality of digital signals; and obtaining an estimate of at least one signal from said plurality of digital signals as the sum of said estimate of said common component and estimates of at least one innovation component of said at least one signal.

4. A method for approximating a plurality of digital signals or images using compressed sensing, comprising the steps of:

in a scheme where an innovative component $x_i$ of each of said plurality of digital signals is represented as a vector with m entries each, further comprising the step of:

making a measurement $y_i$ for each of said digital signals, where $y_i$ comprises a vector with only $n_i$ entries, where $n_i$ is less than m.

5. An apparatus for joint measurement of a plurality of signals comprising:

means for measuring a plurality of correlated signals, said measuring means encoding each signal independently by projecting each said signal onto another incoherent basis;

means for transmitting each said encoded signal from said means for measuring to a signal processor; and means for recovering said plurality of correlated signals based upon a correlation of said signals.

6. An apparatus according to claim 5 wherein said means for measuring comprises a plurality of sensors in any modality.

7. An apparatus according to claim 5 wherein said plurality of sensors comprise at least one selected from the group of: cameras, acoustic and temperature sensors.

8. An apparatus according to claim 5 wherein said means for measuring measures said plurality of signals using an incoherent measurement matrix.

9. An apparatus for joint measurement of a plurality of signals comprising:

means for measuring a plurality of correlated signals, said measuring means encoding each signal independently by projecting each said signal onto another incoherent basis;

means for transmitting each said encoded signal from said means for measuring to a signal processor; and means for recovering said plurality of correlated signals based upon a correlation of the sparse representations of said signals.

10. An apparatus according to claim 9 wherein said means for measuring comprises a plurality of sensors in any modality.

11. An apparatus according to claim 9 wherein said plurality of sensors comprise at least one selected from the group of: cameras, acoustic and temperature sensors.

12. An apparatus according to claim 9 wherein said means for measuring measures said plurality of signals using an incoherent measurement matrix.

* * * * *

UNITED STATES PATENT AND TRADEMARK OFFICE
CERTIFICATE OF CORRECTION

PATENT NO. : 7,271,747 B2
APPLICATION NO. : 11/382687
DATED : September 18, 2007
INVENTOR(S) : Dror Baron et al.

It is certified that error appears in the above-identified patent and that said Letters Patent is hereby corrected as shown below:

Col. 1, Line 17-19, The government support clause of paragraph [0003] of the specification is corrected to read as follows:

This invention was made with government support under Grant Numbers NSF CCF,-0431150, NSF CNS-0435425, NSF-CNS-0520280 awarded by the National Science Foundation, Contract No. ONR N00014-02-1-0353 awarded by the Office of Naval Research, and Contract No. AFOSR FA9550-04-0148 awarded by the Air Force Office of Scientific Research. The government has certain rights in the invention.

Signed and Sealed this
Sixteenth Day of October, 2012

David J. Kappos
*Director of the United States Patent and Trademark Office*